United States Patent
Snaith et al.

(10) Patent No.: US 10,797,255 B2
(45) Date of Patent: Oct. 6, 2020

(54) MATERIAL PRODUCTION PROCESS WITH ALKYLAMINE

(71) Applicant: OXFORD UNIVERSITY INNOVATION LIMITED, Oxford (GB)

(72) Inventors: Henry James Snaith, Oxford (GB); Pabitra Nayak, Oxford (GB); Bernard Wenger, Oxford (GB); Nakita Noel, Oxford (GB); Severin Habisreutinger, Oxford (GB); David Moore, Golden, CO (US)

(73) Assignee: OXFORD UNIVERSITY INNOVATION LIMITED, Oxford (GB)

( * ) Notice: Subject to any disclaimer, the term of this patent is extended or adjusted under 35 U.S.C. 154(b) by 0 days.

(21) Appl. No.: 16/082,415

(22) PCT Filed: Mar. 8, 2017

(86) PCT No.: PCT/GB2017/050623
§ 371 (c)(1),
(2) Date: Sep. 5, 2018

(87) PCT Pub. No.: WO2017/153752
PCT Pub. Date: Sep. 14, 2017

(65) Prior Publication Data
US 2019/0115549 A1    Apr. 18, 2019

(30) Foreign Application Priority Data
Mar. 9, 2016    (GB) .................................. 1604050.3

(51) Int. Cl.
*H01L 21/02* (2006.01)
*H01L 51/42* (2006.01)
*H01L 51/00* (2006.01)

(52) U.S. Cl.
CPC .... *H01L 51/4226* (2013.01); *H01L 21/02521* (2013.01); *H01L 21/02628* (2013.01);
(Continued)

(58) Field of Classification Search
None
See application file for complete search history.

(56) References Cited

FOREIGN PATENT DOCUMENTS

| JP | 2014056903 A | 3/2014 |
|---|---|---|
| WO | 2013126385 A1 | 8/2013 |

(Continued)

OTHER PUBLICATIONS

Barkhouse, et al., Device Characteristics of a 10.1% Hydrazine-Processed Cu2ZnSn(Se,S)4 Solar Cell, Progress in Photovoltaics: Research & Applications, 2012, 20:6-11.

(Continued)

*Primary Examiner* — Bradley Smith
(74) *Attorney, Agent, or Firm* — Quarles & Brady LLP

(57) ABSTRACT

The present invention relates to a process for producing a layer of crystalline A/M/X material, wherein the process comprises disposing on a substrate a precursor composition comprising: (a) a first precursor compound comprising a first cation (M), which first cation is a metal or metalloid cation; and (b) a solvent, wherein the solvent comprises; (i) acetonitrile, propionitrile, acetone or a mixture thereof; and (ii) an alkylamine. The invention also relates to a composition comprising: (i) a compound of formula $MX_n$, (ii) a compound of formula AX, (iii) acetonitrile, propionitrile, acetone or a mixture thereof; and (iv) an alkylamine of formula $R^4NH_2$, wherein $R^4$ is a $C_{1-8}$ alkyl group.

43 Claims, 18 Drawing Sheets

(52) U.S. Cl.
CPC .......... *H01L 51/0007* (2013.01); *H01L 51/42* (2013.01); *H01L 51/4213* (2013.01); *Y02E 10/549* (2013.01)

(56) References Cited

FOREIGN PATENT DOCUMENTS

WO 2016020699 A1 2/2016
WO 2016105537 A1 6/2016

OTHER PUBLICATIONS

Eperon, et al., Morphological Control for High Performance, Solution-Processed Planar Heterojunction Perovskite Solar Cells, Advanced Functional Materials, 2014, 24:151-157.

Gardner, et al., Nonhazardous Solvent Systems for Processing Perovskite Photovoltaics, Advanced Energy Materials, 2016, 6:1600386, 8 pages.

Haber, Manual on Catalyst Characterization, Pure & Appl. Chem., 1991, 63(9):1227-1246.

Kennedy, Jr., et al., Acute and Subchronic Toxicity of Dimethylformamide and Dimethylacetamide Following Various Routes of Administration, Drug and Chemical Toxicology, 1986, 9(2):147-170.

Liu, et al., Efficient Planar Heterojunction Perovskite Solar Cells by Vapour Deposition, Nature, 2013, 501:395-398.

McMeekin, et al., A Mixed-Cation Lead Mixed-Halide Perovskite Absorber for Tandem Solar Cells, Science, 2016, 351(6269):151-155.

Rouquerol, et al., Recommendations for the Characterization of Porous Solids, Pure & Appl. Chem., 1994, 66(8):1739-1758.

Sing, et al., Reporting Physisorption Data for Gas/Solid Systems with Special Reference to the Determination of Surface Area and Porosity, Pure & Appl. Chem., 1985, 57(4):603-619.

Smith, et al., A Layered Hybrid Perovskite Solar-Cell Absorber with Enhanced Moisture Stability, Angew. Chem., 2014, 126:11414-11417.

Tait, et al., Determination of Solvent Systems for Blade Coating Thin Film Photovoltaics, Advanced Functional Materials, 2015, 25:3393-3398.

Zhou, et al., Methylamine-Gas-Induced Defect-Healing Behavior of $CH_3NH_3PbI_3$ Thin Films for Perovskite Solar Cells, Angew. Chem. Int. Ed., 2015, 54:9705-9709.

MATERIAL PRODUCTION PROCESS WITH ALKYLAMINE

CROSS-REFERENCE TO RELATED APPLICATIONS

This application represents the national stage entry of PCT International Application No. PCT/GB2017/050623 filed Mar. 8, 2017, which claims priority to Great Britain Patent Application 1604050.3 filed Mar. 9, 2016, the contents of which are hereby incorporated herein by reference for all purposes.

FIELD OF THE INVENTION

The present invention relates to a process for producing a layer of crystalline A/M/X material. The invention also relates to a process for producing a semiconductor device. Compositions useful in the process of the invention are also described.

BACKGROUND OF THE INVENTION

When the first report of a perovskite solar cell was made in 2009, the power conversion efficiency stood at 3%. By 2012, perovskite photovoltaic devices achieving 9.2% and 10.9% had been achieved. Since then, there has been burgeoning research into the field of perovskite photovoltaics and photovoltaic devise based on other A/M/X materials, with such materials showing the promise to completely transform the energy landscape. Perovskite-based photovoltaic devices have since achieved certified efficiencies of 21%.

Apart from the obvious lure of high power conversion efficiencies, one of the most attractive features of A/M/X materials is the relative simplicity with which high-quality films of this material can be manufactured. Perovskite films can be fabricated through a variety of methods, including one-step spin-coating, vapour deposition and dip-coating, as well as various combinations of these three routes. One-step spin-coating, however, remains the simplest and quickest method with the added bonus of not requiring the use of particular expensive equipment. Many variations of this method have been developed, such as the inclusion of an additional step in the form of solvent quenching.

While perovskite solar cells are of significant importance in photovoltaic research, there remain some concerns with respect to the viability of this material for market purposes. One is the stability of the material and the anomalous hysteresis which is frequently observed in the J-V characteristics of these devices. The cause of this hysteresis has almost definitively been shown to be ion motion, and many attempts to mitigate this effect have been made. The inverted structure (p-i-n) has been shown to exhibit little to negligible hysteresis, while in the regular (p-i-n) structure, the replacement of $TiO_2$ by an organic electron acceptor such as C60 or PCBM, or the inclusion of a thin layer of such materials on top of the $TiO_2$ layer, has been quite successful in the reduction of hysteresis, and this results in a significant increase in the stabilized power output of the device.

Zhou et al (*Methylamine-Gas-Induced Defect-Healing Behavior of $CH_3NH_3PbI_3$ Thin Films for Perovskite Solar Cells*, Angew. Chem. Int. Ed., (2015) 54: 9705-9709) describes the use of methylamine gas to reduce defects in perovskite films. However, this process involves exposure to methylamine gas which involves additional process steps and is not readily compatible with solution processing.

To date, all reports of perovskite films manufactured via solution methods use high boiling point, polar, aprotic solvents (see, for instance, Eperon et al, *Morphological Control for High Performance, Solution-Processed Planar Heterojunction Perovskite Solar Cells*, Adv. Funct. Mater. 2013). While the most frequently used solvent is dimethylformamide (DMF), other solvents include dimethylsulfoxide (DMSO), γ-butyrolactone and dimethylacetamide (DMA). The choice of solvent is, in this case, limited by the lead halide salts which tend to be either sparingly, or completely insoluble in most of the solvents commonly used in the processing of organic and dye-sensitized solar cells. One of the disadvantages to using solvents such as these is the need to heat films to fairly high temperatures (≥100° C.) to induce crystallization of the perovskite or A/M/X material film. This can be somewhat circumvented by the use of solvent quenching, where a film is drenched in an anti-solvent at a specified time during spin-coating, causing the immediate crystallization of the perovskite material. However, this can complicate the process by requiring an additional solvent quenching step.

An additional concern is the solubility of other components of semiconductor devices (such as organic, electron-accepting layers in photovoltaic devices) in high boiling point solvents such as DMF, the most commonly used perovskite solvent. Both C60 and PCBM are soluble in DMF. Upon deposition of the perovskite layer, this can cause two problems: (i) the almost complete washing away of the electron selective contact in the worst case scenario; or (ii) the formation of pinholes, and thus shunting pathways, in the best case scenario. Even if the partial washing away of the electron selective contact only occurs to a very small degree, this introduces another problem: irreproducibility in device performance due to constant changes in both the thickness and the uniformity of the n-type acceptor.

There are other concerns with respect to the use of DMF, particularly with regards to its toxicity. While DMF is a commonly used industrial solvent, it is very readily absorbed through the skin, easily carrying with it any other chemicals which may be dissolved in the solvent. DMF is not classified as carcinogenic, but it is known to be toxic to the kidneys, liver and the central nervous system. It is also suspected to have caused birth defects in some cases. The toxicity of DMF is discussed in Kennedy, *Acute and Sub-chronic Toxicity of Dimethylformamide and Dimethylacetamide Following Various Routes of Administration*, Drug and Chemical Toxicology 9(2), 147-170 (1986). It is clearly desirable to develop a process which uses a less harmful solvent.

Additionally, the use of DMF in gloveboxes is not recommended, it is well known that DMF irreversibly binds to the copper catalyst which is frequently used in the purifier systems for such pieces of equipment. Therefore manufacturing of layers of an A/M/X material in an inert environment is greatly hindered by the reliance on using DMF.

A final problem with the use of solvents such as DMF is the inability to easily construct multiple junction solar cells, one on top of the other. Multiple junction solar cells are known to be a proven means to increase the absolute efficiency of a solar cell. However, to date it has not been possible to construct multiple junction perovskite solar cells via solution processing. Monolithic tandem solar cells with solution processed perovskite layers have had to remain a combination of silicon PV cells combined with a single perovskite solar cell junction. The DMF solvent, used for processing uniform and high quality perovskite films, readily interpenetrates the layers upon which it is processed and this results in washing away any perovskite layer already processed beneath. It would therefore be useful to find an alternative solvent for processing A/M/X materials which does not so readily interpenetrate underlying materials and hence enables the construction of A/M/X multi-junction devices. This would also be very useful for light emitting devices, where multiple junctions of different band gap light emitting diodes could result in a combined white light emission.

There are therefore several problems associated with existing solution-based methods for forming films of A/M/X materials. The solvents used at present (such as DMF, DMSO, γ-butyrolactone and DMA) have been chosen because they are able to dissolve the precursor compounds for A/M/X materials, and particularly the metal halide precursors. However, these solvents have high boiling points, increasing the energy requirements or complexity of solution processing. They also have a tendency to remove pre-existing organic layers during device production. These solvents are known to be toxic and can be correspondingly difficult to handle. Finally, these solvents cause problems for atmosphere purification units, and are hence challenging to employ in manufacturing.

It is therefore desirable to develop a solution based process which uses a solvent which is not toxic, does not dissolve organic semiconductor layers and is easy to handle. Furthermore, it is desirable for the process to produce smooth and pinhole free layers of the A/M/X material.

SUMMARY OF THE INVENTION

It has surprisingly been found that the above-described problems can be circumvented using a specific solvent comprising an alkylamine and acetonitrile, propionitrile or acetone. Acetonitrile, propionitrile and acetone all have low toxicity and a lower boiling point that solvents such as DMF. This means that the solvent is much easier to handle. The solvent has also been found to not wash off existing organic layers during the production of semiconductor devices. This improves the reproducibility and efficiency of produced devices. The process of the invention also unexpectedly produces films having improved smoothness and a reduced number of pinholes. In addition, films produced by the process of the invention are found to contain crystallites which are significantly larger than those found in layers formed by known processes. This enlarged crystallite size can improve the electronic and optical properties of the films.

The invention therefore provides a process for producing a layer of crystalline A/M/X material, which crystalline A/M/X material comprises a compound of formula $[A]_a[M]_b[X]_c$, wherein:

[M] comprises one or more first cations, which one or more first cations are metal or metalloid cations;
[A] comprises one or more second cations;
[X] comprises one or more halide anions;
a is an integer from 1 to 6;
b is an integer from 1 to 6; and
c is an integer from 1 to 18,
and wherein the process comprises disposing on a substrate a precursor composition comprising:
(a) a first precursor compound comprising a first cation (M), which first cation is a metal or metalloid cation; and (b) a solvent,
wherein the solvent comprises;
(i) acetonitrile, propionitrile, acetone or a mixture thereof; and
(ii) an alkylamine.

The process of the invention is particularly well suited to the production of semiconductor devices which can comprise organic components such as organic semiconductors. This is due to the reduced danger in the specific solvent washing away organic layers as discussed above.

The invention further provides a process for producing a semiconductor device, which process comprises a process layer of crystalline A/M/X material as defined herein.

Finally, the invention provides a composition comprising:
(i) a compound of formula $MX_n$, wherein: M is $Ca^{2+}$, $Sr^{2+}$, $Cd^{2+}$, $Cu^{2+}$, $Ni^{2+}$, $Mn^{2+}$, $Fe^{2+}$, $Co^{2+}$, $Pd^{2+}$, $Ge^{2+}$, $Sn^{2+}$, $Pb^{2+}$, $Yb^{2+}$, $Eu^{2+}$, $Bi^{3-}$, $Sb^{3+}$, $Pd^{4+}$, $W^{4+}$, $Re^{4-}$, $Os^{4+}$, $Ir^{4+}$, $Pt^{4+}$, $Sn^{4+}$, $Pb^{4+}$, $Ge^{4+}$ or $Te^{4+}$, preferably $Cu^{2-}$, $Pb^{2-}$, $Ge^{2+}$ or $Sn^{2+}$; X is $I^-$, $Br^-$, $Cl^-$ or $F^-$; and n is 2, 3 or 4;
(ii) a compound of formula AX, wherein A is $(R^1NH_3)^+$, $(NR^2_4)^+$ and $(H_2N-C(R^1)=NH_2)^+$, wherein $R^1$ is H or an unsubstituted $C_{1-6}$ alkyl group and each $R^2$ is an unsubstituted $C_{1-6}$ alkyl group, and X is $I^-$, $Br^-$, $Cl^-$ or $F^-$;
(iii) acetonitrile, propionitrile, acetone or a mixture thereof; and
(iv) an alkylamine of formula $R^4NH_2$, wherein $R^4$ is a $C_{1-8}$ alkyl group.

DETAILED DESCRIPTION OF THE INVENTION

Definitions

Figure 1:
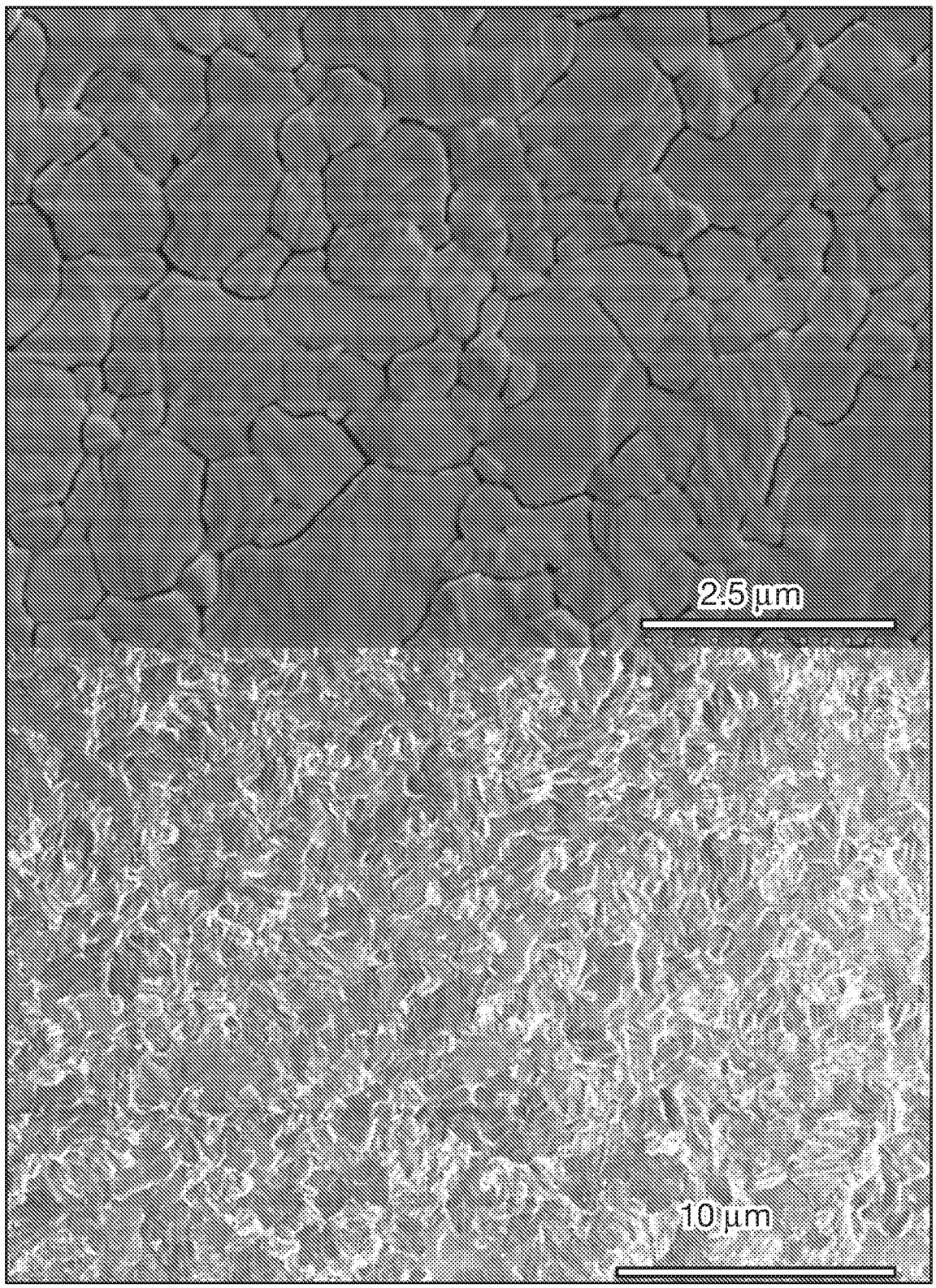
FIG. 1 shows SEM images of a section of a large area $MAPbI_3$ film spun from a 0.5M solution of $MAPbI_3$ dissolved in the ACN/MA solvent mixture.

The term "crystalline A/M/X material", as used herein, refers to a material with a three-dimensional crystal structure which comprises one or more A ions, one or more M ions, and one or more X ions. A ions and M ions are typically cations. X ions are typically anions. A/M/X materials typically do not comprise any further types of ions. References to "crystalline A/M/X material" may also be considered simply to be references to "crystalline material".

The term "perovskite", as used herein, refers to a material with a three-dimensional crystal structure related to that of $CaTiO_3$ or a material comprising a layer of material, which layer has a structure related to that of $CaTiO_3$. The structure of $CaTiO_3$ can be represented by the formula $ABX_3$, wherein A and B are cations of different sizes and X is an anion. In the unit cell, the A cations are at (0,0,0), the B cations are at (½, ½, ½) and the X anions are at (½, ½, 0). The A cation is usually larger than the B cation. The skilled person will appreciate that when A, B and X are varied, the different ion sizes may cause the structure of the perovskite material to distort away from the structure adopted by $CaTiO_3$ to a lower-symmetry distorted structure. The symmetry will also be lower if the material comprises a layer that has a structure related to that of $CaTiO_3$. Materials comprising a layer of perovskite material are well known. For instance, the structure of materials adopting the $K_2NiF_4$-type structure comprises a layer of perovskite material. The skilled person will appreciate that a perovskite material can be represented by the formula [A][B][X]$_3$, wherein [A] is at least one cation, [B] is at least one cation and [X] is at least one anion. When the perovskite comprise more than one A cation, the different A cations may distributed over the A sites in an ordered or disordered way. When the perovskite comprises more than one B cation, the different B cations may distributed over the B sites in an ordered or disordered way. When the perovskite comprise more than one X anion, the different X anions may distributed over the X sites in an ordered or disordered way. The symmetry of a perovskite comprising more than one A cation, more than one B cation or more than one X cation, will be lower than that of $CaTiO_3$. For layered perovskites the stoichiometry can change between the A, B and X ions. As an example, the [A]$_2$[B][X]$_4$ structure can be adopted if the A cation has a too large an ionic radii to fit within the 3D perovskite structure.

The term "metal halide perovskite", as used herein, refers to a perovskite, the formula of which contains at least one metal cation and at least one halide anion. The term "organic-inorganic metal halide perovskite", as used herein, refers to a metal halide perovskite, the formula of which contains at least one organic cation.

The term "hexahalometallate", as used herein, refers to a compound which comprises an anion of the formula $[MX_6]^{n-}$ wherein M is a metal atom, each X is independently a halide anion and n is an integer from 1 to 4.

The term "monocation", as used herein, refers to any cation with a single positive charge, i.e. a cation of formula $A^-$ where A is any moiety, for instance a metal atom or an organic moiety. The term "dication", as used herein, refers to any cation with a double positive charge, i.e. a cation of formula $A^{2+}$ where A is any moiety, for instance a metal atom or an organic moiety. The term "trication", as used herein, refers to any cation with a double positive charge, i.e. a cation of formula $A^{3+}$ where A is any moiety, for instance a metal atom or an organic moiety. The term "tetracation", as used herein, refers to any cation with a quadruple positive charge, i.e. a cation of formula $A^{4+}$ where A is any moiety, for instance a metal atom.

The term "alkyl", as used herein, refers to a linear or branched chain saturated hydrocarbon radical. An alkyl group may be a $C_{1-20}$ alkyl group, a $C_{1-14}$ alkyl group, a $C_{1-10}$ alkyl group, a $C_{1-6}$ alkyl group or a $C_{1-4}$ alkyl group. Examples of a $C_{1-10}$ alkyl group are methyl, ethyl, propyl, butyl, pentyl, hexyl, heptyl, octyl, nonyl or decyl. Examples of $C_{1-6}$ alkyl groups are methyl, ethyl, propyl, butyl, pentyl or hexyl. Examples of $C_{1-4}$ alkyl groups are methyl, ethyl, i-propyl, n-propyl, t-butyl, s-butyl or n-butyl. If the term "alkyl" is used without a prefix specifying the number of carbons anywhere herein, it has from 1 to 6 carbons (and this also applies to any other organic group referred to herein).

The term "cycloalkyl", as used herein, refers to a saturated or partially unsaturated cyclic hydrocarbon radical. A cycloalkyl group may be a $C_{3-10}$ cycloalkyl group, a $C_{3-8}$ cycloalkyl group or a $C_{3-6}$ cycloalkyl group. Examples of a $C_{3-8}$ cycloalkyl group include cyclopropyl, cyclobutyl, cyclopentyl, cyclohexyl, cyclohexenyl, cyclohex-1,3-dienyl, cycloheptyl and cyclooctyl. Examples of a $C_{3-6}$ cycloalkyl group include cyclopropyl, cyclobutyl, cyclopentyl, and cyclohexyl.

The term "alkenyl", as used herein, refers to a linear or branched chain hydrocarbon radical comprising one or more double bonds. An alkenyl group may be a $C_{2-20}$ alkenyl group, a $C_{2-14}$ alkenyl group, a $C_{2-10}$ alkenyl group, a $C_{2-6}$ alkenyl group or a $C_{2-4}$ alkenyl group. Examples of a $C_{2-10}$ alkenyl group are ethenyl (vinyl), propenyl, butenyl, pentenyl, hexenyl, heptenyl, octenyl, nonenyl or decenyl. Examples of $C_{2-6}$ alkenyl groups are ethenyl, propenyl, butenyl, pentenyl or hexenyl. Examples of $C_{2-4}$ alkenyl groups are ethenyl, i-propenyl, n-propenyl, s-butenyl or n-butenyl. Alkenyl groups typically comprise one or two double bonds.

The term "alkynyl", as used herein, refers to a linear or branched chain hydrocarbon radical comprising one or more triple bonds. An alkynyl group may be a $C_{2-20}$ alkynyl group, a $C_{2-14}$ alkynyl group, a $C_{2-10}$ alkynyl group, a $C_{2-6}$ alkynyl group or a $C_{2-4}$ alkynyl group. Examples of a $C_{2-10}$ alkynyl group are ethynyl, propynyl, butynyl, pentynyl, hexynyl, heptynyl, octynyl, nonynyl or decynyl. Examples of $C_{1-6}$ alkynyl groups are ethynyl, propynyl, butynyl, pentynyl or hexynyl. Alkynyl groups typically comprise one or two triple bonds.

The term "aryl", as used herein, refers to a monocyclic, bicyclic or polycyclic aromatic ring which contains from 6 to 14 carbon atoms, typically from 6 to 10 carbon atoms, in the ring portion. Examples include phenyl, naphthyl, indenyl, indanyl, anthrecenyl and pyrenyl groups. The term "aryl group", as used herein, includes heteroaryl groups. The term "heteroaryl", as used herein, refers to monocyclic or bicyclic heteroaromatic rings which typically contains from six to ten atoms in the ring portion including one or more heteroatoms. A heteroaryl group is generally a 5- or 6-membered ring, containing at least one heteroatom selected from O, S, N, P, Se and Si. It may contain, for example, one, two or three heteroatoms. Examples of heteroaryl groups include pyridyl, pyrazinyl, pyrimidinyl, pyridazinyl, furanyl, thienyl, pyrazolidinyl, pyrrolyl, oxazolyl, oxadiazolyl, isoxazolyl, thiadiazolyl, thiazolyl, isothiazolyl, imidazolyl, pyrazolyl, quinolyl and isoquinolyl.

The term "substituted", as used herein in the context of substituted organic groups, refers to an organic group which bears one or more substituents selected from $C_{1-10}$ alkyl, aryl (as defined herein), cyano, amino, nitro, $C_{1-10}$ alkylamino, di($C_{1-10}$)alkylamino, arylamino, diarylamino, aryl($C_{1-10}$) alkylamino, amido, acylamido, hydroxy, oxo, halo, carboxy, ester, acyl, acyloxy, $C_{1-10}$ alkoxy, aryloxy, halo($C_{1-10}$)alkyl, sulfonic acid, thiol, $C_{1-10}$ alkylthio, arylthio, sulfonyl, phosphoric acid, phosphate ester, phosphonic acid and phosphonate ester. Examples of substituted alkyl groups include haloalkyl, perhaloalkyl, hydroxyalkyl, aminoalkyl, alkoxyalkyl and alkaryl groups. When a group is substituted, it may bear 1, 2 or 3 substituents. For instance, a substituted group may have 1 or 2 substitutents.

The term "porous", as used herein, refers to a material within which pores are arranged. Thus, for instance, in a porous scaffold material the pores are volumes within the scaffold where there is no scaffold material. The individual pores may be the same size or different sizes. The size of the pores is defined as the "pore size". The limiting size of a pore, for most phenomena in which porous solids are involved, is that of its smallest dimension which, in the absence of any further precision, is referred to as the width of the pore (i.e. the width of a slit-shaped pore, the diameter of a cylindrical or spherical pore, etc.). To avoid a misleading change in scale when comparing cylindrical and slit-shaped pores, one should use the diameter of a cylindrical pore (rather than its length) as its "pore-width" (J. Rouquerol et al., "Recommendations for the Characterization of Porous Solids", Pure & Appl. Chem., Vol. 66, No. 8, pp. 1739-1758, 1994). The following distinctions and definitions were adopted in previous IUPAC documents (K. S. W. Sing, et al, Pure and Appl. Chem., vol. 57, n04, pp 603-919, 1985; and IUPAC "Manual on Catalyst Characterization", J. Haber, Pure and Appl. Chem., vol. 63, pp. 1227-1246, 1991): micropores have widths (i.e. pore sizes) smaller than 2 nm; Mesopores have widths (i.e. pore sizes) of from 2 nm to 50 nm; and Macropores have widths (i.e. pore sizes) of greater than 50 nm. In addition, nanopores may be considered to have widths (i.e. pore sizes) of less than 1 nm.

Pores in a material may include "closed" pores as well as open pores. A closed pore is a pore in a material which is a non-connected cavity, i.e. a pore which is isolated within the material and not connected to any other pore and which cannot therefore be accessed by a fluid (e.g. a liquid, such as a solution) to which the material is exposed. An "open pore" on the other hand, would be accessible by such a fluid. The concepts of open and closed porosity are discussed in detail in J. Rouquerol et al., "Recommendations for the Characterization of Porous Solids", Pure & Appl. Chem., Vol. 66, No. 8, pp. 1739-1758, 1994.

Open porosity, therefore, refers to the fraction of the total volume of the porous material in which fluid flow could effectively take place. It therefore excludes closed pores. The term "open porosity" is interchangeable with the terms "connected porosity" and "effective porosity", and in the art is commonly reduced simply to "porosity".

The term "without open porosity", as used herein, therefore refers to a material with no effective open porosity. Thus, a material without open porosity typically has no macropores and no mesopores. A material without open porosity may comprise micropores and nanopores, however. Such micropores and nanopores are typically too small to have a negative effect on a material for which low porosity is desired.

The term "compact layer", as used herein, refers to a layer without mesoporosity or macroporosity. A compact layer may sometimes have microporosity or nanoporosity.

The term "semiconductor device", as used herein, refers to a device comprising a functional component which comprises a semiconductor material. This term may be understood to be synonymous with the term "semiconducting device". Examples of semiconductor devices include a photovoltaic device, a solar cell, a photo detector, a photodiode, a photosensor, a chromogenic device, a transistor, a light-sensitive transistor, a phototransistor, a solid state triode, a battery, a battery electrode, a capacitor, a super-capacitor, a light-emitting device, a laser or a light-emitting diode. The term "optoelectronic device", as used herein, refers to devices which source, control or detect light. Light is understood to include any electromagnetic radiation. Examples of optoelectronic devices include photovoltaic devices, photodiodes (including solar cells), phototransistors, photomultipliers, photoresistors, and light emitting diodes.

The term "consisting essentially of" refers to a composition comprising the components of which it consists essentially as well as other components, provided that the other components do not materially affect the essential characteristics of the composition. Typically, a composition consisting essentially of certain components will comprise greater than or equal to 95 wt % of those components or greater than or equal to 99 wt % of those components.

Process

The invention provides a process for producing a layer of crystalline A/M/X material, which crystalline A/M/X material comprises a compound of formula $[A]_a[M]_b[X]_c$, wherein: [M] comprises one or more first cations, which one or more first cations are metal or metalloid cations; [A] comprises one or more second cations; [X] comprises one or more halide anions; a is an integer from 1 to 6; b is an integer from 1 to 6; and c is an integer from 1 to 18, and wherein the process comprises disposing on a substrate a precursor composition comprising: (a) a first precursor compound comprising a first cation (M), which first cation is a metal or metalloid cation; and (b) a solvent, wherein the solvent comprises; (i) acetonitrile, propionitrile, acetone or a mixture thereof; and (ii) an alkylamine.

An alkylamine is an organic compound comprising an alkyl group and an amine group, which amine group may be a primary or secondary amine group. The alkylamine compound may be a primary amine $R^A NH_2$, wherein $R^A$ is an alkyl group which may be substituted or unsubstituted, or a secondary amine $R^A{}_2 NH$, wherein each $R^A$ is an alkyl group which may be substituted or unsubstituted. Typically, the alkylamine is a primary alkylamine.

The alkylamine is typically a compound of formula $R^A NH_2$, wherein $R^A$ is a $C_{1-8}$ alkyl group. The $C_{1-8}$ alkyl group may be substituted or unsubstituted. For instance, the $C_{1-8}$ alkyl group may be a phenylethyl group or a benzyl group. Typically, the $C_{1-8}$ alkyl group is unsubstituted. $R^A$ is preferably an unsubstituted $C_{1-6}$ alkyl group. For instance, $R^A$ may be methyl, ethyl, propyl, isopropyl, butyl (i.e. n-butyl), pentyl (n-pentyl) or hexyl (n-hexyl).

Preferably, the alkylamine is methylamine, ethylamine, propylamine, butylamine or pentylamine, for instance methylamine, propylamine or butylamine. More preferably, the alkylamine is methylamine. The solvent may comprise two or more alkylamine compounds as defined herein. For instance, the solvent may comprise methylamine and butylamine.

Many A/M/X materials, such as organic mixed halide perovskites, comprise alkylammonium ions such as methylammonium. As such, the known precursor solutions for A/M/X materials comprising alkylammonium ions typically comprise alkylammonium ions. For instance, a precursor solution may comprise a solution of an alkylammonium halide, for instance methylammonium iodide. However, it should be noted that such precursor solutions do not comprise a solvent which comprises an alkylamine. Rather, they comprise an alkylammonium ion which is a protonated alkylamine. Furthermore, the alkylammonium ions in such known precursor solutions are accompanied by a molar equivalent of halide counterions.

Thus, the precursor in the process of the invention comprises an alkylamine, which alkylamine is typically unprotonated. Of course, protonated alkylammonium ions may also be present if they are for instance part of the second precursor compound, but these are in addition to the solvent alkylamine. Furthermore, the precursor solution comprising the solvent typically comprises a molar ratio of (alkylamine):(halide ions) which is greater than 100:100, for instance greater than 105:100 or greater than 110:100. The molar ratio may be from 105:100 to 200:100.

Typically, the solvent in the process of the invention is produced by adding the alkylamine to the acetonitrile, propionitrile, acetone or a mixture thereof, either as a gaseous alkylamine, a liquid alkylamine or a solution of an alkylamine. Thus, the process may further comprise producing the solvent by adding the alkylamine to the acetonitrile, propionitrile, acetone or a mixture thereof. This is typically before the first (or second) precursor compound is added to the solvent to form the precursor composition. A gaseous alkylamine may be added to a solvent by bubbling the alkylamine through the solvent.

The amount of alkylamine in the solvent or precursor composition may vary depending on requirements. Typically, the molar ratio of (the alkylamine):(the first precursor compound) is from $1\times 10^{-7}$:1 to 0.5:1, optionally from $1\times 10^{-6}$:1 to 0.1:1.

In some cases, the amount of the alkylamine may be relatively small. For instance, the molar ratio of (the alkylamine):(the first precursor compound) may be less than $1\times 10^{-4}$:1. In this case, the molar ratio may be from $1\times 10^{-7}$:1 to $1\times 10^{-4}$:1 or from $1\times 10^{-6}$:1 to $1\times 10^{-5}$:1.

Typically, the volume of alkylamine (either in liquid form or as a volume equivalent of a saturated solution of the alkylamine in acetonitrile) is from 1.0 to 500 microliters of alkylamine per milliliter of precursor composition as a whole, for instance from 10 to 200 microliters of alkylamine per milliliter of precursor composition as a whole. Preferably, the volume of alkylamine is from 50 to 150 microliters of alkylamine per milliliter of precursor composition as a whole.

In some cases, a larger proportion of the solvent may be alkylamine. In that case, the molar ratio of (the alkylamine):(the first precursor compound) may be from 0.001:1 to 0.5:1, for instance from 0.01:1 to 0.1:1.

If the solvent comprises two alkylamines, the concentration of the first alkylamine (for instance methylamine) may be as defined above. The concentration of the second alkylamine (for instance butylamine) may be from 2 to 400 microliters of the second alkylamine per milliliter of precursor composition as a whole, for instance from 5 to 200, or from 50 to 200, microliters of the second alkylamine per milliliter of precursor composition as a whole.

The solvent preferably comprises acetonitrile. For instance, greater then or equal to 80 vol % of the solvent may be acetonitrile.

For instance, the solvent may comprise acetonitrile and from 10 to 200 microliters of butylamine (for instance from 40 to 200 microliters) per milliliter of solvent. In such a solvent, the solvent may comprise from 80 to 95 vol % of acetonitrile.

First Precursor Compound

The first precursor compound comprises a first cation (M), which first cation is a metal or metalloid cation. The first precursor compound typically further comprises first anion. The first precursor compound may comprise further cations or anions. The first precursor compound may consist of one or more of the first cations and one or more of the first anions.

Typically, the first anion is a halide anion, a thiocyanate anion ($SCN^-$), a tetrafluoroborate anion ($BF_4^-$) or an organic anion. Preferably, the first anion is a halide anion or an organic anion. The first precursor compound may comprise two or more first anions, e.g. two or more halide anions.

Typically, the organic anion is an anion of formula $RCOO^-$, $ROCOO^-$, $RSO_3^-$, $ROP(O)(OH)O^-$ or $RO^-$, wherein R is H, substituted or unsubstituted $C_{1-10}$ alkyl, substituted or unsubstituted $C_{2-10}$ alkenyl, substituted or unsubstituted $C_{2-10}$ alkynyl, substituted or unsubstituted $C_{3-10}$ cycloalkyl, substituted or unsubstituted $C_{3-10}$ heterocyclyl or substituted or unsubstituted aryl. For instance R may be H, substituted or unsubstituted $C_{1-10}$ alkyl, substituted or unsubstituted $C_{3-10}$ cycloalkyl or substituted or unsubstituted aryl. Typically R is H substituted or unsubstituted $C_{1-6}$ alkyl or substituted or unsubstituted aryl. For instance, R may be H unsubstituted $C_{1-6}$ alkyl or unsubstituted aryl. Thus, R may be selected from H, methyl, ethyl, propyl, butyl, pentyl, hexyl, cyclopentyl, cyclohexyl and phenyl.

Often, (one or more) first anions are selected from halide anions (e.g. $F^-$, $Cl^-$, $Br^-$ and $I^-$) and anions of formula $RCOO^-$, wherein R is H or methyl.

Typically, the first anion is $F^-$, $Cl^-$, $Br^-$, $I^-$, formate or acetate. Preferably, the first anion is $Cl^-$, $Br^-$, $I^-$ or $F^-$. More preferably, the first anion is $Cl^-$, $Br^-$ or $I^-$.

The metal or metalloid cation may be a cation derived from any metal in groups 1 to 16 of the periodic table of the elements. The metal or metalloid cation may be any suitable metal or metalloid cation. The metal or metalloid cation may be a monocation, a dication, a trication or a tetracation. The metal or metalloid cation is typically a dication or a tetracation.

Metalloids are usually taken to be following elements: B, Si, Ge, As, Sb, Te and Po. Preferably, the first cation is a metal or metalloid dication, for instance a metal dication.

Typically, the first cation which is a metal or metalloid cation is $Ca^{2+}$, $Sr^{2+}$, $Cd^{2+}$, $Cu^{2+}$, $Ni^{2+}$, $Mn^{2+}$, $Fe^{2+}$, $Co^{2+}$, $Pd^{2-}$, $Ge^{2+}$, $Sn^{2+}$, $Pb^{2+}$, $Yb^{2+}$, $Eu^{2+}$, $Bi^{3+}$, $Sb^{3+}$, $Pd^{4+}$, $W^{4+}$, $Re^{4+}$, $Os^{4+}$, $Ir^{4+}$, $Pt^{4+}$, $Sn^{4+}$, $Pb^{4+}$, $Ge^{4+}$ or $Te^{4+}$. Preferably, the metal or metalloid cation is $Cu^{2+}$, $Pb^{2+}$, $Ge^{2+}$ or $Sn^{2+}$. Often, the first cation is a metal or metalloid cation which is $Pb^{2+}$ or $Sn^{2-}$. The first compound may comprise two or more first cations, for instance two or more cations selected from $Cu^{2+}$, $Ni^{2+}$, $Mn^{2+}$, $Fe^{2+}$, $Co^{2+}$, $Pd^{2+}$, $Ge^{2+}$, $Sn^{2+}$, $Pb^{2+}$, $Yb^{2+}$ and $Eu^{2+}$.

Typically, the first precursor compound is a compound of formula $MY_2$, $MY_3$, or $MY_4$, wherein M is said first cation which is a metal or metalloid dication, trication or tetracation, and Y is said first anion.

Thus, the first precursor compound may be a compound of formula $MY_2$, wherein M is $Ca^{2-}$, $Sr^{2+}$, $Cd^{2+}$, $Cu^{2+}$, $Ni^{2+}$, $Mn^{2+}$, $Fe^{2+}$, $Co^{2+}$, $Pd^{2+}$, $Ge^{2+}$, $Sn^{2+}$, $Pb^{2+}$, $Yb^{2+}$ or $Eu^{2+}$ and Y is $F^-$, $Cl^-$, $Br^-$, $I^-$, formate or acetate. Preferably M is $Cu^{2+}$, $Pb^{2+}$, $Ge^{2-}$ or $Sn^{2+}$ and Y is $Cl^-$, $Br^-$, $I^-$, formate or acetate, preferably $Cl^-$, $Br^-$ or $I^-$.

Typically, the first precursor compound is lead (II) acetate, lead (II) formate, lead (II) fluoride, lead (II) chloride, lead (II) bromide, lead (II) iodide, tin (II) acetate, tin (II) formate, tin (II) fluoride, tin (II) chloride, tin (II) bromide, tin (II) iodide, germanium (II) acetate, germanium (II) formate, germanium (II) fluoride, germanium (II) chloride, germanium (II) bromide or germanium (II) iodide. In some cases, the first precursor compound comprises lead (II) acetate.

The first precursor compound is typically a compound of formula $MX_2$. Preferably, the first precursor compound is a compound of formula $SnI_2$, $SnBr_2$, $SnCl_2$, $PbI_2$, $PbBr_2$ or $PbCl_2$. More preferably, the first precursor compound is a compound of formula $PbI_2$, $PbBr_2$ or $PbCl_2$.

The first precursor compound may be a compound of formula $MY_3$, wherein M is $Bi^{3+}$ or $Sb^{3+}$ and Y is $F^-$, $Cl^-$, $Br^-$, $I^-$, $SCN^-$, $BF_4^-$, formate or acetate. Preferably M is $Bi^{3+}$ and Y is $Cl^-$, $Br^-$ or $I^-$. In that case, the A/M/X material typically comprises a bismuth or antimony halogenometallate.

The first precursor compound may be a compound of formula $MY_4$, wherein M is $Pd^{4+}$, $W^{4+}$, $Re^{4+}$, $Os^{4+}$, $Ir^{4+}$, $Pt^{4+}$, $Sn^{4+}$, $Pb^{4-}$, $Ge^{4+}$ or $Te^{4+}$ and Y is $F^-$, $Cl^-$, $Br^-$, $I^-$, $SCN^-$, $BF_4^-$, formate or acetate. Preferably M is $Sn^{4+}$, $Pb^{4+}$ or $Ge^{4+}$ and $Cl^-$, $Br^-$ or $I^-$. In that case, the A/M/X material typically comprises a hexahalometallate Second Precursor Compound The process further typically further comprises disposing on the substrate a second precursor compound, which second precursor compound comprises a second cation (A) and a halide anion (X), preferably wherein the second precursor compound is a compound of formula [A][X] wherein: [A] comprises the one or more second cations; and [X] comprises the one or more halide anion.

The second precursor compound comprises a second anion (i.e. a halide anion) and a second cation. The second anion and second cation may be any suitable ions. For instance the second cation may be a metal or metalloid cation or an organic cation. For instance the second cation may be a cation selected from $Li^-$, $Na^-$, $K^+$, $Rb^-$, $Cs^+$ and an organic cation. The second cation is often a monocation, for instance a metal or metalloid monocation or an organic monocation. Typically, wherein the second cation is $Cs^+$ or an organic cation.

Typically, the second cation is an organic cation. The second cation may be any suitable organic cation. The organic cation may be a cation derived from an organic compound, for instance by protonation. The second cation may be an organic monocation or an organic dication. The second cation is typically an organic monocation. The second cation typically has a molecular weight of less than or equal to 500 $gmol^{-1}$. Preferably, the second cation has a molecular weight of less than or equal to 250 $gmol^{-1}$ or less than or equal to 150 $gmol^{-1}$. Often, the second cation is an organic cation comprising a nitrogen atom or a phosphorous atom. For instance, the organic cation may comprise a quaternary nitrogen atom.

Typically, the second cation is $Cs^+$, $(NR^1R^2R^3R^4)^+$, $(R^1R^2N=CR^3R^4)^+$, $(R^1R^2N-C(R^5)=NR^3R^4)^+$ or $(R^1R^2N-C(NR^5R^6)=NR^3R^4)^+$, and each of $R^1$, $R^2$, $R^3$, $R^4$, $R^5$ and $R^6$ is independently H, a substituted or unsubstituted $C_{1-20}$ alkyl group or a substituted or unsubstituted aryl group. $R^1$, $R^2$, $R^3$, $R^4$, $R^5$ and $R^6$ are typically independently H, a substituted or unsubstituted $C_{1-6}$ alkyl group or a substituted or unsubstituted aryl group. Preferably $R^1$, $R^2$, $R^3$, $R^4$, $R^5$ and $R^6$ are independently H, or an unsubstituted $C_{1-6}$ alkyl group. For instance, $R^1$, $R^2$, $R^3$, $R^4$, $R^5$ and $R^6$ may independently be H, methyl, ethyl or propyl.

Preferably, the second cation is selected from $(R^1NH_3)^+$, $(NR^2_4)^+$, and $(H_2N-C(R^1)=NH_2)^+$, wherein $R^1$ is H, a substituted or unsubstituted $C_{1-20}$ alkyl group or a substituted or unsubstituted aryl group, and each $R^2$ is independently H, or a substituted or unsubstituted $C_{1-10}$ alkyl group. Often, $R^1$ is H or an unsubstituted $C_{1-6}$ alkyl group and each $R^2$ is an unsubstituted $C_{1-6}$ alkyl group. For instance, $R^1$ may be H, methyl, ethyl or propyl and each $R^2$ may be methyl, ethyl and propyl. All $R^2$ may be the same and may be methyl, ethyl and propyl. For instance, the second cation may be selected from $Cs^+$, $(CH_3NH_3)^+$, $(CH_3CH_2NH_3)^+$, $(CH_3CH_2CH_2NH_3)^+$, $(N(CH_3)_4)^+$, $(N(CH_2CH_3)_4)^-$, $(N(CH_2CH_2CH_3)_4)^+$, $(H_2N-C(H)=NH_2)^+$ and $(H_2N-C(CH_3)=NH_2)^+$.

Typically, the one or more second cations are selected from cations of formula $Cs^+$, $(NR^1R^2R^3R^4)^-$, $(R^1R^2N=CR^3R^4)^-$, $(R^1R^2N-C(R^5)=NR^3R^4)^+$ and $(R^1R^2N-C(NR^5R^6)=NR^3R^4)^+$, wherein each of $R^1$, $R^2$, $R^3$, $R^4$, $R^5$ and $R^6$ is independently H, a substituted or unsubstituted $C_{1-20}$ alkyl group or a substituted or unsubstituted aryl group. $R^1$, $R^2$, $R^3$, $R^4$, $R^5$ and $R^6$ are typically selected from H and unsubstituted $C_{1-6}$ alkyl group, for instance H and methyl. Preferably, the one or more second cations are selected from $(CH_3NH_3)^+$ and $(H_2N-C(H)=NH_2)^+$.

Often, the second cation is $(CH_3NH_3)^+$, $(CH_3CH_2NH_3)^+$ or $(CH_3CH_2CH_2NH_3)^+$. For instance, the second cation may be $(CH_3NH_3)^+$.

The second anion is typically a halide anion. The second anion may be $F^-$, $Cl^-$, $Br^-$ or $I^-$. Often, the second anion is $Cl^-$, $Br^-$ or $I^-$.

The second precursor compound is typically, a compound of formula AX, wherein A is said second cation and X is said second anion, which second anion is a halide anion. The second cation may be as defined herein. The second anion may be as defined herein.

The second precursor compound may, for instance, be selected from $(H_3NR^1)X$, $(NR^1R^2R^3R^4)X$, $(R^1R^2N=CR^3R^4)X$, $(R^1R^2N-C(R^5)=NR^3R^4)X$ and $(R^1R^2N-C(NR^5R^6)=NR^3R^4)X$, wherein each of $R^1$, $R^2$, $R^3$, $R^4$, $R^5$ and $R^6$ is independently H, a substituted or unsubstituted $C_{1-20}$ alkyl group or a substituted or unsubstituted aryl group, and X is $F^-$, $Cl^-$, $Br^-$, or $I^-$. Preferably the second precursor compound is $(H_3NR^1)X$, wherein $R^1$ is an unsubstituted $C_{1-6}$ alkyl group and X is $Cl^-$, $Br^-$, or $I^-$.

The second precursor compound may, for example, be selected from CsF, CsCl, CsBr, CsI, $NH_4F$, $NH_4Cl$, $NH_4Br$, $NH_4I$, $(CH_3NH_3)F$, $(CH_3NH_3)Cl$, $(CH_3NH_3)Br$, $(CH_3NH_3)I$, $(CH_3CH_2NH_3)F$, $(CH_3CH_2NH_3)Cl$, $(CH_3CH_2NH_3)Br$, $(CH_3CH_2NH_3)I$, $(N(CH_3)_4)F$, $(N(CH_3)_4)Cl$, $(N(CH_3)_4)Br$, $(N(CH_3)_4)I$, $(H_2N-C(H)=NH_2)F$, $(H_2N-C(H)=NH_2)Cl$, $(H_2N-C(H)=NH_2)Br$ and $(H_2N-C(H)=NH_2)I$. Typically, the second precursor compound is selected from $(CH_3NH_3)Cl$, $(CH_3NH_3)Br$, $(CH_3NH_3)I$, $(CH_3CH_2NH_3)Cl$, $(CH_3CH_2NH_3)Br$, $(CH_3CH_2NH_3)I$, $(N(CH_3)_4)Cl$, $(N(CH_3)_4)Br$, $(N(CH_3)_4)I$, $(H_2N-C(H)=NH_2)Cl$, $(H_2N-C(H)=NH_2)Br$ and $(H_2N-C(H)=NH_2)I$.

Often, the second precursor compound is $(CH_3NH_3)F$, $(CH_3NH_3)Cl$, $(CH_3NH_3)Br$, $(CH_3NH_3)I$, $(CH_3CH_2NH_3)F$, $(CH_3CH_2NH_3)Cl$, $(CH_3CH_2NH_3)Br$, $(CH_3CH_2NH_3)I$, $(N(CH_3)_4)F$, $(N(CH_3)_4)Cl$, $(N(CH_3)_4)Br$, $(N(CH_3)_4)I$, $(H_2N-C(H)=NH_2)Cl$, $(H_2N-C(H)=NH_2)Br$ and $(H_2N-C(H)=NH_2)I$. Preferably, the second precursor compound is $(CH_3NH_3)Cl$, $(CH_3NH_3)Br$, $(CH_3NH_3)I$, $(CH_3CH_2NH_3)Cl$, $(CH_3CH_2NH_3)Br$ or $(CH_3CH_2NH_3)I$.

In some cases, the second precursor compound may be disposed on the substrate before or after the precursor composition. For instance, the substrate may comprise a layer of the second precursor compound and the process may comprise disposing the precursor composition comprising the first precursor compound on the layer of the second precursor compound, for instance by dipping the substrate in the precursor composition.

Typically, the second precursor compound is disposed on the substrate at the same time as the first precursor compound. Thus, typically the precursor composition further comprises: (c) a second precursor compound, which second precursor compound comprises a second cation (A) and a first anion (X). The second precursor compound may be as defined herein.

The second precursor compound is preferably a compound of formula AX. More preferably, the second precursor compound is $(CH_3NH_3)I$, $(CH_3NH_3)Br$ or $(CH_3NH_3)Cl$.

The identity of the alkylamine may be matched to the alkylamine which, when protonated, corresponds to the second cation A. For example, [A] may comprise a second cation which is a cation of formula $(R^ANH_3)^+$ and the alkylamine may be a compound of formula $R^ANH_2$, wherein each $R^A$ is the same group, which is a $C_{1-8}$ alkyl group, for instance an unsubstituted $C_{1-6}$ alkyl group such as methyl, ethyl, propyl, n-butyl or n-pentyl. Preferably, the second cation is methylammonium and the alkylamine is methylamine.

Crystalline A/M/X Material

Typically, the crystalline A/M/X material comprises a compound comprising: said first cation (M) which is a metal or metalloid cation; said second cation (A) which is a metal monocation or an organic cation; and said second anion (X) which is a halide anion. The second anion may originate from either of the first and second precursor compounds, or from both. For instance, X in the A/M/X material may comprise X and Y anions from the second and first precursor compounds as defined above.

Often, the crystalline A/M/X material comprises a compound consisting of: said first cation which is a metal or metalloid cation; said second cation, which second cation is an organic cation; and the second anion which is a halide anion. The crystalline A/M/X material typically comprises greater than or equal to 90% by weight of a compound comprising said first cation which is a metal or metalloid cation; said second cation, which second cation is an organic cation; and the second anion which is a halide anion or a chalcogenide anion. For instance the crystalline A/M/X material may consist essentially of a compound described below, for instance a perovskite or a hexahalometallate.

The crystalline material comprises a compound having the following formula $$[A]_a[M]_b[X]_c$$

wherein [A] is one or more of said second cations, [M] is one or more of said first cations, [X] is one or more or said second anions, a is an integer from 1 to 6, b is an integer from 1 to 6, and c is an integer from 1 to 18. a is often an integer from 1 to 3, b is often an integer from 1 to 3, and c is often an integer from 1 to 8.

The crystalline compound may therefore comprise a compound having the following formula $$[A]_a[M]_b[X]_c$$

wherein:
[A] is one or more second cations such as those described herein, for instance one or more organic monocations;
[M] is one or more first cations which are metal or metalloid cations selected from $Pd^{4+}$, $W^{4+}$, $Re^{4+}$, $Os^{4+}$, $Ir^{4+}$, $Pt^{4+}$, $Sn^{4+}$, $Pb^{4+}$, $Ge^{4+}$, $Te^{4+}$, $Bi^{3+}$, $Sb^{3+}$, $Sn^{2+}$, $Pb^{2+}$, $Cu^{2+}$, $Ge^{2+}$ and $Ni^{2+}$.
[X] is one or more second anions selected from $Cl^-$, $Br^-$, $I^-$, $O^{2-}$, $S^{2-}$, $Se^{2-}$, and $Te^{2-}$;
a is an integer from 1 to 3;
b is an integer from 1 to 3; and
c is an integer from 1 to 8.

If [A] is one cation (A), [M] is two cations ($M^1$ and $M^2$), and [X] is one anion (X), the crystalline material may comprise a compound of formula $A_a(M^1,M^2)_bX_c$. [A] may represent one, two or more A ions. If [A], [M] or [X] is more than one ion, those ions may be present in any proportion. For instance, $A_a(M^1,M^2)_bX_c$ includes all compounds of formula $A_aM^1_{by}M^2_{b(1-y)}X_c$ wherein y is between 0 and 1, for instance from 0.05 to 0.95. Such materials may be referred to as mixed ion materials.

Typically, the crystalline A/M/X material comprises a perovskite or a hexahalometallate. Preferably the crystalline material comprises a perovskite. The crystalline material often comprises a metal halide perovskite. The crystalline material often comprises an organometal halide perovskite.

Typically, the crystalline A/M/X material comprises: a perovskite of formula (I):

$$[A][M][X]_3 \quad (I)$$

wherein: [A] is at least one monocation; [M] is at least one metal or metalloid dication; and [X] is at least one halide anion.

[A] may be at least one cation as described herein for the second cation. For instance, [A] may be one or more cations selected from $Cs^+$, $(NR^1R^2R^3R^4)^+$, $(R^1R^2N=CR^3R^4)^+$, $(R^1R^2N-C(R^5)=NR^3R^4)^+$ and $(R^1R^2N-C(NR^5R^6)=NR^3R^4)^+$, wherein each of $R^1$, $R^2$, $R^3$, $R^4$, $R^5$ and $R^6$ is independently H, a substituted or unsubstituted $C_{1-20}$ alkyl group or a substituted or unsubstituted aryl group. $R^1$, $R^2$, $R^3$, $R^4$, $R^5$ and $R^6$ may be independently H, or an unsubstituted $C_{1-6}$ alkyl group. [A] may be one or more organic cations selected from $(CH_3NH_3)^+$, $(CH_3CH_2NH_3)^+$, $(CH_3CH_2CH_2NH_3)^+$, $(N(CH_3)_4)^+$, $(H_2N-C(H)=NH_2)^+$ and $(H_2N-C(CH_3)=NH_2)^+$. [A] may be a single cation selected from $(CH_3NH_3)^+$, $(CH_3CH_2NH_3)^+$, $(CH_3CH_2CH_2NH_3)^+$, $(N(CH_3)_4)^+$, $(H_2N-C(H)=NH_2)^+$ and $(H_2N-C(CH_3)=NH_2)^+$. A is often $(CH_3NH_3)^+$, $(CH_3CH_2NH_3)^+$ or $(CH_3CH_2CH_2NH_3)^+$.

[M] may be at least one cation as described herein for the first cation. For instance, [M] may be one or more cations selected from $Ca^{2+}$, $Sr^{2-}$, $Cd^{2+}$, $Cu^{2+}$, $Ni^{2+}$, $Mn^{2+}$, $Fe^{2+}$, $Co^{2+}$, $Pd^{2+}$, $Ge^{2+}$, $Sn^{2+}$, $Pb^{2+}$, $Yb^{2+}$ and $Eu^{2+}$.

In one embodiment, the perovskite is a perovskite compound of the formula (IA):

$$AM[X]_3 \qquad (IA)$$

wherein: A is an organic cation; M is a metal cation; and [X] is two or more different halide anions. Preferably, [X] is two or three different halide anions. More preferably, [X] is two different halide anions. The organic cation and metal cation may be as defined above for the second cation and first cation respectively.

The crystalline A/M/X material may, for instance, comprise a perovskite compound of formula (IB):

$$AMX_{3-x}X'_x \qquad (IB)$$

wherein: A is said second cation; M is said first cation; X is a first halide anion; X' is a second halide anion which is different from the first halide anion; and x is from 0 to 3. Usually, x is from 0.05 to 0.95. For instance, x may be from 0.5 to 2.5, or from 0.75 to 2.25. Typically, x is from 1 to 2.

The crystalline A/M/X material may comprise, or consist essentially of, a perovskite compound selected from $APbI_3$, $APbBr_3$, $APbCl_3$, $APbF_3$, $APbBr_xI_{3-x}$, $APbBr_xCl_{3-x}$, $APbI_xBr_{3-x}$, $APbI_xCl_{3-x}$, $APbCl_xBr_{3-x}$, $APbI_{3-x}Cl_x$, $ASnI_3$, $ASnBr_3$, $ASnCl_3$, $ASnF_3$, $ASnBrI_2$, $ASnBr_xI_{3-x}$, $ASnBr_xCl_{3-x}$, $ASnF_{3-x}Br_x$, $ASnI_xBr_{3-x}$, $ASnI_xCl_{3-x}$, $ASnF_{3-x}I_x$, $ASnCl_xBr_{3-x}$, $ASnI_{3-x}Cl_x$ and $ASnF_{3-x}Cl_x$, $ACuI_3$, $ACuBr_3$, $ACuCl_3$, $ACuF_3$, $ACuBrI_2$, $ACuBr_xI_{3-x}$, $ACuBr_xCl_{3-x}$, $ACuF_{3-x}Br_x$, $ACuI_xBr_{3-x}$, $ACuI_xCl_{3-x}$, $ACuF_{3-x}I_x$, $ACuCl_xBr_{3-x}$, $ACuI_{3-x}Cl_x$, and $ACuF_{3-x}Cl_x$ where x is from 0 to 3, and wherein A is an organic cation as described herein or an ammonium cation. x may be from 0.05 to 2.96. For instance, x may be from 0.1 to 2.9, or from 0.5 to 2.5. In some cases, x is from 0.75 to 2.25, or from 1 to 2.

The crystalline A/M/X material may comprise, or consist essentially of, a perovskite compound selected from $CH_3NH_3PbI_3$, $CH_3NH_3PbBr_3$, $CH_3NH_3PbCl_3$, $CH_3NH_3PbF_3$, $CH_3NH_3PbBr_xI_{3-x}$, $CH_3NH_3PbBr_xCl_{3-x}$, $CH_3NH_3PbI_xBr_{3-x}$, $CH_3NH_3PbI_xCl_{3-x}$, $CH_3NH_3PbCl_xBr_{3-x}$, $CH_3NH_3PbI_{3-x}Cl_x$, $CH_3NH_3SnI_3$, $CH_3NH_3SnBr_3$, $CH_3NH_3SnCl_3$, $CH_3NH_3SnF_3$, $CH_3NH_3SnBrI_2$, $CH_3NH_3SnBr_xI_{3-x}$, $CH_3NH_3SnBr_xCl_{3-x}$, $CH_3NH_3SnF_{3-x}Br_x$, $CH_3NH_3SnI_xBr_{3-x}$, $CH_3NH_3SnI_xCl_{3-x}$, $CH_3NH_3SnF_{3-x}I_x$, $CH_3NH_3SnCl_xBr_{3-x}$, $CH_3NH_3SnI_{3-x}Cl_x$ and $CH_3NH_3SnF_{3-x}Cl_x$, $CH_3NH_3CuI_3$, $CH_3NH_3CuBr_3$, $CH_3NH_3CuCl_3$, $CH_3NH_3CuF_3$, $CH_3NH_3CuBrI_2$, $CH_3NH_3CuBr_xI_{3-x}$, $CH_3NH_3CuBr_xCl_{3-x}$, $CH_3NH_3CuF_{3-x}Br_x$, $CH_3NH_3CuI_xBr_{3-x}$, $CH_3NH_3CuI_xCl_{3-x}$, $CH_3NH_3CuF_{3-x}I_x$, $CH_3NH_3CuCl_xBr_{3-x}$, $CH_3NH_3CuI_{3-x}Cl_x$, and $CH_3NH_3CuF_{3-x}Cl_x$ where x is from 0 to 3. x may be from 0.05 to 2.95. For instance, x may be from 0.1 to 2.9, or from 0.5 to 2.5. In some cases, x is from 0.75 to 2.25, or from 1 to 2. For instance, if the first cation is $Pb^{2+}$, the second cation is $CH_3NH_3^+$ and the second anion is $I^-$, then the crystalline material may comprise or consist essentially of $CH_3NH_3PbI_3$.

The crystalline A/M/X material may comprise, or consist essentially of, a perovskite compound selected from $CH_3NH_3PbI_3$, $CH_3NH_3PbBr_3$, $CH_3NH_3PbCl_3$, $CH_3NH_3PbF_3$, $CH_3NH_3PbBrI_2$, $CH_3NH_3PbBrCl_2$, $CH_3NH_3PbIBr_2$, $CH_3NH_3PbICl_2$, $CH_3NH_3PbClBr_2$, $CH_3NH_3PbI_2Cl$, $CH_3NH_3SnI_3$, $CH_3NH_3SnBr_3$, $CH_3NH_3SnCl_3$, $CH_3NH_3SnF_3$, $CH_3NH_3SnBrI_2$, $CH_3NH_3SnBrCl_2$, $CH_3NH_3SnF_2Br$, $CH_3NH_3SnIBr_2$, $CH_3NH_3SnICl_2$, $CH_3NH_3SnF_2I$, $CH_3NH_3SnClBr_2$, $CH_3NH_3SnI_2Cl$ and $CH_3NH_3SnF_2Cl$.

The crystalline A/M/X material may comprise, or consist essentially of, a perovskite compound selected from $CH_3NH_3PbBr_xI_{3-x}$, $CH_3NH_3PbBr_xCl_{3-x}$, $CH_3NH_3PbI_xBr_{3-x}$, $CH_3NH_3PbI_xCl_{3-x}$, $CH_3NH_3PbCl_xBr_{3-x}$, $CH_3NH_3PbI_{3-x}Cl_x$, $CH_3NH_3SnBr_xI_{3-x}$, $CH_3NH_3SnBr_xCl_{3-x}$, $CH_3NH_3SnF_{3-x}Br_x$, $CH_3NH_3SnI_xBr_{3-x}$, $CH_3NH_3SnI_xCl_{3-x}$, $CH_3NH_3SnF_{3-x}I_x$, $CH_3NH_3SnCl_xBr_{3-x}$, $CH_3NH_3SnI_{3-x}Cl_x$ and $CH_3NH_3SnF_{3-x}Cl_x$, where X is from 0.05 to 2.95. For instance, x may be from 0.5 to 2.5, from 0.75 to 2.25, or from 1 to 2.

The perovskite compound may be selected from $CH_3NH_3PbBrI_2$, $CH_3NH_3PbBrCl_2$, $CH_3NH_3PbIBr_2$, $CH_3NH_3PbICl_2$, $CH_3NH_3SnF_2Br$, and $CH_3NH_3SnF_2I$. The perovskite may be $CH_3NH_3PbCl_2I$.

Preferably, the crystalline A/M/X material comprises, or consist essentially of, a perovskite compound selected from $CH_3NH_3PbI_3$, $CH_3NH_3PbBr_3$, $CH_3NH_3PbCl_3$, $CH_3NH_3SnI_3$, $CH_3NH_3SnBr_3$, $CH_3NH_3SnCl_3$, $CH_3NH_3CuI_3$, $CH_3NH_3CuBr_3$, $CH_3NH_3CuCl_3$, $NH_4CuI_3$, $NH_4CuBr_3$, $NH_4CuCl_3$, $NH_4CuI_2Br$, $NH_4CuI_2Cl$, $NH_4CuBr_2Cl$, $NH_4CuCl_2Br$, $CH_3NH_3CuI_2Br$, $CH_3NH_3CuI_2Cl$, $CH_3NH_3CuBr_2Cl$, and $CH_3NH_3CuCl_2Br$. More preferably, the crystalline material comprises, or consist essentially of, a perovskite compound selected from $CH_3NH_3PbI_3$, $CH_3NH_3SnI_3$, $NH_4CuCl_2Br$, $CH_3NH_3CuCl_3$, and $CH_3NH_3CuCl_2Br$.

The crystalline A/M/X material may comprise a formamidinium perovskite, for instance a compound selected from $APbI_3$, $APbBr_3$, $APbCl_3$, $APbF_3$, $APbBr_xI_{3-x}$, $APbBr_xCl_{3-x}$, $APbI_xBr_{3-x}$, $APbI_xCl_{3-x}$, $APbCl_xBr_{3-x}$, $APbI_{3-x}Cl_x$, $ASnI_3$, $ASnBr_3$, $ASnCl_3$, $ASnF_3$, $ASnBrI_2$, $ASnBr_xI_{3-x}$, $ASnBr_xCl_{3-x}$, $ASnF_{3-x}Br_x$, $ASnI_xBr_{3-x}$, $ASnI_xCl_{3-x}$, $ASnF_{3-x}I_x$, $ASnCl_xBr_{3-x}$, $ASnI_{3-x}Cl_x$ and $ASnF_{3-x}Cl_x$, $ACuI_3$, $ACuBr_3$, $ACuCl_3$, $ACuF_3$, $ACuBrI_2$, $ACuBr_xI_{3-x}$, $ACuBr_xCl_{3-x}$, $ACuF_{3-x}Br_x$, $ACuI_xBr_{3-x}$, $ACuI_xCl_{3-x}$, $ACuF_{3-x}I_x$, $ACuCl_xBr_{3-x}$, $ACuI_{3-x}Cl_x$, and $ACuF_{3-x}Cl_x$ where x is from 0 to 3, and wherein A is $(H_2N-C(H)=NH_2)^-$.

In one embodiment, the crystalline A/M/X material comprises a compound (layered perovskite) of formula (II):

$$[A]_2[M][X]_4 \qquad (II)$$

wherein: [A] is at least one monocation; [M] is at least one metal or metalloid dication; and [X] is at least one halide anion.

[A], in the compound of formula (II), which is typically at least one organic cation, may be as further defined herein for the perovskite of formula (I). [M] in the compound of formula (II), which is typically at least one metal or metalloid dication, may be as further defined herein for the perovskite of formula (I). [X] in the compound of formula (II), which is at least one halide anion, may be as further defined herein for the perovskite of formula (I).

The crystalline A/M/X material may for instance comprise a hexahalometallate of formula (III):

$$[A]_2[M][X]_6 \quad (III)$$

wherein: [A] is at least one monocation; [M] is at least one metal or metalloid tetracation; and [X] is at least one halide anion.

[A] is at least one monocation; [M] is at least one metal or metalloid tetracation; and X is at least one halide anion. In a mixed monocation hexahalometallate, [A] is at least two monocations; [M] is at least one metal or metalloid tetracation (and typically [M] is a single metal or metalloid tetracation); and [X] is at least one halide anion (and typically [X] is a single halide anion). In a mixed metal hexahalometallate, [A] is at least one monocation (and typically [A] is a single monocation); [M] is at least two metal or metalloid tetracations (for instance $Ge^{4+}$ and $Sn^{4+}$); and [X] is at least one halide anion (and typically [X] is a single halide anion). In a mixed halide hexahalometallate, [A] is at least one monocation (and typically [A] is a single monocation); [M] is at least one metal or metalloid tetracation (and typically [M] is a single metal tetra cation); and [X] is at least two halide anions, for instance $Br^-$ and $Cl^-$.

[A] may be at least one monocation selected from any suitable monocations, such as those described above for a perovskite. [A] is typically at least one monocation selected from $Li^+$, $Na^+$, $K^+$, $Rb^+$, $Cs^+$, $NH_4^+$ and monovalent organic cations. Monovalent organic cations are singly positively charged organic cations, which may, for instance, have a molecular weight of no greater than 500 g/mol. For instance, [A] may be a single cation selected from $Li^-$, $Na^+$, $K^+$, $Rb^+$, $Cs^+$, $NH_4^+$ and monovalent organic cations. [A] is preferably at least one monocation selected from $Rb^+$, $Cs^+$, $NH_4^+$ and monovalent organic cations. For instance, [A] may be a single monocation selected from $Rb^+$, $Cs^+$, $NH_4^+$ and monovalent organic cations. In one embodiment, [A] may be at least one inorganic monocation selected from $Li^+$, $Na^-$, $K^+$, $Rb^+$, $Cs^+$ and $NH_4^+$. For instance, [A] may be a single inorganic monocation selected from $Li^+$, $Na^+$, $K^+$, $Rb^+$, $Cs^+$ and $NH_4^+$. In another embodiment, [A] may be at least one monovalent organic cation. For instance, [A] may be a single monovalent organic cation. [A] may comprise one or more cations as described for the second cation.

Preferably, [A] is a single type of cation, i.e. the hexahalometallate is a compound of formula $A_2[M][X]_6$. [A] may be a single monocation selected from $K^+$, $Rb^+$, $Cs^+$, $NH_4^+$, $(CH_3NH_3)^+$, $(CH_3CH_2NH_3)^+$, $(CH_3CH_2CH_2NH_3)^+$, $(N(CH_3)_4)^+$, $(N(CH_2CH_3)_4)^-$, $(N(CH_2CH_2CH_3)_4)^+$, $(H_2N-C(H)=NH_2)^+$ and $(H_2N-C(CH_3)=NH_2)^+$. Preferably, [A] is a single monocation selected from $Cs^+$, $NH_4^+$, $(CH_3NH_3)^+$, $(CH_3CH_2NH_3)^+$, $(N(CH_3)_4)^+$, $(N(CH_2CH_3)_4)^+$, $(H_2N-C(H)=NH_2)^+$ and $(H_2N-C(CH_3)=NH_2)^-$. In one embodiment, [A] is $(CH_3NH_3)^+$. In another embodiment, [A] is $(H_2N-C(H)=NH_2)^-$.

[M] may comprise one or more suitable metal or metalloid tetracations. Metals include elements of groups 3 to 12 of the Periodic Table of the Elements and Ga, In, Tl, Sn, Pb, Bi and Po. Metalloids include Si, Ge, As, Sb, and Te. For instance, [M] may be at least one metal or metalloid tetracation selected from $Ti^{4+}$, $V^{4-}$, $Mn^{4+}$, $Fe^{4+}$, $Co^{4+}$, $Zr^{4+}$, $Nb^{4+}$, $Mo^{4+}$, $Ru^{4+}$, $Rh^{4+}$, $Pd^{4+}$, $Hf^{4+}$, $Ta^{4+}$, $W^{4+}$, $Re^{4+}$, $Os^{4+}$, $Ir^{4+}$, $Pt^{4+}$, $Sn^{4+}$, $Pb^{4+}$, $Po^{4+}$, $Si^{4+}$, $Ge^{4+}$, and $Te^{4+}$. Typically, [M] is at least one metal or metalloid tetracation selected from $Pd^{4+}$, $W^{4+}$, $Re^{4-}$, $Os^{4+}$, $Ir^{4+}$, $Pt^{4+}$, $Sn^{4+}$, $Pb^{4+}$, $Ge^{4+}$, and $Te^{4+}$. For instance, [M] may be a single metal or metalloid tetracation selected from $Pd^{4+}$, $W^{4+}$, $Re^{4+}$, $Os^{4+}$, $Ir^{4+}$, $Pt^{4+}$, $Sn^{4+}$, $Pb^{4+}$, $Ge^{4+}$, and $Te^{4+}$.

Typically, [M] is at least one metal or metalloid tetracation selected from $Sn^{4+}$, $Te^{4+}$, $Ge^{4+}$ and $Re^{4-}$. In one embodiment [M] is at least one metal or metalloid tetracation selected from $Pb^{4+}$, $Sn^{4+}$, $Te^{4+}$, $Ge^{4+}$ and $Re^{4+}$. For instance, [M] may be at least one metal or metalloid tetracation selected from $Pb^{4+}$, $Sn^{4+}$, $Te^{4+}$ and $Ge^{4+}$. Preferably, [M] is at least one metal or metalloid tetracation selected from $Sn^{4+}$, $Te^{4+}$, and $Ge^{4+}$. As discussed above, the hexahalometallate compound may be a mixed-metal or a single-metal hexahalometallate. Preferably, the hexahalometallate compound is a single-metal hexahalometallate compound. More preferably, [M] is a single metal or metalloid tetracation selected from $Sn^{4+}$, $Te^{4+}$, and $Ge^{4+}$. For instance, [M] may be a single metal or metalloid tetracation which is $Te^{4+}$. For instance, [M] may be a single metal or metalloid tetracation which is $Ge^{4+}$. Most preferably, [M] is a single metal or metalloid tetracation which is $Sn^{4+}$.

[X] may be at least one halide anion. [X] is therefore at least one halide anion selected from $F^-$, $Cl^-$, $Br^-$ and $I^-$. Typically, [X] is at least one halide anion selected from $Cl^-$, $Br^-$ and $I^-$. The hexahalometallate compound may be a mixed-halide hexahalometallate or a single-halide hexahalometallate. If the hexahalometallate is mixed, [X] is two, three or four halide anions selected from $F^-$, $Cl^-$, $Br^-$ and $I^-$. Typically, in a mixed-halide compound, [X] is two halide anions selected from $F^-$, $Cl^-$, $Br^-$ and $I^-$.

Typically, [A] is a single monocation and [M] is a single metal or metalloid tetracation. Thus, the crystalline material may, for instance, comprise a hexahalometallate compound of formula (IIIA)

$$A_2M[X]_6 \quad (IIIA)$$

wherein: A is a monocation; M is a metal or metalloid tetracation; and [X] is at least one halide anion. [X] may be one, two or three halide anions selected from $F^-$, $Cl^-$, $Br^-$ and $I^-$, and preferably selected from $Cl^-$, $Br^-$ and $I^-$. In formula (IIIA), [X] is preferably one or two halide anions selected from $Cl^-$, $Br^-$ and $I^-$.

The crystalline material may, for instance, comprise, or consist essentially of, a hexahalometallate compound of formula (IIIB)

$$A_2MX_{6-y}X'_y \quad (IIIB)$$

wherein: A is a monocation (i.e. the second cation); M is a metal or metalloid tetracation (i.e. the first cation); X and X' are each independently a (different) halide anion (i.e. two second anions); and y is from 0 to 6. When y is 0 or 6, the hexahalometallate compound is a single-halide compound. When y is from 0.01 to 5.99 the compound is a mixed-halide hexahalometallate compound. When the compound is a mixed-halide compound, y may be from 0.05 to 5.95. For instance, y may be from 1.00 to 5.00.

The hexahalometallate compound may, for instance, be $A_2SnF_{6-y}Cl_y$, $A_2SnF_{6-y}Br_y$, $A_2SnF_{6-y}I_y$, $A_2SnCl_{6-y}Br_y$, $A_2SnCl_{6-y}I_y$, $A_2SnBr_{6-y}I_y$, $A_2TeF_{6-y}Cl_y$, $A_2TeF_{6-y}Br_y$, $A_2TeF_{6-y}I_y$, $A_2TeCl_{6-y}Br_y$, $A_2TeCl_{6-y}I_y$, $A_2TeBr_{6-y}I_y$, $A_2GeF_{6-y}Cl_y$, $A_2GeF_{6-y}Br_y$, $A_2GeF_{6-y}I_y$, $A_2GeCl_{6-y}Br_y$, $A_2GeCl_{6-y}I_y$, $A_2GeBr_{6-y}I_y$, $A_2ReF_{6-y}Cl_y$, $A_2ReF_{6-y}Br_y$, $A_2ReF_{6-y}I_y$, $A_2ReCl_{6-y}Br_y$, $A_2ReCl_{6-y}I_y$ or $A_2ReBr_{6-y}I_y$, wherein: A is $K^+$, $Rb^+$, $Cs^+$, $(R^1NH_3)^+$, $(NR^2_4)^+$, or $(H_2N-C(R^1)=NH_2)^+$, wherein $R^1$ is H, a substituted or unsubstituted $C_{1-20}$ alkyl group or a substituted or unsubstituted aryl group, and $R^2$ is a substituted or unsubstituted $C_{1-10}$ alkyl group; and y is from 0 to 6. Optionally, y is from 0.01 to 5.99. If the hexahalometallate compound is a mixed-halide compound, y is typically from 1.00 to 5.00. A may be as defined above. For instance, A may be $Cs^+$, $NH_4^+$, $(CH_3NH_3)^+$, $(CH_3CH_2NH_3)^+$, $(N(CH_3)_4)^+$, $(N(CH_2CH_3)_4)^+$, $(H_2N-C(H)=NH_2)^-$ or $(H_2N-C(CH_3)=NH_2)^+$, for instance $Cs^+$, $NH_4^+$, or $(CH_3NH_3)^+$.

The hexahalometallate compound may typically be $A_2SnF_{6-y}Cl_y$, $A_2SnF_{6-y}Br_y$, $A_2SnF_{6-y}I_y$, $A_2SnCl_{6-y}Br_y$, $A_2SnCl_{6-y}I_y$, or $A_2SnBr_{6-y}I_y$, wherein: A is $K^+$, $Rb^+$, $Cs^+$, $(R^1NH_3)^+$, $(NR^2_4)^-$, or $(H_2N-C(R^1)=NH_2)^+$, or A is as defined herein, wherein $R^1$ is H, a substituted or unsubstituted $C_{1-20}$ alkyl group or a substituted or unsubstituted aryl group, or $R^1$ is as defined herein, and $R^2$ is a substituted or unsubstituted $C_{1-10}$ alkyl group, or $R^2$ is as defined herein; and y is from 0 to 6 or y is as defined herein.

In another embodiment, the hexahalometallate compound is $A_2GeF_{6-y}Cl_y$, $A_2GeF_{6-y}Br_y$, $A_2GeF_{6-y}I_y$, $A_2GeCl_{6-y}Br_y$, $A_2GeCl_{6-y}I_y$, or $A_2GeBr_{6-y}I_y$, wherein: A is $K^+$, $Rb^+$, $Cs^+$, $(R^1NH_3)^+$, $(NR^2_4)^+$, or $(H_2N-C(R^1)=NH_2)^+$, or A is as defined herein, wherein $R^1$ is H, a substituted or unsubstituted $C_{1-20}$ alkyl group or a substituted or unsubstituted aryl group, or $R^1$ is as defined herein, and $R^2$ is a substituted or unsubstituted $C_{1-10}$ alkyl group, or $R^2$ is as defined herein; and y is from 0 to 6 or y is as defined herein.

The hexahalometallate compound may, for instance, be $A_2TeF_{6-y}Cl_y$, $A_2TeF_{6-y}Br_y$, $A_2TeF_{6-y}I_y$, $A_2TeCl_{6-y}Br_y$, $A_2TeCl_{6-y}I_y$, or $A_2TeBr_{6-y}I_y$, wherein: A is $K^+$, $Rb^+$, $Cs^+$, $(R^1NH_3)^+$, $(NR^2_4)^-$, or $(H_2N-C(R^1)=NH_2)^+$, or A is as defined herein, wherein $R^1$ is H, a substituted or unsubstituted $C_{1-20}$ alkyl group or a substituted or unsubstituted aryl group, or $R^1$ is as defined herein, and $R^2$ is a substituted or unsubstituted $C_{1-10}$ alkyl group, or $R^2$ is as defined herein; and y is from 0 to 6 or y is as defined herein.

Often, y will be from 1.50 to 2.50. For instance, y may be from 1.80 to 2.20. This may occur if the compound is produced using two equivalents of AX' and one equivalent of $MX_4$, as discussed below.

In some embodiments, all of the ions are single anions. Thus, the crystalline material may comprise, or consist essentially of, a hexahalometallate compound of formula (IIIC)

$$A_2MX_6 \qquad \text{(IIIC)}$$

wherein: A is a monocation; M is a metal or metalloid tetracation; and X is a halide anion. A, M and X may be as defined herein.

The hexahalometallate compound may be $A_2SnF_6$, $A_2SnCl_6$, $A_2SnBr_6$, $A_2SnI_6$, $A_2TeF_6$, $A_2TeCl_6$, $A_2TeBr_6$, $A_2TeI_6$, $A_2GeF_6$, $A_2GeCl_6$, $A_2GeBr_6$, $A_2GeI_6$, $A_2ReF_6$, $A_2ReCl_6$, $A_2ReBr_6$ or $A_2ReI_6$, wherein: A is $K^+$, $Rb^+$, $Cs^+$, $(R^1NH_3)^+$, $(NR^2_4)^-$, or $(H_2N-C(R^1)=NH_2)^+$, wherein $R^1$ is H, a substituted or unsubstituted $C_{1-20}$ alkyl group or a substituted or unsubstituted aryl group, and $R^2$ is a substituted or unsubstituted $C_{1-10}$ alkyl group. A may be as defined herein.

Preferably, the hexahalometallate compound is $Cs_2SnI_6$, $Cs_2SnBr_6$, $Cs_2SnBr_{6-y}I_y$, $Cs_2SnCl_{6-y}I_y$, $Cs_2SnCl_{6-y}Br_y$, $(CH_3NH_3)_2SnI_6$, $(CH_3NH_3)_2SnBr_6$, $(CH_3NH_3)_2SnBr_{6-y}I_y$, $(CH_3NH_3)_2SnCl_{6-y}I_y$, $(CH_3NH_3)_2SnCl_{6-y}Br_y$, $(H_2N-C(H)=NH_2)_2SnI_6$, $(H_2N-C(H)=NH_2)_2SnBr_6$, $(H_2N-C(H)=NH_2)_2SnBr_{6-y}I_y$, $(H_2N-C(H)=NH_2)_2SnCl_{6-y}I_y$ or $(H_2N-C(H)=NH_2)_2SnCl_{6-y}Br_y$ wherein y is from 0.01 to 5.99. y may be as defined herein. For example, the hexahalometallate compound may be $(CH_3NH_3)_2SnI_6$, $(CH_3NH_3)_2SnBr_6$, $(CH_3NH_3)_2SnCl_6$, $(H_2N-C(H)=NH_2)_2SnI_6$, $(H_2N-C(H)=NH_2)_2SnBr_6$ or $(H_2N-C(H)=NH_2)_2SnCl_6$.

The hexahalometallate compound may be $Cs_2SnI_6$, $Cs_2SnBr_6$, $Cs_2SnCl_{6-y}Br_y$, $(CH_3NH_3)_2SnI_6$, $(CH_3NH_3)_2SnBr_6$, or $(H_2N-C(H)=NH_2)_2SnI_6$.

The crystalline A/M/X material may comprise a bismuth or antimony halogenometallate. For instance, the crystalline A/M/X material may comprise a halogenometallate compound comprising: (i) one or more monocations ([A]) or one or more dications ([B]); (ii) one or more metal or metalloid trications ([M]); and (iii) one or more halide anions ([X]). The compound may be a compound of formula $BBiX_5$, $B_2BiX_7$ or $B_3BiX_9$ where B is $(H_3NCH_2NH_3)^{2-}$, $(H_3N(CH_2)_2NH_3)^{2+}$, $(H_3N(CH_2)_3NH_3)^{2+}$, $(H_3N(CH_2)_4NH_3)^{2+}$, $(H_3N(CH_2)_5NH_3)^{2+}$, $(H_3N(CH_2)_6NH_3)^{2+}$, $(H_3N(CH_2)_7NH_3)^{2-}$, $(H_3N(CH_2)_8NH_3)^{2+}$ or $(H_3N-C_6H_4-NH_3)^{2+}$ and X is $I^-$, $Br^-$ or $Cl^-$, preferably $I^-$.

The crystalline A/M/X material typically comprises a perovskite compound of formula $CH_3NH_3PbI_3$, $CH_3NH_3PbBr_3$, $CH_3NH_3PbCl_3$, $CH_3NH_3PbF_3$, $CH_3NH_3PbBr_xI_{3-x}$, $CH_3NH_3PbBr_xCl_{3-x}$, $CH_3NH_3PbI_xBr_{3-x}$, $CH_3NH_3PbI_xCl_{3-x}$, $CH_3NH_3PbCl_xBr_{3-x}$, $CH_3NH_3PbI_{3-x}Cl_x$, $CH_3NH_3SnI_3$, $CH_3NH_3SnBr_3$, $CH_3NH_3SnCl_3$, $CH_3NH_3SnF_3$, $CH_3NH_3SnBrI_2$, $CH_3NH_3SnBr_xI_{3-x}$, $CH_3NH_3SnBr_xCl_{3-x}$, $CH_3NH_3SnF_{3-x}Br_x$, $CH_3NH_3SnI_xBr_{3-x}$, $CH_3NH_3SnI_xCl_{3-x}$, $CH_3NH_3SnF_{3-x}I_x$, $CH_3NH_3SnCl_xBr_{3-x}$, $CH_3NH_3SnI_{3-x}Cl_x$ and $CH_3NH_3SnF_{3-x}Cl_x$, $CH_3NH_3CuI_3$, $CH_3NH_3CuBr_3$, $CH_3NH_3CuCl_3$, $CH_3NH_3CuF_3$, $CH_3NH_3CuBrI_2$, $CH_3NH_3CuBr_xI_{3-x}$, $CH_3NH_3CuBr_xCl_{3-x}$, $CH_3NH_3CuF_{3-x}Br_x$, $CH_3NH_3CuI_xBr_{3-x}$, $CH_3NH_3CuI_xCl_{3-x}$, $CH_3NH_3CuF_{3-x}I_x$, $CH_3NH_3CuCl_xBr_{3-x}$, $CH_3NH_3CuI_{3-x}Cl_x$, or $CH_3NH_3CuF_{3-x}Cl_x$ where x is from 0 to 3. Preferably, the perovskite compound is $CH_3NH_3PbI_3$. The layer of the crystalline A/M/X material may for instance comprise greater than 95 wt % of one or more of these perovskites.

Process Conditions

Typically, the molar ratio (first precursor compound):(second precursor compound) is from 1:2 to 2:1. For instance, the molar ratio (first precursor compound):(second precursor compound) may be from 1:1.5 to 1.5:1, or from 1.1:1 to 1.3:1.

The final concentration of the precursor compounds in the precursor composition comprising the precursor compounds and solvent is typically from 10 to 60 wt %. The concentration may be from 20 to 50 wt % or from 15 to 35 wt %, for instance about 30 wt %. Percentages are relative to the total weight of the precursor composition.

Typically, the precursor composition is disposed on the substrate by solution phase deposition, for instance graveur coating, slot dye coating, screen printing, ink jet printing, doctor blade coating, spray coating or spin-coating. Typically the precursor composition is disposed on the substrate by spin-coating the precursor composition on the substrate.

The layer of the crystalline material produced by the process of the invention may be smooth. For instance, the layer of the crystalline material may have a root mean square surface roughness of less than or equal to 50 nm in the range 15 μm×15 μm. Often, the root mean square surface roughness may be less than or equal to 25 nm, or less than equal to 15 nm, in the range 15 μm×15 μm. The surface roughness may be measured by atomic force microscopy.

Usually, the layer of the crystalline A/M/X material has a thickness of from 5 to 3000 nm. Typically, the layer has a thickness of from 20 to 1000 nm, for instance from 100 to 1000 nm or from 300 to 1000 nm. Preferably, the layer has a thickness of greater than or equal to 100 nm, for instance from 100 to 3000 nm or from 100 to 700 nm.

Typically, the process further comprises removing the solvent to form the layer comprising the perovskite compound. Removing the solvent may comprise heating the solvent, or allowing the solvent to evaporate.

Often, it is desirable to anneal the layer of the crystalline A/M/X material. Typically, the process further comprises heating the substrate with the precursor composition disposed thereon. Preferably, the substrate is heated to a temperature of from 50° C. to 400° C., for instance from 50° C. to 200° C. More preferably, the substrate is heated to a temperature of from 50° C. to 200° C. for a time of from 5 to 100 minutes.

In one embodiment, the process comprises disposing on a substrate a precursor composition comprising: (a) $PbI_2$; (b) a solvent which comprises acetonitrile and methylamine; and (c) $(CH_3NH_3)I$.

The substrate typically comprises a layer of a first electrode material. The first electrode material may comprise a metal (for instance silver, gold, aluminium or tungsten) or a transparent conducting oxide (for instance fluorine doped tin oxide (FTO) or indium doped tin oxide (ITO)). Typically, the first electrode comprise a transparent conducting oxide.

The substrate may, for instance, comprise a layer of a first electrode material and a layer of an n-type semiconductor. Often, the substrate comprises a layer of a transparent conducting oxide, for instance FTO, and a compact layer of an n-type semiconductor, for instance $TiO_2$.

In some embodiments, the substrate comprises a layer of a porous scaffold material.

The layer of a porous scaffold is usually in contact with a layer of an n-type or p-type semiconductor material, for instance a compact layer of an n-type semiconductor or a compact layer of a p-type semiconductor. The scaffold material is typically mesoporous or macroporous. The scaffold material may aid charge transport from the crystalline material to an adjacent region. The scaffold material may also aid formation of the layer of the crystalline material during deposition. The porous scaffold material is typically infiltrated by the crystalline material after deposition.

Typically, the porous scaffold material comprises a dielectric material or a charge-transporting material. The scaffold material may be a dielectric scaffold material. The scaffold material may be a charge-transporting scaffold material. The porous scaffold material may be an electron-transporting material or a hole-transporting scaffold material. n-type semiconductors are examples of electron-transporting materials. p-type semiconductors are examples of hole-transporting scaffold materials. Preferably, the porous scaffold material is a dielectric scaffold material or a electron-transporting scaffold material (e.g. an n-type scaffold material).

The porous scaffold material may be a charge-transporting scaffold material (e.g. an electron-transporting material such as titania, or alternatively a hole transporting material) or a dielectric material, such as alumina. The term "dielectric material", as used herein, refers to material which is an electrical insulator or a very poor conductor of electric current. The term dielectric therefore excludes semiconducting materials such as titania. The term dielectric, as used herein, typically refers to materials having a band gap of equal to or greater than 4.0 eV. (The band gap of titania is about 3.2 eV.) The skilled person of course is readily able to measure the band gap of a material by using well-known procedures which do not require undue experimentation. For instance, the band gap of a material can be estimated by constructing a photovoltaic diode or solar cell from the material and determining the photovoltaic action spectrum. The monochromatic photon energy at which the photocurrent starts to be generated by the diode can be taken as the band gap of the material; such a method was used by Barkhouse et al., Prog. Photovolt: Res. Appl. 2012; 20:6-11. References herein to the band gap of a material mean the band gap as measured by this method, i.e. the band gap as determined by recording the photovoltaic action spectrum of a photovoltaic diode or solar cell constructed from the material and observing the monochromatic photon energy at which significant photocurrent starts to be generated.

The thickness of the layer of the porous scaffold is typically from 5 nm to 400 nm. For instance, the thickness of the layer of the porous scaffold may be from 10 nm to 50 nm.

The substrate may, for instance, comprise a layer of a first electrode material, a layer of an n-type semiconductor, and a layer of a dielectric scaffold material. The substrate may therefore comprise a layer of a transparent conducting oxide, a compact layer of $TiO_2$ and a porous layer of $Al_2O_3$.

Often, the substrate comprises a layer of a first electrode material and a layer of an n-type semiconductor or a layer of a p-type semiconductor. Optionally, the n-type semiconductor or the p-type semiconductor is soluble in dimethylformamide.

Typically, the substrate comprises a layer of a first electrode material and optionally one or more additional layers that are each selected from: a layer of an n-type semiconductor, a layer of a p-type semiconductor, and a layer of insulating material. Typically, a surface of the substrate on which the precursor composition is disposed comprises one or more of a first electrode material, a layer of an n-type semiconductor, a layer of a p-type semiconductor, and a layer of insulating material. A surface of the substrate on which the precursor composition is disposed may comprise a layer of material that is soluble in dimethylformamide.

For instance, the n-type semiconductor or the p-type semiconductor may comprise C60 or carbon nanotubes. The p-type semiconductor may comprise an inorganic or an organic p-type semiconductor. Typically, the p-type semiconductor comprises an organic p-type semiconductor. Suitable p-type semiconductors may be selected from polymeric or molecular hole transporters. The p-type semiconductor may comprise spiro-OMeTAD (2,2',7,7'-tetrakis-(N,N-di-p-methoxyphenylamine)9,9'-spirobifluorene)), P3HT (poly(3-hexylthiophene)), PCPDTBT (Poly[2,1,3-benzothiadiazole-4,7-diyl[4,4-bis(2-ethylhexyl)-4H-cyclopenta[2,1-b:3,4-b'] dithiophene-2,6-diyl]]) or PVK (poly(N-vinylcarbazole)). The p-type semiconductor may comprise carbon nanotubes. Usually, the p-type semiconductor is selected from spiro-OMeTAD, P3HT, PCPDTBT and PVK. Preferably, the p-type semiconductor is spiro-OMeTAD.

The process may be used in a process for producing a multi-junction cell, and as such the substrate may comprise a layer of a photoactive material, for instance a layer of an A/M/X material.

In some cases, the solvent further comprises dimethylsulfoxide (DMSO). The solvent solvent may for instance comprise DMSO in an amount of from 1.0 to 2.0 equivalents of the amount of the first cation M in the first precursor compound.

The invention also provides a layer comprising a crystalline A/M/X material obtainable (or obtained) from a process as defined herein for producing a layer comprising a crystalline A/M/X material.

The layer may comprise (i) the crystalline A/M/X material and (ii) an alkylamine, optionally wherein the amount of alkylamine is from 0.001 to 1.0 wt % based on the weight of the layer. The layer may comprise (i) the crystalline A/M/X material and (ii) methylamine, propylamine or butylamine in an amount of from 0.001 to 1.0 wt % (for instance from 0.1 to 1.0 wt %).

Process for Producing a Device

The invention also provides a process for producing a semiconductor device comprising a layer of a crystalline A/M/X material, which process comprises producing said layer of a crystalline A/M/X material by a process as defined herein.

The process typically further comprises disposing on the layer of a crystalline material a layer of a p-type semiconductor or a layer of a n-type semiconductor. Often, the process typically comprises disposing on the layer of a crystalline material a layer of a p-type semiconductor. The n-type or p-type semiconductor may be as defined herein. For instance, the p-type semiconductor may be an organic p-type semiconductor. Suitable p-type semiconductors may be selected from polymeric or molecular hole transporters. Preferably, the p-type semiconductor is spiro-OMeTAD. The layer of a p-type semiconductor or a layer of a n-type semiconductor is typically disposed on the layer of the crystalline material by solution-processing, for instance by disposing a composition comprising a solvent and the n-type or p-type semiconductor. The solvent may be selected from polar solvents, for instance chlorobenzene or acetonitrile. The thickness of the layer of the p-type semiconductor or the layer of the n-type semiconductor is typically from 50 nm to 500 nm.

The process typically further comprises disposing on the layer of the p-type semiconductor or n-type semiconductor a layer of a second electrode material. The second electrode material may be as defined above for the first electrode material. Typically, the second electrode material comprises, or consists essentially of, a metal. Examples of metals which the second electrode material may comprise, or consist essentially of, include silver, gold, copper, aluminium, platinum, palladium, or tungsten. The second electrode may be disposed by vacuum evaporation. The thickness of the layer of a second electrode material is typically from 5 nm to 100 nm.

Typically, the semiconductor device is an optoelectronic device, a photovoltaic device, a solar cell, a photo detector, a photodiode, a photosensor, a chromogenic device, a transistor, a light-sensitive transistor, a phototransistor, a solid state triode, a battery, a battery electrode, a capacitor, a super-capacitor, a light-emitting device, a light-emitting diode or a laser.

The semiconductor device is typically an optoelectronic device. Examples of optoelectronic devices include photovoltaic devices, photodiodes (including solar cells), phototransistors, photomultipliers, photoresistors, and light emitting devices. Preferably, the semiconductor device is a photovoltaic device.

The invention also provides a semiconductor device obtainable by a process for producing a semiconductor device according to the invention.

A photovoltaic device according to the invention may comprise the following layers in the following order:
I. a layer of a first electrode material as defined herein;
II. a layer of an n-type semiconductor as defined herein
III. optionally a layer of a porous scaffold material as defined herein;
IV. a layer of a crystalline material as defined herein;
V. a layer of an p-type semiconductor as defined herein; and
VI. a layer of a second electrode material as defined herein.

A photovoltaic device according to the invention may comprise the following layers in the following order:
I. a layer of a transparent conducting oxide, preferably FTO;
II. a compact layer of an n-type semiconductor as defined herein, preferably $TiO_2$;
III. optionally a layer of a porous scaffold material as defined herein, preferably $Al_2O_3$ or $TiO_2$;
IV. a layer of a crystalline material as defined herein;
V. a layer of an p-type semiconductor as defined herein, preferably spiro-OMeTAD; and
VI. a layer of a second electrode material comprising gold or silver.

The layer of the first electrode material may have a thickness of from 50 nm to 700 nm, for instance of from 100 nm to 700 nm, or from 100 nm to 400 nm. The layer of the second electrode material may have a thickness of from 10 nm to 500 nm, for instance from 50 nm to 200 nm or from 10 nm to 50 nm. The layer of an n-type semiconductor may have a thickness of from 1 nm to 500 nm, for instance 50 to 500 nm. The layer of an p-type semiconductor may have a thickness of from 1 nm to 500 nm.

A multiple junction photovoltaic device according to the invention may comprise the following layers in the following order:
I. a layer of a first electrode material as defined herein;
II. a layer of an n-type semiconductor as defined herein
III. optionally a layer of a porous scaffold material as defined herein;
IV. a layer of a first crystalline A/M/X material as defined herein;
V. a layer of an p-type semiconductor as defined herein;
VI. optionally a layer of a transparent conducting oxide as defined herein;
VII. optionally a layer of a conducting organic semiconductor as defined herein;
VIII. a layer of an n-type semiconductor as defined herein
IX. optionally a layer of a porous scaffold material as defined herein;
X. a layer of a second crystalline material as defined herein;
XI. a layer of an p-type semiconductor as defined herein; and
XII. a layer of a second electrode material as defined herein The first and second crystalline material with have band gaps of different energy, whereby the first crystalline material will absorb higher energy photons (visible light) and the second crystalline material will absorb lower energy photons (infra-red light). In the above example a two junction, or tandem solar cell is described. This could be extended further to three or more junctions incorporating 3 or more crystalline materials of different band gaps.

Compositions

The invention also provides liquid compositions (e.g. inks) and solid compositions useful in the processes of the invention. In particular, the invention provides a composition comprising:

(i) a compound of formula $MX_n$, wherein: M is $Ca^{2+}$, $Sr^{2+}$, $Cd^{2+}$, $Cu^{2+}$, $Ni^{2+}$, $Mn^{2+}$, $Fe^{2+}$, $Co^{2+}$, $Pd^{2+}$, $Ge^{2+}$, $Sn^{2+}$, $Pb^{2+}$, $Yb^{2+}$, $Eu^{2+}$, $Bi^{3+}$, $Sb^{3+}$, $Pd^{4+}$, $W^{4-}$, $Re^{4+}$, $Os^{4+}$, $Ir^{4+}$, $Pt^{4+}$, $Sn^{4+}$, $Pb^{4+}$, $Ge^{4+}$ or $Te^{4+}$, preferably $Cu^{2-}$, $Pb^{2-}$, $Ge^{2+}$ or $Sn^{2+}$; X is $I^-$, $Br^-$, $Cl^-$ or $F^-$; and n is 2, 3 or 4;

(ii) a compound of formula AX, wherein A is $(R^1NH_3)^+$, $(NR^2{}_4)^+$ and $(H_2N-C(R^1)=NH_2)^+$, wherein $R^1$ is H or an unsubstituted $C_{1-6}$ alkyl group and each $R^2$ is an unsubstituted $C_{1-6}$ alkyl group, and X is $I^-$, $Br^-$, $Cl^-$ or $F^-$;

(iii) acetonitrile, propionitrile, acetone or a mixture thereof; and (iv) an alkylamine of formula $R^4NH_2$, wherein $R^4$ is a $C_{1-8}$ alkyl group.

Typically, the composition comprises (i) a compound of formula $MX_2$, wherein: M is $Cd^{2+}$, $Cu^{2+}$, $Ni^{2+}$, $Mn^{2+}$, $Fe^{2+}$, $Co^{2+}$, $Pd^{2+}$, $Ge^{2+}$, $Sn^{2+}$ or $Pb^{2+}$; and X is $I^-$, $Br^-$ or $Cl^-$;

(ii) a compound of formula AX, wherein A is $Cs^+$, $(CH_3NH_3)^-$, $(CH_3CH_2NH_3)^+$, $(CH_3CH_2CH_2NH_3)^+$, $(N(CH_3)_4)^+$, $(H_2N-C(H)=NH_2)^+$ or $(H_2N-C(CH_3)=NH_2)^+$; and X is $I^-$, $Br^-$ or $Cl^-$;

(iii) acetonitrile; and (iv) an alkylamine of formula $R^4NH_2$, wherein $R^4$ is an unsubstituted $C_{1-6}$ alkyl group.

Preferably, the composition comprises: (i) $PbI_2$, $PbBr_2$ or $PbCl_2$, more preferably $PbI_2$; (ii) $(CH_3NH_3)I$, $(CH_3NH_3)Br$ or $(CH_3NH_3)Cl$, more preferably $(CH_3NH_3)I$; (iii) acetonitrile; and (iv) methylamine.

The concentrations or quantities of the any of the components of the composition may be as defined herein. For instance, the molar ratio $(MX_n):(AX)$ may be from 1:2 to 2:1 and the molar ratio of (alkylamine):$(MX_n)$ may be from $1 \times 10^{-7}$:1 to 0.5:1, optionally from $1 \times 10^{-7}$:1 to 0.1:1.

Use

The invention also provides the use of a solvent, which solvent comprises (i) acetonitrile, propionitrile, acetone or a mixture thereof and (ii) an alkylamine, to improve layer formation in a process for producing a layer of a crystalline A/M/X material. The invention also provides the use of a solvent, which solvent comprises (i) acetonitrile, propionitrile, acetone or a mixture thereof and (ii) an alkylamine, to improve layer formation by reducing the presence of defects in the layer in a process for producing a layer of a crystalline A/M/X material. The process for producing a layer of a crystalline A/M/X material is typically as further defined herein.

The invention will be described in more detail by the following Examples.

EXAMPLES

Experimental Procedure:
Precursor Solution:

$PbI_2$ (99% purity, Sigma Aldrich) and MAI (Dyesol) were combined in a vial in a 1:1 molar ratio. Acetonitrile (ACN, Sigma Aldrich) was added to the vial such the resultant molarity was 0.5 M. The dispersion was then placed on a shaker for 5 minutes until a black powder was formed. A 40 wt % solution of methylamine in $H_2O$ (Sigma Aldrich) was placed in a bubbler which was connected to a drying tube. The methylamine solution was kept in an ice bath while nitrogen was flowed through the system. The bubbling system was then connected through the syringe to the ACN dispersion, and methylamine was bubbled through the black dispersion until a clear, pale yellow solution was obtained.

For liquid alkylamines such as proplyamine, butylamine and pentylamine (amylamine), the amine was added directly to the ACN dispersion in a 1:1 v/v ratio, such that the molarity of the final solution was 0.5 M.

Film Fabrication:

All films were spin-coated at 2000 rpm for 1 minute, and heated at 100° C. for 60 mins unless otherwise stated.

Device Fabrication:

Concisely, FTO-coated glass sheets (7 Ωcm-1 Pilkington) were etched with zinc powder and HCl (3M) to obtain the required electrode pattern. The sheets were then washed with soap (2% Hellmanex in water), deionized water, acetone, and methanol, and finally treated under oxygen plasma for 10 min to remove the last traces of organic residues. A 100 nm thick compact layer of $TiO_2$ was then deposited on the glass using titanium isopropoxide diluted in anhydrous ethanol and sintered for 45 mins at 500° C. For the fabrication of the C60 electron selective layer, a solution of concentration 10 mg/ml in chlorobenzene was left stirring for 3 hours until completely dissolved. This solution was then spin-coated onto cleaned FTO substrates (as above) at a speed of 3500 rpm. The substrates was then heated at 70° C. for 15 minutes, then allowed to cool to room temperature before proceeding with the deposition of the perovskite film. The 0.5 M solution in ACN/alkylamine was then spin-coated onto the substrate at a speed of 2000 rpm for 60 seconds. The films were then placed in an oven at 100° C. for 45 minutes, followed by degassing for 15 minutes in a vacuum chamber. The hole transport material (HTM) spiro-OMeTAD was then dissolved in chlorobenzene with additives at a concentration of 30 mM lithium bis(trifluoromethanesulfonyl)imide (Li-TFSI) and 80 mM tert-butylpyridine (tBP). Finally, 110 nm thick silver electrodes were evaporated onto the devices through a shadow mask, using a thermal evaporator.

Solar Cell Characterization:

Solar cell performance was measured using a class AAB ABET sun 2000 solar simulator that was calibrated to give simulated AM1.5 sunlight at an irradiance of 100 mW/cm2. The mismatch factor was estimated to be approximately 1.02 and applied when setting the intensity of the solar simulator. The irradiance was calibrated using an NREL-calibrated KG5-filtered silicon reference cell. Current/voltage curves were recorded using a sourcemeter (Keithley 2400, USA). All solar cells were masked with a metal aperture that was used to define the active area of the devices, which in this case was 0.0919 cm². All devices were stored in a desiccator in the dark for 12 h prior to testing Example 1—ACN/Methylamine Upon spin-coating the ACN/methylamine solutions described above, an immediate difference to films which are spun from DMF was observed. This was that the perovskite forms on the spin-coater. This has not previously been observed for the deposition of the $MAPbI_3$ (methylammonium lead triiodide) perovskite unless solvent-quenching is employed. Upon taking the film off the spin-coater, it was observed to be a dense, continuous and specular film. Thus, the $MAPbI_3$ film spun from a 0.5M solution of $MAPbI_3$ dissolved in the ACN/MA solvent mixture was visually very smooth and specular, and was clear of defects. A scanning electron micrograph (SEM) image of a section of the film is shown in FIG. 1. Surprisingly, upon investigation of the high magnification SEM image, the presence of large crystals of up to 3 microns in size was observed. This gives this method of making films a distinct advantage over other ways of inducing rapid crystallization such as solvent quenching, or utilizing a lead acetate precursor, as both these methods result in significantly smaller crystallites, in the range of 400 to 700 nm.

Figure 2:
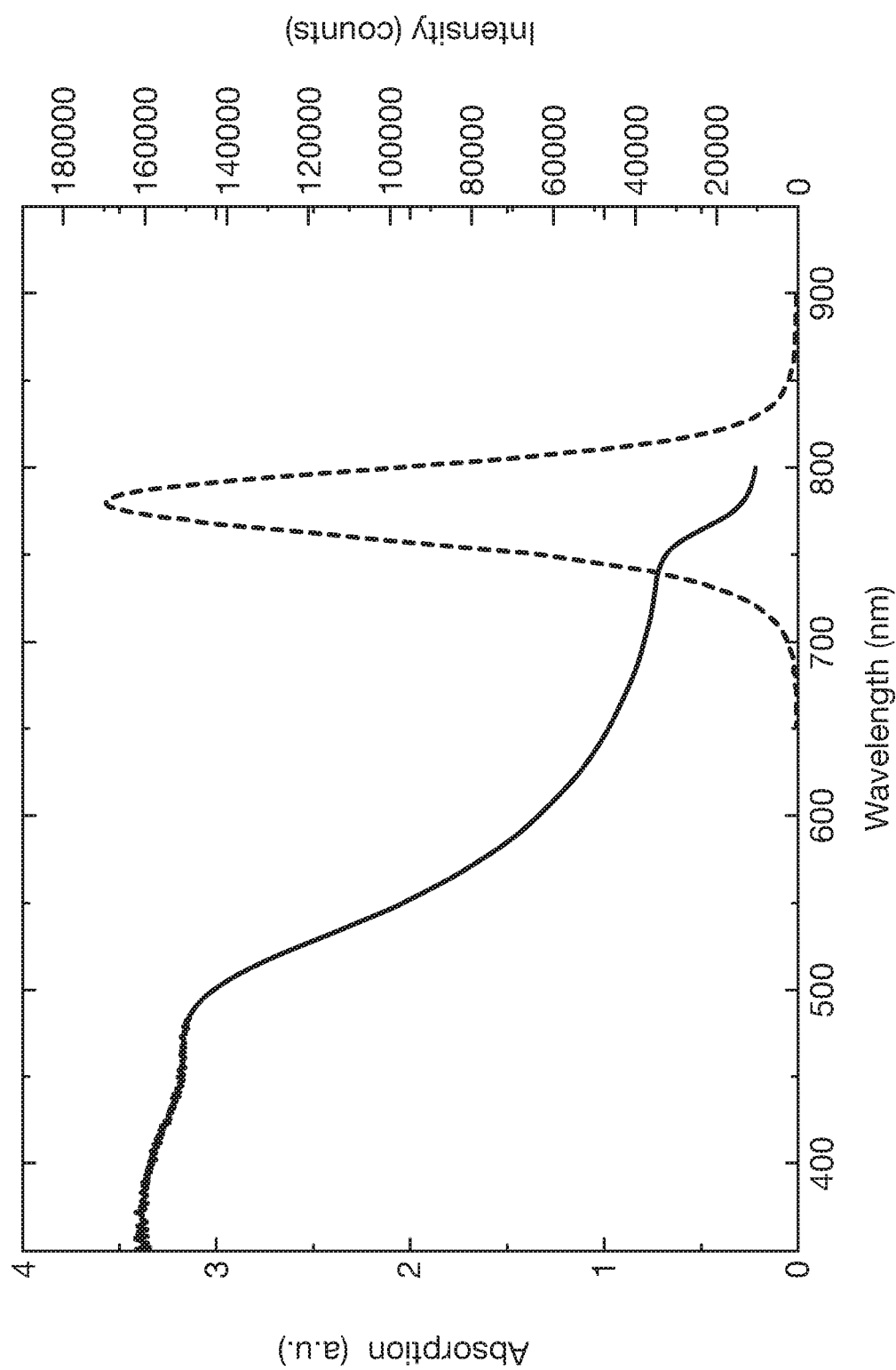
FIG. 2 shows steady state photoluminescence and UV-Vis absorption of an unheated $MAPbI_3$ film spin-coated from an ACN/MA solvent mixture. The absorbance is given by the left hand curve stopping at 800 nm and the steady state luminescence is given by the trace peaking at just below 800 nm.

To confirm that the product formed from the ACN/methylamine precursor was the expected $MAPbI_3$ perovskite, UV-Vis absorption and steady-state PL measurements were carried out. The results are shown in FIG. 2 and confirm that the $MAPbI_3$ perovskite was formed.

Figure 3:
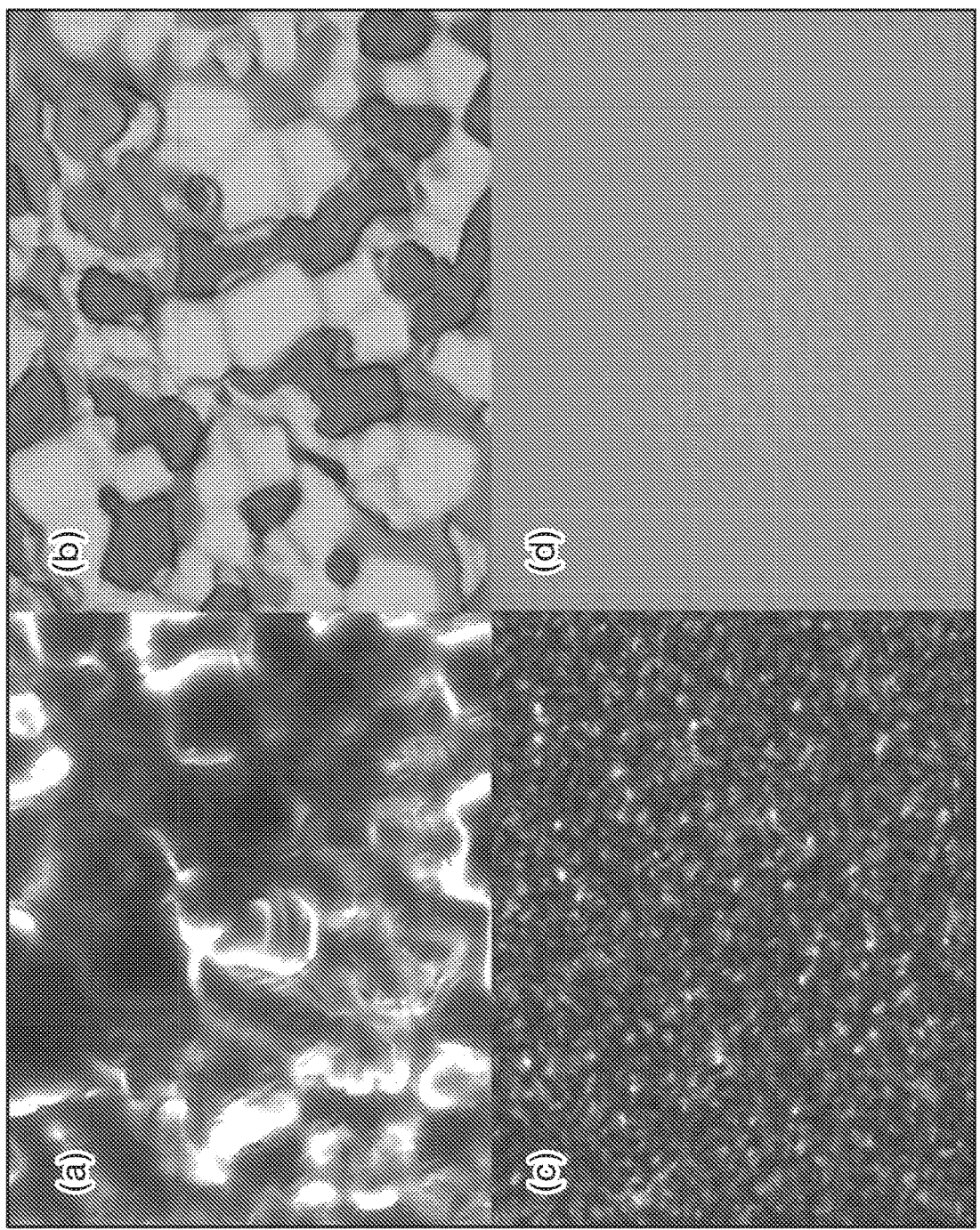
FIG. 3 shows dark field and light field microscope images of films of $MAPbI_3$ spun from DMF (a, b) and ACN/MA (c,d) solutions.

As a comparative test of the film quality, one film of $MAPbI_3$ was spin-coated from the ACN/methylamine (ACN/MA) solution described above and another was spincoated from a solution with the same composition except that the solvent was DMF (and there was no alkylamine present). Both films were spun in air with 30% relative humidity, and cured in an oven for 30 mins at 100° C. Photographs were taken of the films before and after curing. It was immediately evident that the film spin-coated from the ACN/MA mixed solvent system was far smoother and much more specular than the film coated from DMF. The DMF film was hazy and was not specular. The dark field and light field microscope images shown in FIG. 3 show one of the causes of this difference observed between the ACN/MA film (lower micrographs: c, d) and the DMF film (lower micrographs: a, b). The film coated from DMF is not continuous, and is plagued by an abundance of pinholes, whereas the film coated from ACN/MA is very smooth and does not have pinholes.

It is clear from the microscope images in FIG. 3 that the film spun from ACN/MA is a dense, continuous, pin-hole free film, as opposed to its DMF counterpart. Following the demonstration that this solvent system produces films of superior quality, devices were fabricated using the methodology described above. The anneal time was first optimised and the results of this are summarized in FIGS. 4 and 5.

Figure 4:
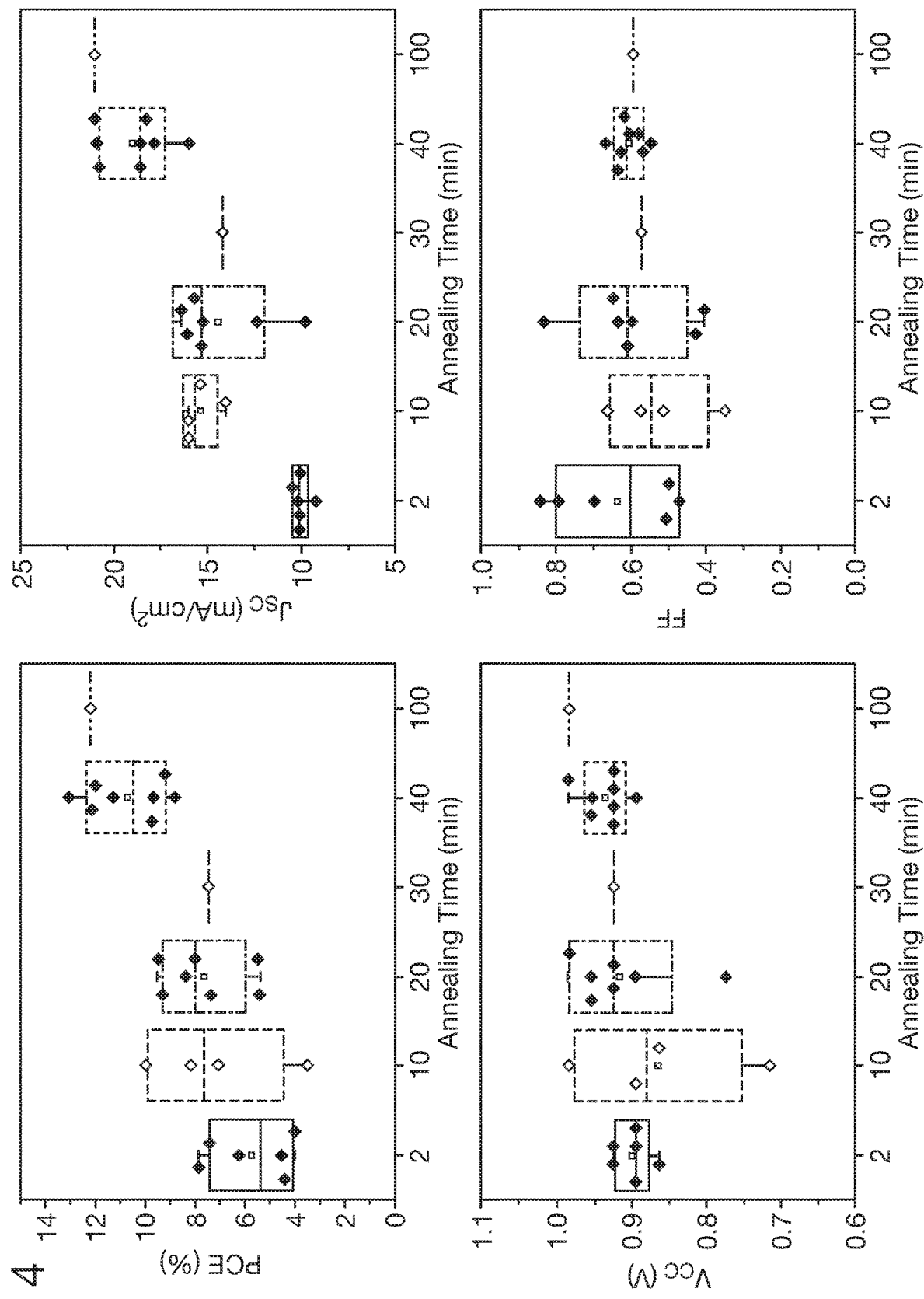
FIG. 4 shows the effect of annealing time on performance parameters of devices made using the process of the invention.
Figure 5:
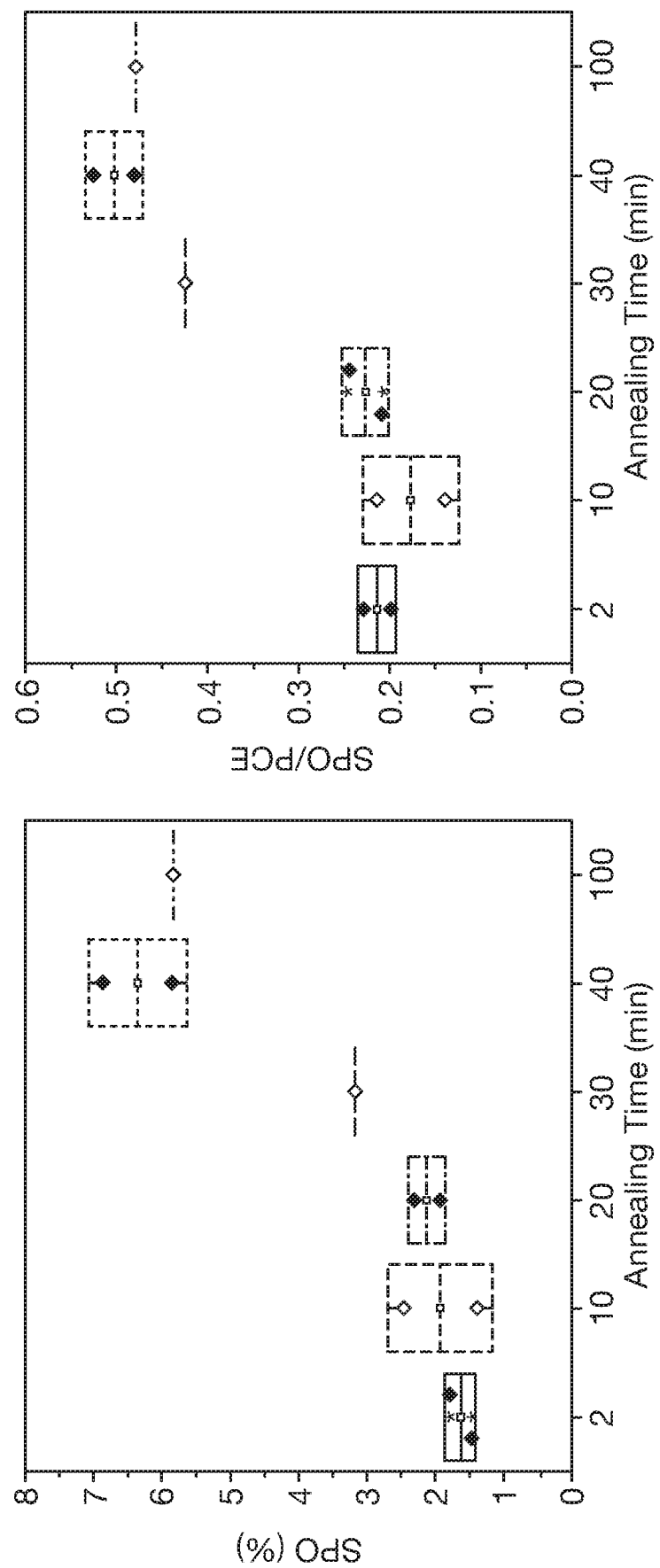
FIG. 5 shows the effect of annealing time on the stabilized power output of devices made using the process of the invention.

It can be seen from FIGS. 4 and 5 that, even though the films form on the spin-coater, they can still benefit from being annealed. It is possible that this annealing time is needed to drive out excess methylamine from the perovskite film. In an attempt to optimised the performance of these devices, an annealing time of 45 minutes was chosen, followed by degassing under vacuum at room temperature for 15 mins. The devices fabricated are all manufactured on a $TiO_2$ compact layer.

Figure 6:
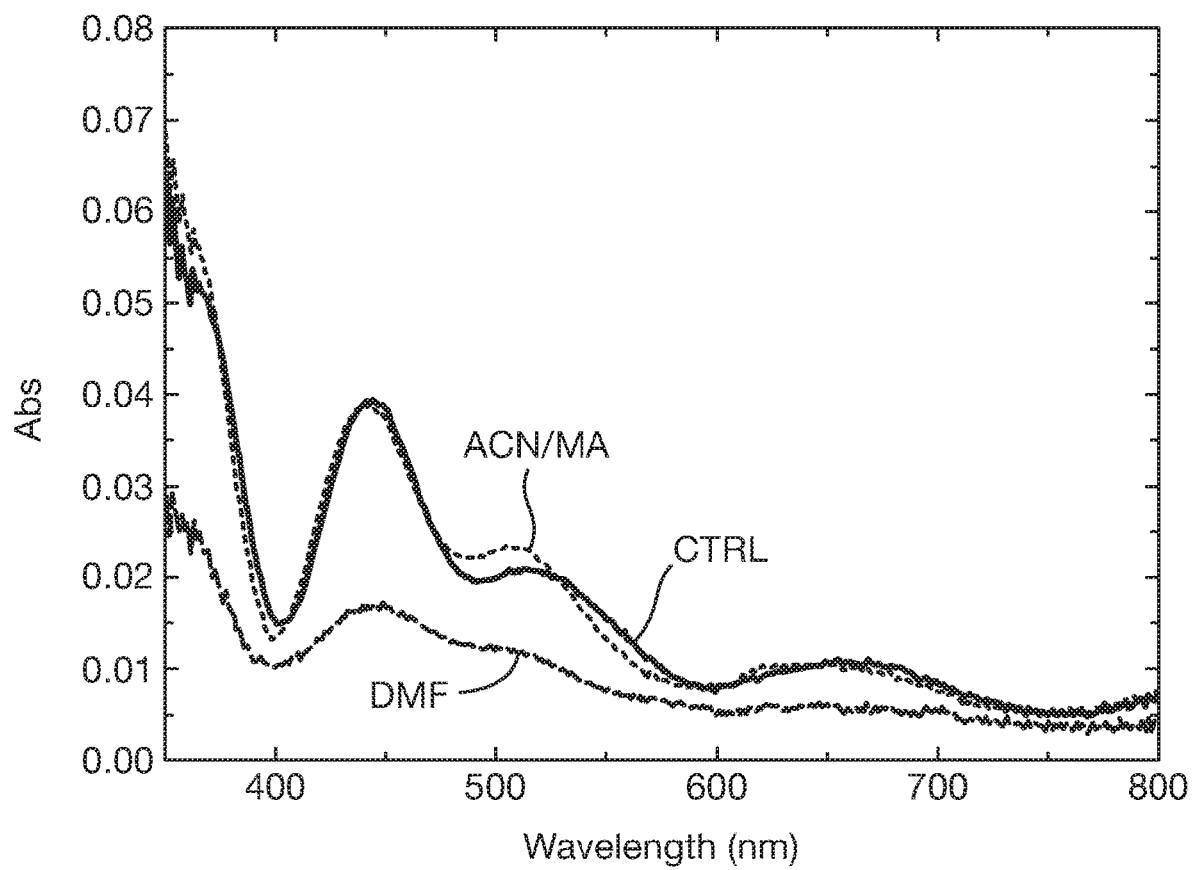
FIG. 6 shows absorbance of a C60 film before and after being treated with ACN/MA (two upper traces trace), and after being treated with DMF (lower trace).

One of the major advantages of using ACN as a solvent, is that organic n-type layers such as C60 and PCBM are not soluble in this solvent. To assess the influence of ACN on a film of C60, a film of C60 was pre-casted and cured as described in the methods section above, and either DMF or the ACN/MA solvent mixture was spin-coated on top of the film. The effect of these solvents on the film was investigated using UV-Vis absorbance measurements, the results of which are presented in FIG. 6. The results very clearly show DMF decreasing the absorbance of the C60 film, which occurs as a direct result of washing off a portion of the film, thus reducing the thickness of the layer. However, this is not the case when the ACN/MA solvent is spin-coated on top of the C60 film. This confirms that ACN/alkylamine solvents are able to overcome the problem of damage being caused to other layers in devices as occurs with DMF.

Taking into consideration the beneficial effect which C60 has been shown to have on the current-voltage hysteresis exhibited by perovskite solar cells, all devices shown hereafter, have been fabricated using a C60 electron selective contact layer.

Figure 7:
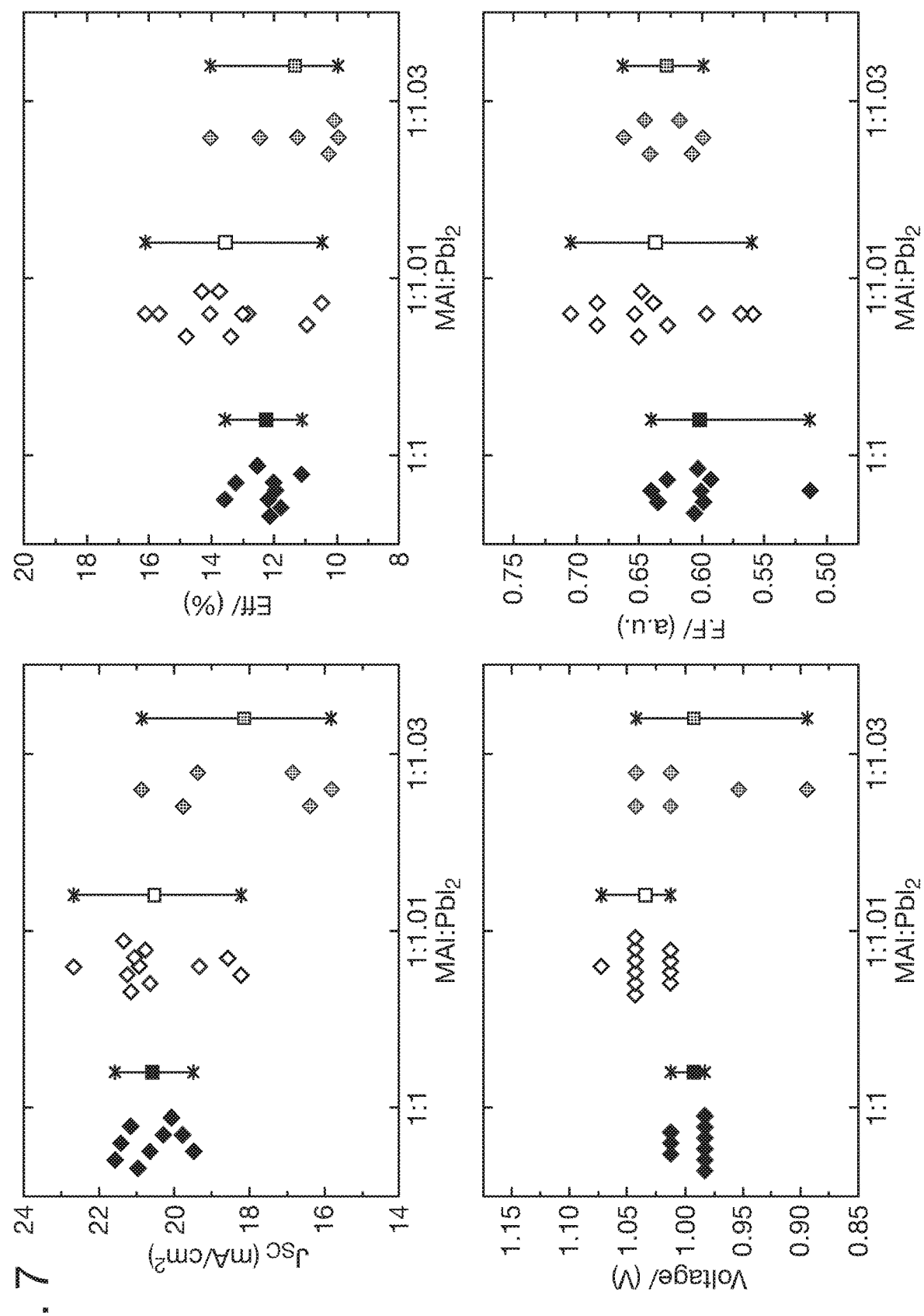
FIG. 7 shows performance parameters for devices fabricated with various amounts of lead iodide relative to the amount of methylammonium iodide.
Figure 8:
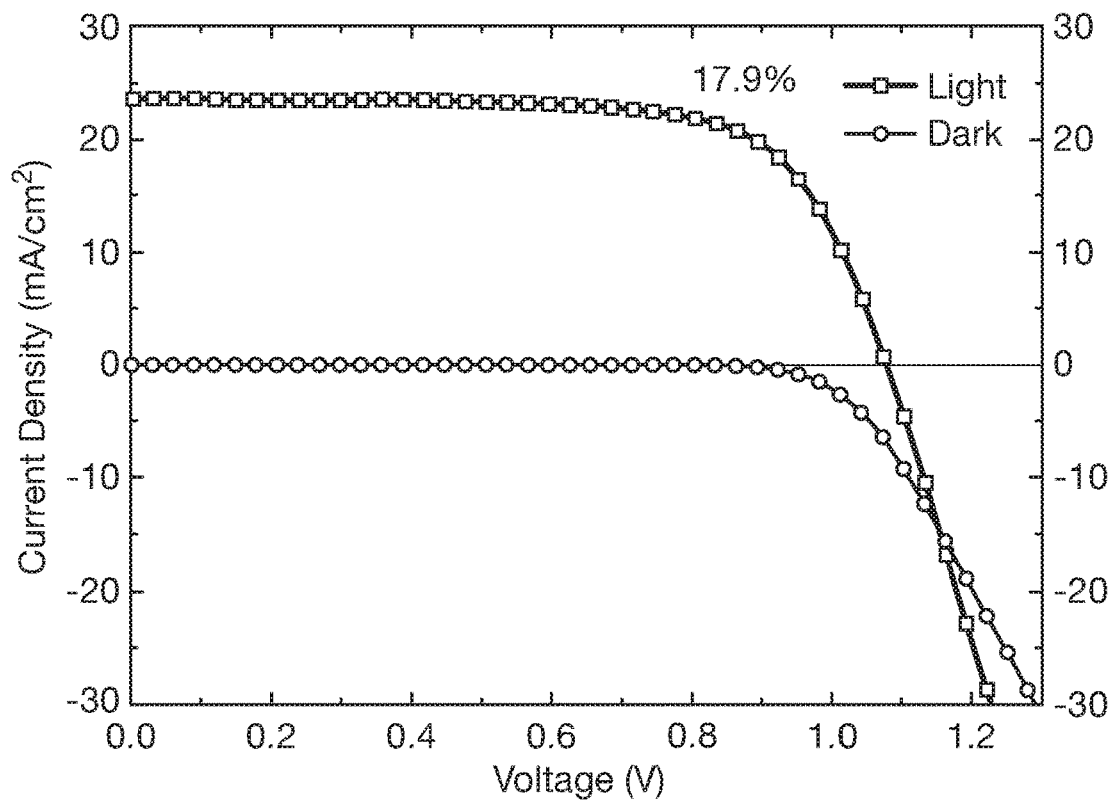
FIG. 8 shows JV characteristics for a champion device.
Figure 8:
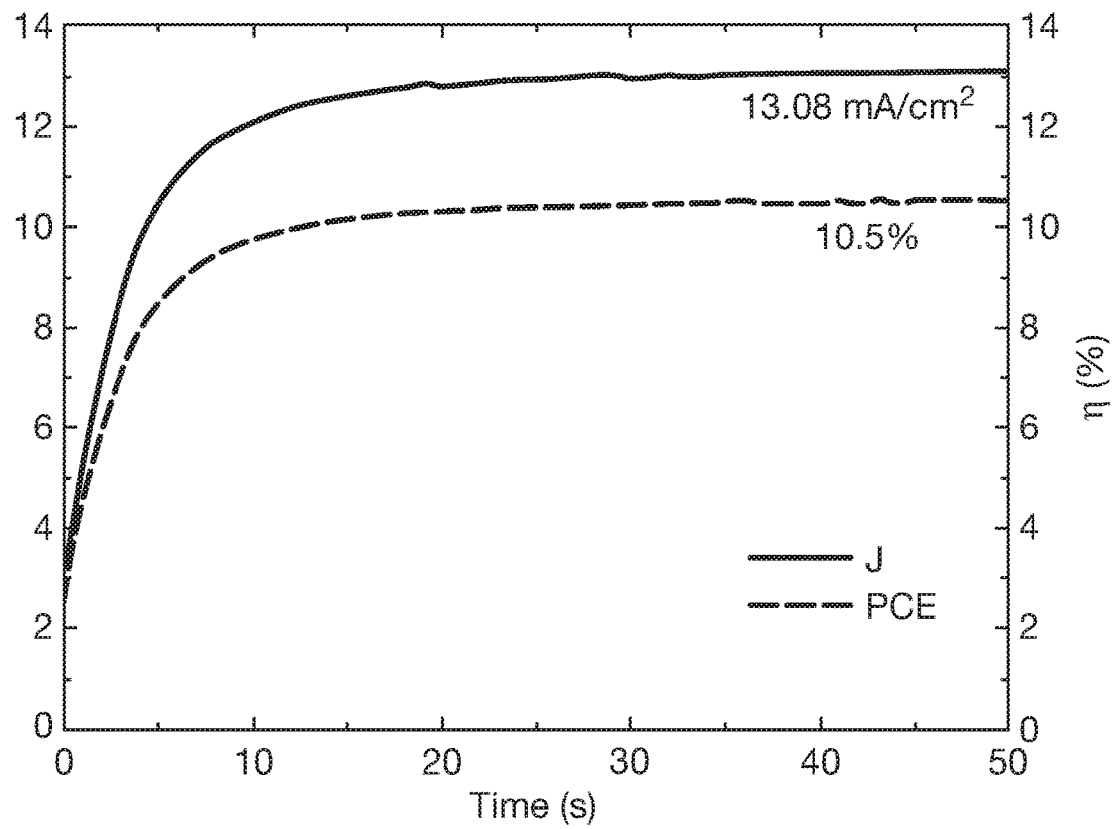

The ratio of $PbI_2$ to MAI was then optimised and it was found that a small excess of $PbI_2$ gave improvements to device performance. The device performance results are shown in FIG. 7. Using the optimised molar ratio, a device was fabricated with a power conversion efficiency (PCE) of 17.9%, a record for any non-DMF based planar heterojunction device and a first for any low boiling point solvent. The JV characteristics for this champion device are shown in FIG. 8. This device had a short circuit current density of 23.5 $mA/cm^2$, a power conversion efficiency of 17.9%, an open circuit voltage of 1.07 V and a fill factor of 0.71. When held at its maximum power point, it produced a steady state efficiency of 10.5% and a current density of 13.08 $mA/cm^2$.

Example 2—Other Alkylamines

In view of the results obtained with methylamine, similar experiments were conducted using the addition of propylamine, butylamine or pentylamine. In all cases, it was observed that the presence of the alkylamine improved dissolution of the precursor compounds in ACN and have similar mixed solvent precursor solutions were formed with these amines.

The ACN/alkylamine precursor solutions were spin-coated to form thin films. It was observed that using longer chain alkylamines to dissolve the precursors resulted in the formation of the layered perovskite structure $ABX_4$. This suggests that the alkylamine used for solvation is also included in the perovskite structure. It should be noted that when using the pure liquid amines, only approximately 90 microliters of amine is needed to completely dissolve the precursor powders in 2 ml of ACN. However, for ease of comparison, the final molarity of all solutions used was constant.

Figure 9:
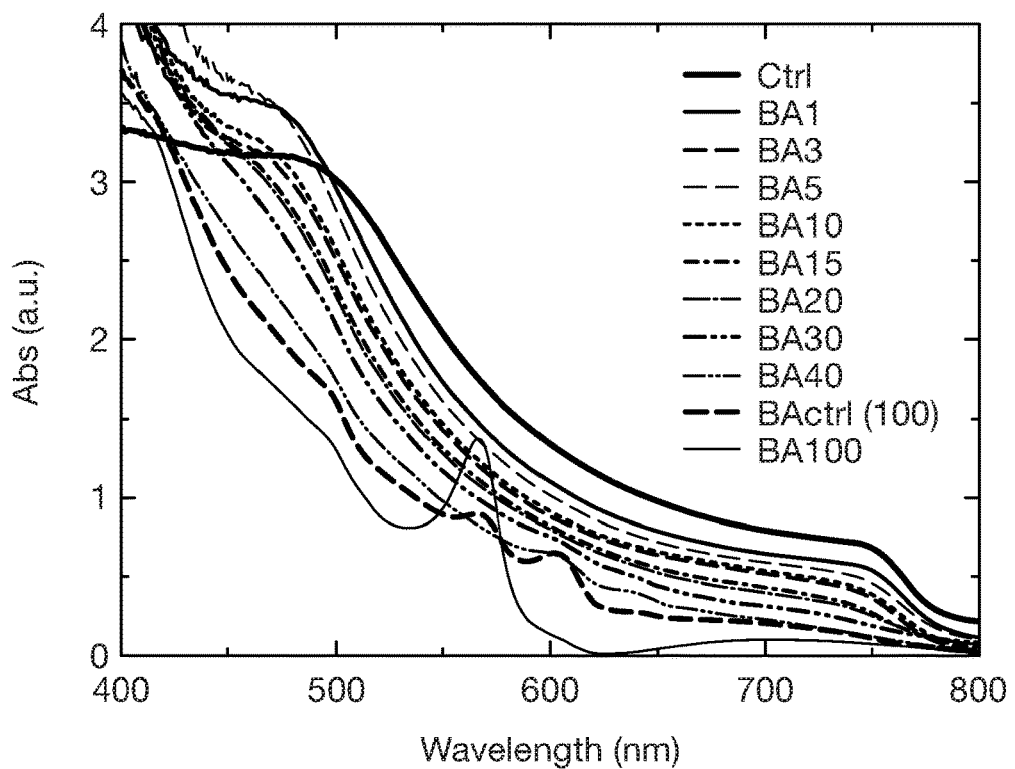
FIG. 9 shows UV-Vis absorbance data for $MAPbI_3$ films spin-coated from ACN/MA/butylamine (BA) mixtures, where the number refers to microliters of BA in 1 ml of ACN, i.e. BA(100) is 100 microliters of BA in 1 milliliter of ACN.

Different combinations of amines were used with acetonitrile and it was found to be possible to tune the colour of the films. FIG. 9 shows UV-Vis absorbance data for $MAPbI_3$ films spin-coated from ACN/MA/butylamine (BA) mixtures. The numbers represent the volume of BA (in microliters) added per milliliter of solution. The uppermost trace is the control (no butylamine) and the lowermost is BA100, with the remaining traces keeping the ordering shown in the legend. The overall concentration of the solution was kept at 0.5 M in all cases in order to keep the film thickness (500 nm) constant. It is seen here that at the addition of 30 microliters of BA, there is a clear shift towards the layered perovskite, evidenced by the appearance of the excitonic peaks characteristic of such a material.

Figure 10:
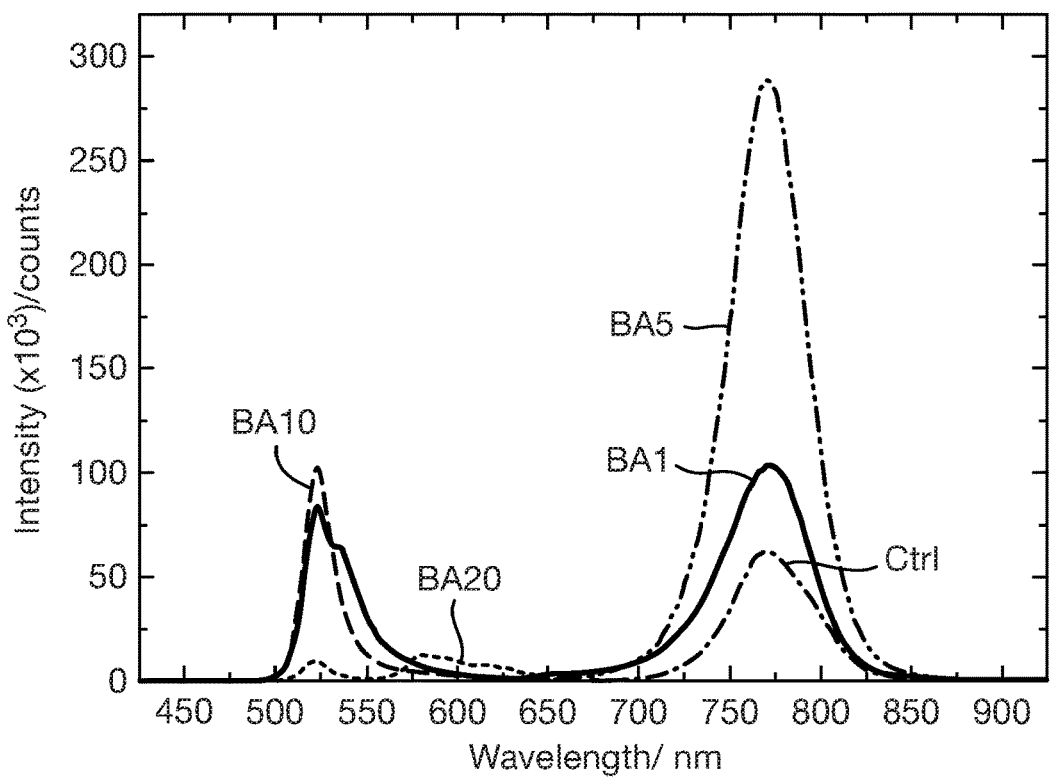
FIG. 10 shows steady state photoluminescence of the films with various BA concentrations. The shifts and changes in intensity of the steady state photoluminescence spectra of $MAPbI_3$ with the addition of various volumes of butylamine can be seen.

FIG. 10 shows steady state photoluminescence of the films with various BA concentrations. The shifts and changes in intensity of the steady state photoluminescence spectra of $MAPbI_3$ with the addition of various volumes of butylamine can be seen.

Example 3—ACN/Methylamine

Materials and Methods:
Solvent Preparation

The acetonitrile/methylamine (ACN/MA) composite solvent can be prepared through various routes. In this Example, two different methods of introducing the methylamine into the CAN are described. For thin film and device studies, a solution of MA in ethanol (Sigma Aldrich, 33 wt %) was placed into an aerator which was kept in an ice bath. A carrier gas, $N_2$, was then bubbled into the solution, thus degassing the solution of MA. The MA gas which was produced was then passed through a drying tube filled with a dessicant (Drietire and CaO), before it was bubbled directly into the ACN (Sigma Aldrich) which contained the perovskite precursors (1 MAI: 1.06 M $PbI_2$) at a concentration of 0.5 M. The gas was bubbled into the black dispersion until the perovskite particles were completely dissolved resulting in a clear, light yellow solution.

After all particulates in the solution were dissolved, the vial was sealed with a septum cap and stored at 5° C. until needed. The solution can be kept for up to at least 4 months under these conditions without any noticeable loss in the performance of the subsequently fabricated devices. The solution was taken from the stock as needed, after which the vial was resealed and returned to the refrigerator.

For solvent characterization, the solvent was prepared by condensing pure MA gas into the ACN. While this allows for a maximum concentration of 24 wt % to be achieved, this may represent a non-equilibrium concentration. For all solvent characterizations, the concentration used was 15 wt %. In this case, the mixed solvent was prepared as follows; acetonitrile was placed in a round bottom flask on a Schleck line and degassed by 3 cycles of freeze, pump, and thaw. The flask was then placed in a cooling bath of ethylene glycol and dry ice at −15° C. with the gas inlet tube beneath the liquid level of the acetonitrile. MA gas was introduced at a rate slow enough to ensure condensation on contact with the acetonitrile so that the MA was mixed with the acetonitrile in the liquid phase. At several points during the synthesis the apparatus was removed from the Schleck line and weighed to determine the added weight percentage of MA in acetonitrile. Aliquots of the solution were taken at each weight point to determine the density and test the dissolution of the precursor salts at different concentrations. At each weight point the solution was allowed to heat up to room temperature and the pressure monitored for the release of MA gas; the maximum concentration was determined as the point at which MA gas came out of solution when heated to room temperature. In order to check that this method of solvent preparation was comparable to the use of the carrier gas, devices were fabricated using the solvent thus prepared, and yielded equivalent power conversion efficiencies.

Viscosity Measurements

Viscosity was measured using a Brookfield DVI viscometer in a cone and plate geometry at 20° C. Samples were tested at multiple rotation speeds and exhibited Newtonian behaviour.

Fabrication of n-i-p Devices

Briefly, FTO-coated glass sheets (7 Ωcm$^{-1}$ Hartford Glass) were etched with zinc powder and HCl (3M) to obtain the required electrode pattern. The sheets were then washed with soap (2% Hellmanex in water), deionized water, acetone, and methanol, and finally treated under oxygen plasma for 10 min to remove the last traces of organic residues. All chemicals were purchased from Sigma Aldrich and used as received unless otherwise stated. A 100 nm thick compact layer of TiO$_2$ was then deposited on the glass using titanium isopropoxide (99.999% purity) diluted in anhydrous ethanol and sintered for 45 mins at 500° C. After the substrate was allowed to cool, a layer of C60 (10 mg/ml in 1,2-dichlorobenzene) or 1-Butyl-3-methylimidazolium tetrafluoroborate (0.01 wt % in MeOH) was deposited via spin coating at 3500 rpm for 30 s or 5000 rpm for 45 seconds respectively. The substrate was then heated at 80° C. for 2 mins, and allowed to cool to room temperature before the deposition of the perovskite layer. After cooling, a 0.5 M solution of 1:1.06 MAI (Dyesol) to PbI$_2$ (99% purity) in the ACN/MA solvent was spin coated onto the substrate at 2000 rpm for 45 s, in dry air, resulting in the formation of a smooth, dense, perovskite layer. A post-treatment of methylammonium chloride (MACl) was then carried out by dynamically spincoating 100 μl of MACl (Alfa Aesar, 5 mg/ml in isopropanol). The substrate was then heated at 100° C. for 60 mins. After annealing, the substrates were allowed to cool to room temperature. The hole transporting material (HTM) 2,2',7,7'-tetrakis(N,N'-di-p-methoxyphenylamine)-9,9'-spirobifluorene (spiro-OMeTAD) was then dissolved in chlorobenzene with additives at a concentration of 30 mM lithium bis(trifluoromethanesulfonyl)imide (Li-TFSI) and 80 mM tert-butylpyridine (tBP). Lastly, 110 nm thick silver electrodes were evaporated onto the devices through a shadow mask, using a thermal evaporator.

Fabrication of p-i-n Devices

The FTO substrates and the hole-transporter (poly-TPD doped with 2,3,5,6-Tetrafluoro-7,7,8,8-tetracyanoquinodimethane (F$_4$TCNQ)) were prepared. The perovskite film was deposited and treated in the same manner as above. A layer of phenyl-C61-butyric acid methyl ester (PCBM from Solenne BV, 20 mg/mL in chlorobenzene) was dynamically spincoated onto the perovskite film at 1.8 krpm for 30 s, followed by annealing at 90° C. for 10 mins. Once cooled to room temperature, a thin layer of bathocuproin (BCP from Alfa Aesar, 0.5 mg/mL in isopropanol) was dynamically spincoated at 4 krpm for 20 s. Lastly, 110 nm thick silver electrodes were evaporated onto the devices through a shadow mask, using a thermal evaporator.

Fabrication of Large Area Perovskite Films

For the fabrication of the large area perovskite films, 1 ml of a 0.5 M CH$_3$NH$_3$PbI$_3$ solution in ACN was deposited onto the centre of the substrate which was then spun at 2000 rpm for 45 seconds. This process resulted in a highly specular perovskite film, which crystallizes during spincoating.

Fabrication of Spectroscopy Samples

Spectroscopy samples were fabricated on cleaned, plasma etched glass. All samples were spin coated in dry air. For the CH$_3$NH$_3$PbI$_3$ samples, equimolar amounts of MAI (Dyesol) and PbI$_2$ (99% purity) were dissolved in DMF or the ACN/MA mixed solvent at a concentration of 0.5 M. These solutions were then spincoated onto the cleaned glass at 2000 rpm for 45 s. In the case of the ACN/MA solvent, the samples were then annealed at 100° C. for a specific time ($0 \leq t_{anneal} \leq 75$ mins) while for the DMF, samples were annealed at the same temperature for 10 mins. For the ACN/MA samples, a post treatment of methylammonium chloride (MACl) was then carried out by dynamically spincoating 100 μl of MACl (Alfa Aesar, 5 mg/ml in isopropanol). For the CH$_3$NH$_3$PbI$_{3-x}$Cl$_x$ samples, MAI and PbCl$_2$ were dissolved in DMF at a 3:1 molar ratio, at a concentration of 38 wt %. The solution was then spincoated onto cleaned glass at 2000 rpm for 45 s, after which it was annealed at 100° C. for 2 hrs. Subsequent to the deposition of the perovskite layer, films were coated with a 1% solution of poly (methyl methacrylate). Films were typically stored in a desiccator in the dark for 12 hours before spectroscopic investigation.

Solar Cell Characterization

Solar cell performance was measured using a class AAB ABET solar simulator which was calibrated to give simulated AM 1.5 sunlight, at an irradiance of 100 mW/cm$^2$. The irradiance was calibrated using an NREL-calibrated KG5 filtered silicon reference cell. Current-Voltage curves were recorded using a sourcemeter (Keithley 2400, USA). All solar cells were masked with a metal aperture which was used to define the active area of the devices, which in this case was 0.0912 cm$^2$ or 0.7 cm$^2$ as specified. All devices, like spectroscopy samples were stored in a desiccator in the dark for 12 hours prior to testing.

Optical Characterization

Absorption spectra were recorded on a Varian Cary 300 Uv-Vis spectrophotometer. Steady-state and time-resolved PL measurements were acquired using a time-correlated single photon counting (TCSPC) setup (FluoTime 300 PicoQuant GmbH). Film samples were photoexcited using a 507 nm laser head (LDH-P-C-510, PicoQuant GmbH) pulsed at frequencies between 0.3-10 MHz, with a pulse duration of 117 ps and fluence of ~30 nJ/cm$^2$. The PL was collected using a high resolution monochromator and hybrid photomultiplier detector assembly (PMA Hybrid 40, PicoQuant GmbH).

Microscopy

The AFM images were obtained using a ThermoMicroscope M5 in contact mode and scanning over a range of 5 μm by 5 μm at a resolution of 256×256 data points. The surface roughness was measured as the root mean-squared roughness over the scanning area.

A field emission SEM (Hitachi S-4300) was used to acquire SEM images. The instrument uses an electron beam accelerated at 10-30 kV, enabling operation at a variety of currents.

Thickness Homogeneity

Thicknesses were measured using a spectral reflectance instrument (F20, Filmetrics). The data was fitted with a model consisting of a $Si/SiO_2/MAPbI_3$/air optical stack. The goodness of the fit was above 98% and the optical constants for $MAPbI_3$ were taken from Loeper et al, J. Phys. Chem. Lett., 2015, 6, 66-71.

Results and Discussion:

Using the solution produced with the ACN/MA compound solvent, films of $CH_3NH_3PbI_3$ were fabricated for X-ray diffraction and optical characterization. Acetonitrile is a solvent which has a boiling point of 82° C. and a vapour pressure of 9.71 kPa at standard room temperature and pressure (STP), whereas methylamine is a gas. In the case of the mixed solvent, where methylamine is dissolved in acetonitrile, it was found that it has a boiling point of 80° C. and a viscosity of 0.25 cP. When depositing films of $CH_3NH_3PbI_3$ from the ACN/MA compound solvent, the films appear to completely crystallize during spin-coating, showing the strong dark colour which is characteristic of polycrystalline $CH_3NH_3PbI_3$.

Figure 11:
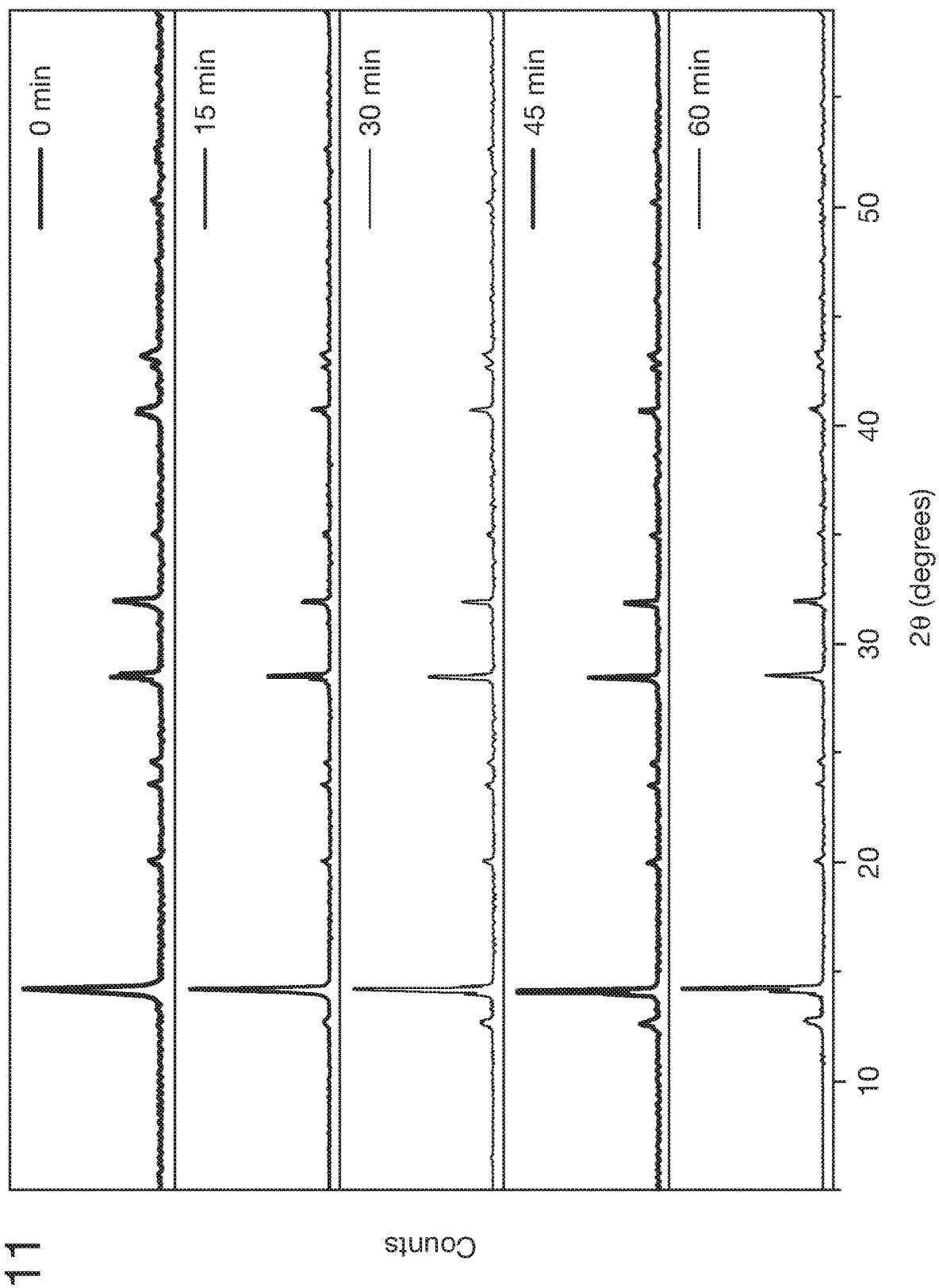
FIG. 11 shows the X-Ray diffractograms of a film of $CH_3NH_3PbI_3$ spin coated from a precursor solution where ACN/MA is the solvent, measured at different annealing time intervals ($T_{anneal}$=100° C.).

FIG. 11 shows show the X-ray diffractograms from a single representative film as spin-coated, and after annealing at 100° C. for different time intervals, alongside corresponding photographs of the film. From these diffraction patterns, it can be confirmed that even before annealing, the perovskite film is already formed, exhibiting the characteristic peaks of a tetragonal perovskite crystal structure. After annealing the film for 15 minutes at 100° C., the appearance of a small peak at 12.6° is observed, which may be assigned to the presence of lead iodide. The appearance of this peak suggests the onset of "over-annealing" of the film, which is characterized by driving off some of the organic components; at the same time there is also a distinct sharpening of the characteristic perovskite peaks. The decrease in these peak widths suggests that with annealing there is either an increase in crystallinity, or grain coarsening in the films.

Figure 12A:
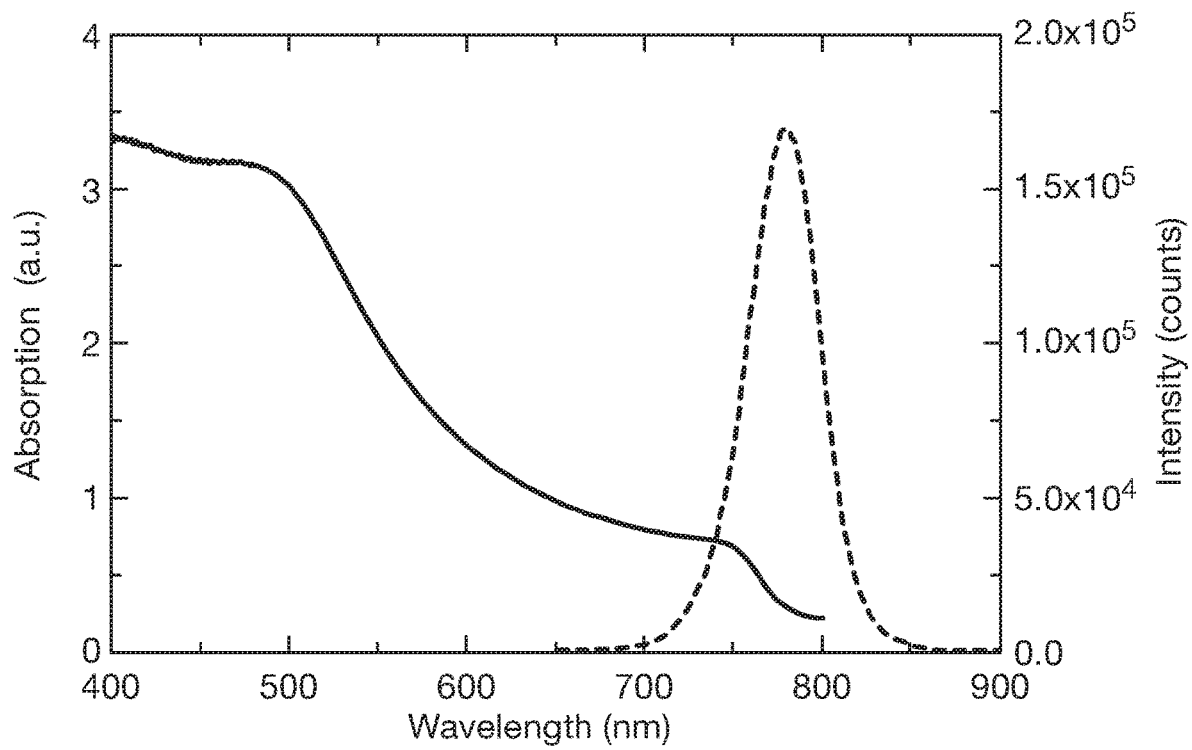
FIG. 12 shows (a) absorption and steady-state photoluminescence spectra of a film of $MAPbI_3$ as spin coated from ACN/MA and (b) time-resolved photoluminescence of films of $CH_3NH_3PbI_3$ spin coated from an ACN/MA, $CH_3NH_3PbI_{3-x}Cl_x$ spin coated from a DMF solution, and $CH_3NH_3PbI_3$ spin coated from a DMF solution. The initial carrier density after pulsed excitation at 505 nm is $10^{16}$ cm$^{-3}$. The solid lines are fits to a stretched exponential function.
Figure 12B:
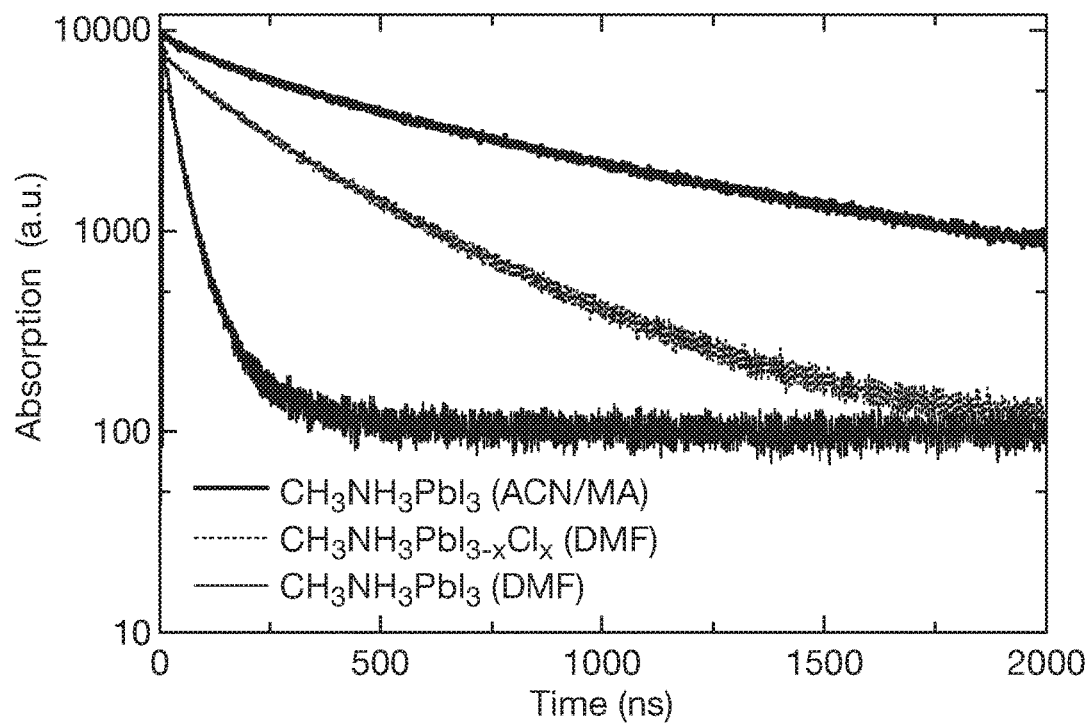

FIG. 12 shows the absorption and steady-state photoluminescence spectra of these films. The characteristic absorption onset at approximately 770 nm and steady-state photoluminescence (PL) peak at 780 nm are observed. FIG. 12b shows the time-resolved photoluminescence decays of a film of $CH_3NH_3PbI_3$ processed from the ACN/MA mixed solvent, alongside that of films of $CH_3NH_3PbI_{3-x}Cl_x$ and $CH_3NH_3PbI_3$ fabricated from precursor solutions in DMF. It can be noted that the $CH_3NH_3PbI_3$ films are fabricated from a stoichiometric solution of $MAI:PbI_2$, while the $CH_3NH_3PbI_{3-x}Cl_x$ film is fabricated from a 3:1 molar ratio of $MAI:PbCl_2$. The PL decay is influenced by a multitude of factors, include the radiative and non-radiative decay constants and the optoelectronic homogeneity of the polycrystalline films. As a general indication, the longer the PL lifetime, the slower the non-radiative decay and hence the longer lived the charge carriers and the longer the charge carrier diffusion length. The absorption and steady-state photoluminescence spectra of these films are shown in FIG. 12. To quantify the photoluminescence lifetime, the data was fitted with a stretched exponential function. For the $CH_3NH_3PbI_3$ film processed from the ACN/MA solvent, the average lifetime <τ> is 676 ns, much longer than that of the DMF processed films, which give <τ> values of 258 ns and 28 ns for $CH_3NH_3PbI_{3-x}Cl_x$ and $CH_3NH_3PbI_3$ respectively. This is indicative of a significant improvement of the optoelectronic quality of the films obtained through processing with this new solvent system.

The surface morphology of the films was also investigated using scanning electron microscopy (SEM) and atomic force microscopy (AFM). It was found that the crystal grains were densely packed with the sizes of individual domains ranging from between 500 nm and 700 nm. At lower magnification, the absence of pinholes in the film becomes more notable. Using AFM, the surface roughness of the films were probed and a root mean square (rms) value of 7.8 nm (5×5 micron scan area, contact mode) was obtained. This rms value is considerably smaller than those previously reported for films of $CH_3NH_3PbI_3$ (52.2 nm) and $CH_3NH_3PbI_{3-x}Cl_x$ (62.4 nm) processed from lead halide precursors in DMF. The low surface roughness observed for the film produced according to a process according to the invention accounts for one of the most visually striking features of films processed from this solvent; their smooth, mirror-like appearance.

One of the added advantages of processing perovskite films from the ACN/MA solution is the ability to coat relatively large areas uniformly. In order to illustrate this, a Si wafer (10 cm diameter) was coated and the obtained film was investigated using spectral reflectance measurements. The thickness of the film was probed at various points over the entire area and it was found that the perovskite layer was highly uniform, with a thickness of 329.6±6.3 nm.

Figure 13:
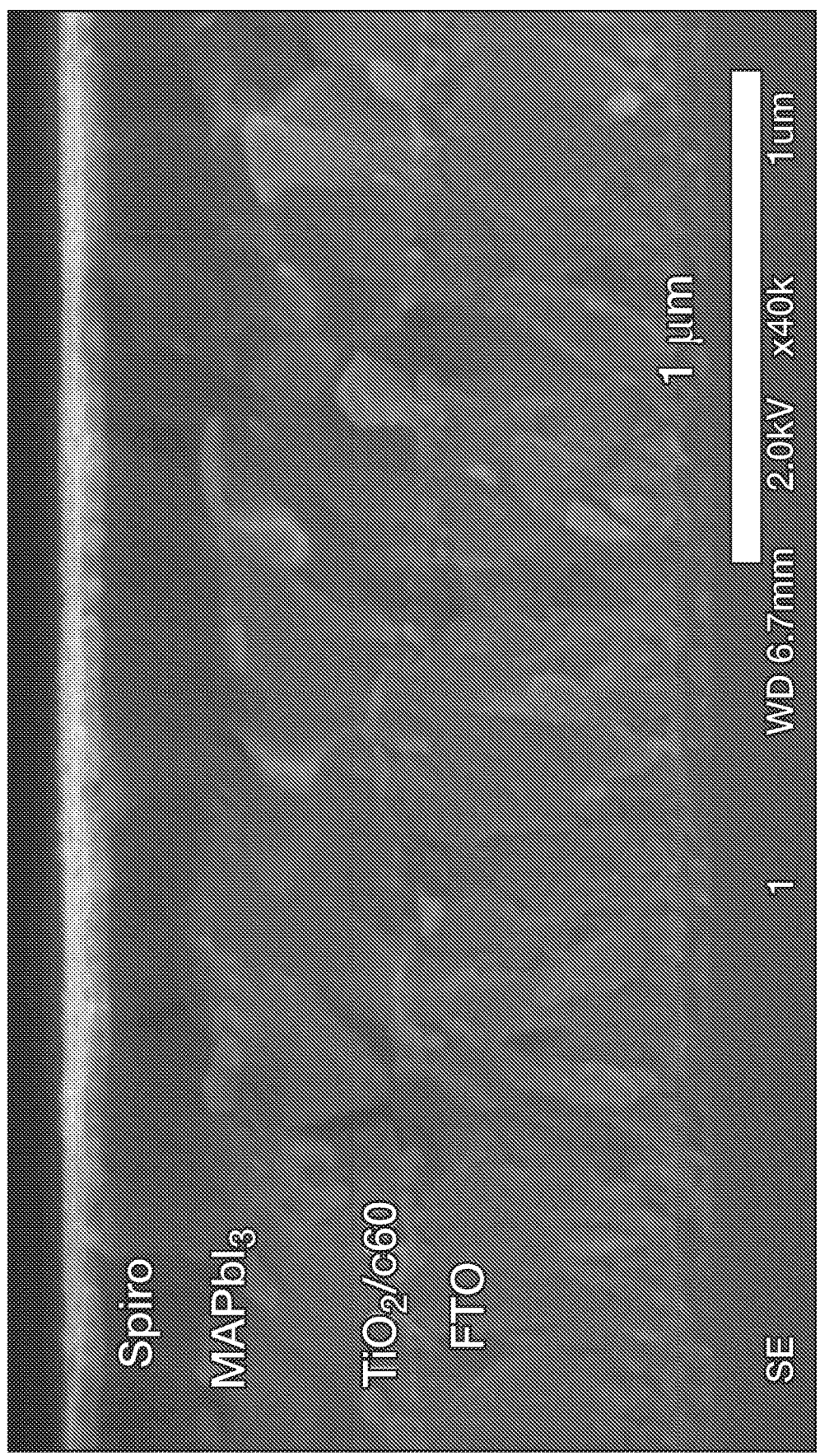
FIG. 13 shows cross-sectional SEM image of a device fabricated using the ACN/MA solvent system.
Figure 14A:
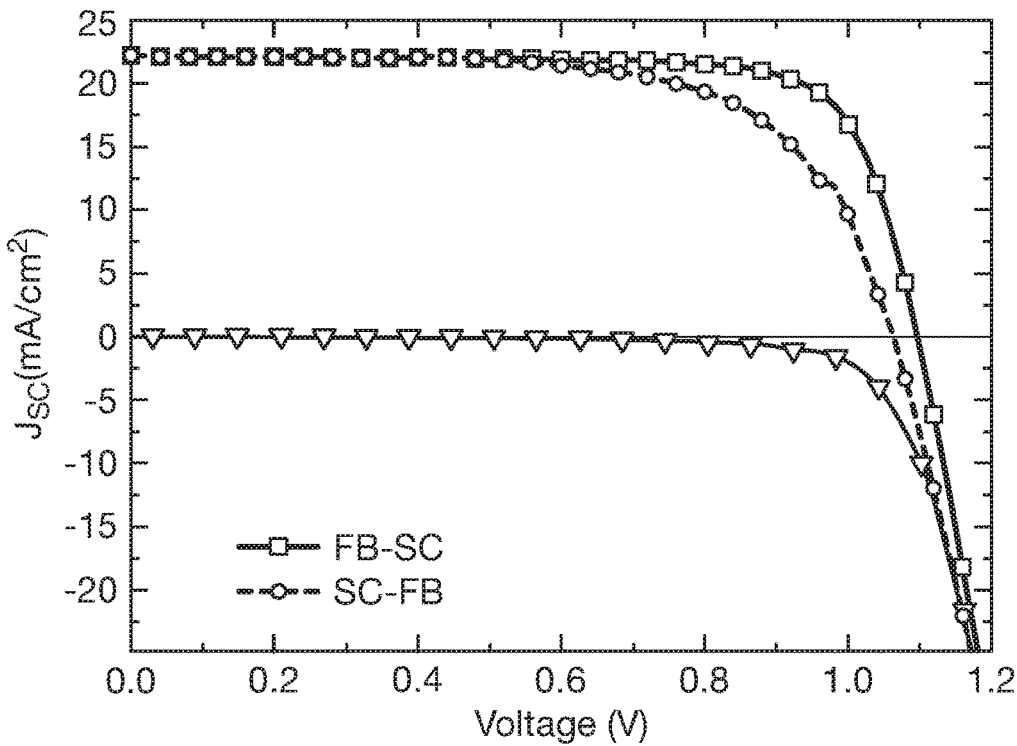
FIG. 14 shows (a) current-voltage characteristics of the champion ACN/MA device where the active layer annealed and 100° C. for 60 mins and (c) the champion ACN/MA device in which the active layer was "degassed" under vacuum overnight; (e), Current-voltage characteristics of the champion inverted ACN/MA device where the active layer annealed and 100° C. for 60 mins and (b), (d) and (f) Stabilized photocurrents and efficiencies of the devices presented in (a), (c) and (e) respectively, measured by holding the devices at their JV determined maximum power point for 50 seconds.
Figure 14B:
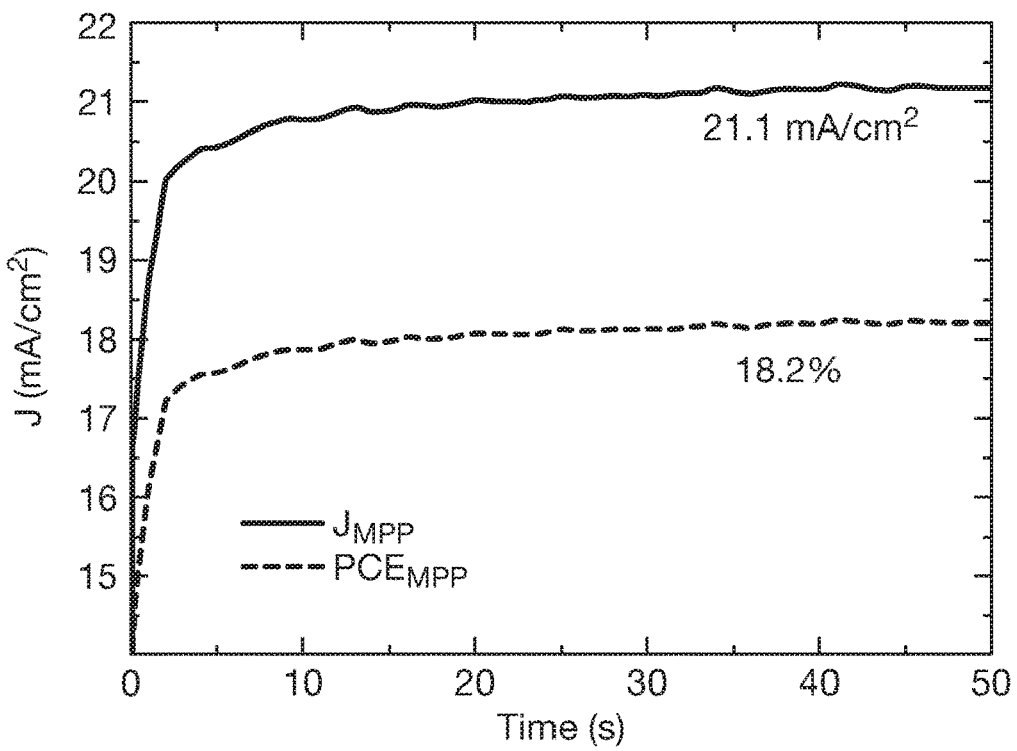
Figure 14C:
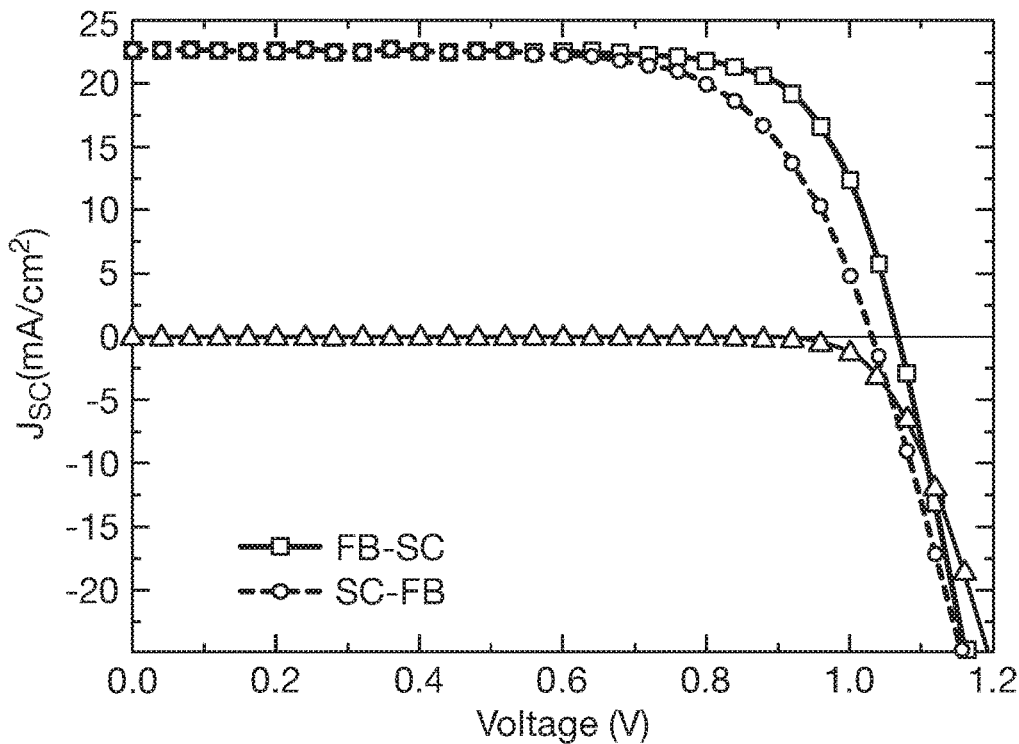
Figure 14D:
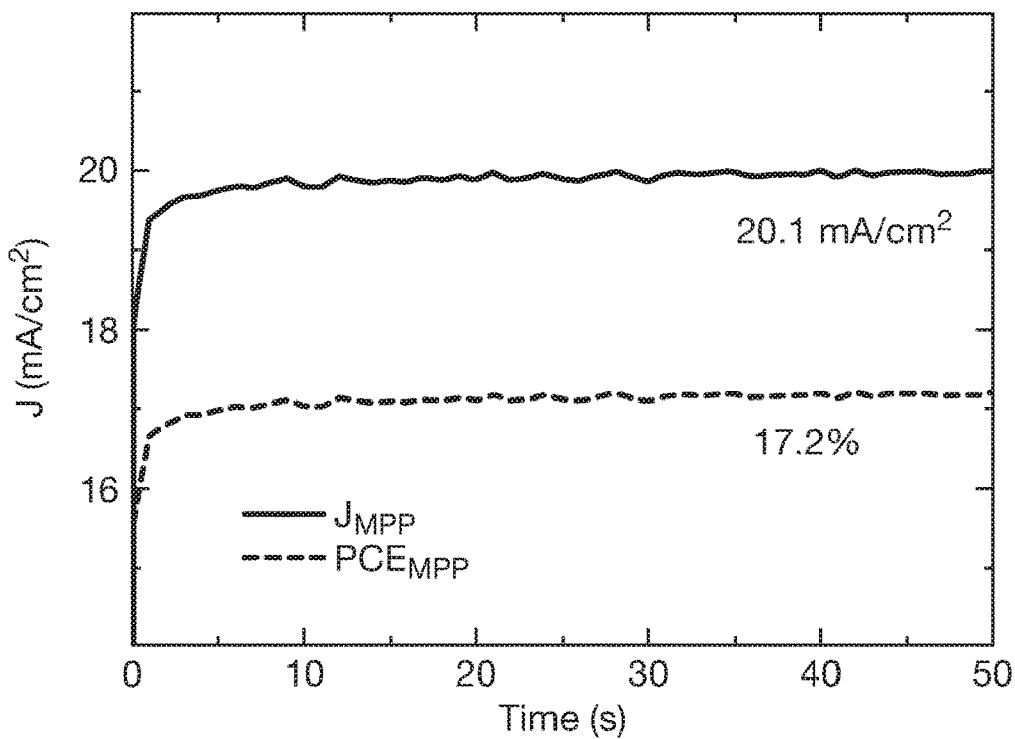
Figure 14E:
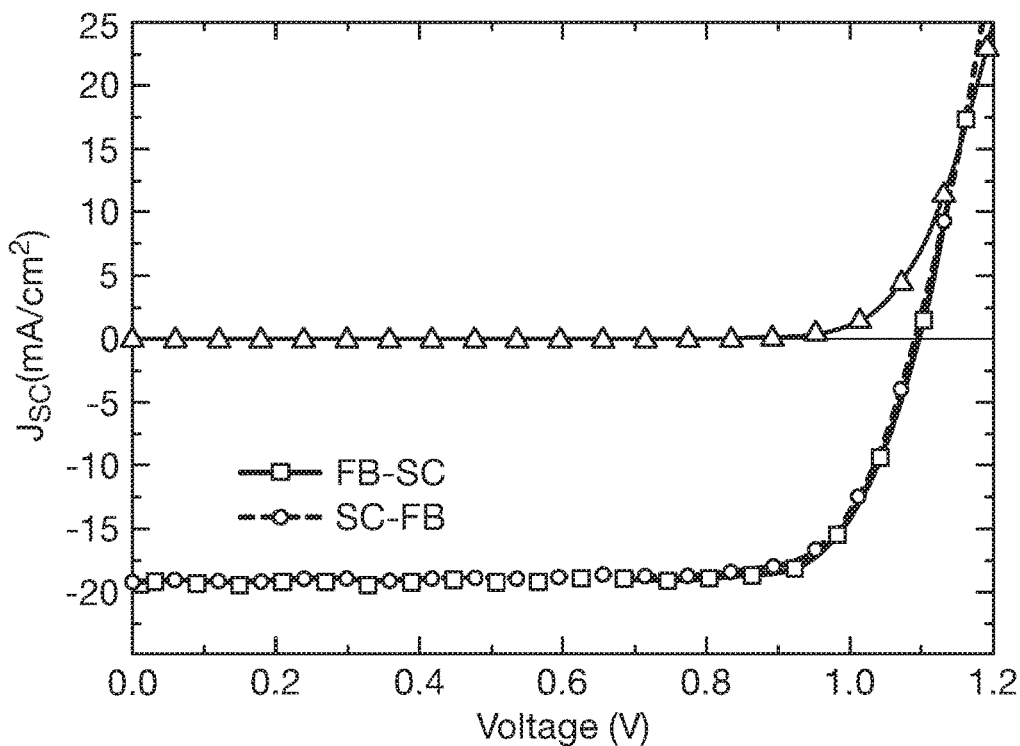
Figure 14F:
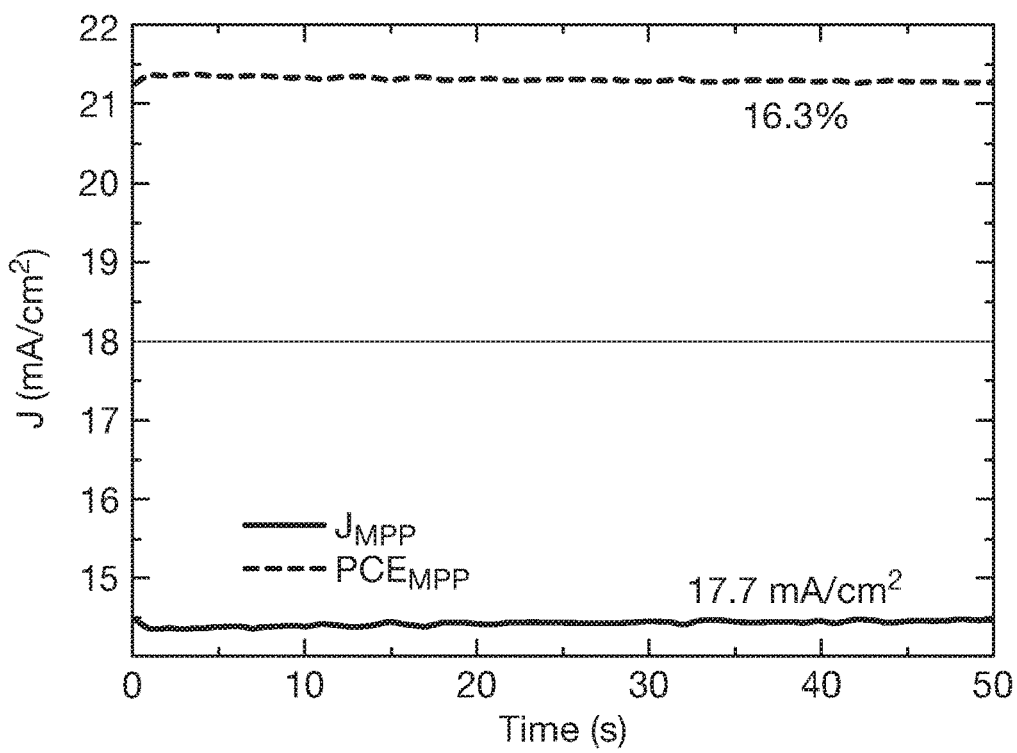

Having shown that through the manipulation of the solvent very smooth and pinhole-free films can be produced and the charge-carrier lifetimes can be increased, these films were integrated within photovoltaic devices and further investigated. The optimal device fabrication procedure was determined by preparing a series of devices with increasing annealing times. From this experiment, it was determined that the optimal annealing time was 60 min. For these devices, the device stack which was used was $FTO/TiO_2/C60/CH_3NH_3PbI_3$/spiro-OMeTAD/Au. A cross-sectional SEM image of a typical device is shown in FIG. 13.

The current-density voltage (JV) characteristics and steady-state efficiency of the best performing devices are shown in FIG. 14. All devices shown in FIG. 14 have an active area of 0.0912 $cm^2$. Also fabricated were devices with larger active areas (0.7 $cm^2$), and a maximum stabilized power conversion efficiency of over 15% for the p-i-n cell configuration was attained. The performance parameters for the devices are presented in Table 1.

TABLE 1

Device Performance Parameters.

| Cell Type | | $J_{sc}$ (mA/cm$^2$) | $V_{oc}$ (V) | F.F. | η (%) | $η_{MPP}$ |
|---|---|---|---|---|---|---|
| Annealed (0.0912 cm$^2$) | Average | 22.4 ± 0.36 | 1.08 ± 0.02 | 0.74 ± 0.03 | 17.8 ± 0.1 | |
| | Champion | 22.2 | 1.10 | 0.77 | 19.0 | 18.2 |
| Unannealed (0.0912 cm$^2$) | Average | 22.4 ± 0.7 | 1.07 ± 0.02 | 0.66 ± 0.04 | 15.7 ± 1.3 | |
| | Champion | 22.5 | 1.07 | 0.75 | 18.1 | 17.2 |
| Inverted (0.0912 cm$^2$) | Average | 18.8 ± 0.7 | 1.10 ± 0.01 | 0.77 ± 0.03 | 16.0 ± 0.5 | |
| | Champion | 19.2 | 1.10 | 0.80 | 16.8 | 16.3 |
| Annealed (0.7 cm$^2$) | Champion | 19.2 | 1.03 | 0.69 | 14.5 | 12.4 |
| Inverted (0.7 cm$^2$) | Champion | 20.3 | 1.1 | 0.70 | 15.3 | 15.0 |

By integrating the external quantum efficiency (EQE) over the AM 1.5 spectrum a $J_{SC}$ of 20.8 mA/cm$^2$ was obtained for this device, a value which is within 5% of the $J_{SC}$ extracted from the solar simulator. In order to assess the diode quality of these devices the JV curves were fitted to the diode equation and shunt resistances of 2029 Ωcm$^2$ and 7535 Ωcm$^2$ for the small area n-i-p and p-i-n devices were extracted, respectively. For the larger area devices, shunt resistance values of 1862 Ωcm$^2$ and 1189 Ωcm$^2$ were obtained. These relatively high shunt resistances are further indication of the presence of little to no pinholes in the perovskite layer.

Conclusion:

In summary, through the dissolution of alkylamines such as methylamine in solvents such as acetonitrile, a low boiling point, industrially scalable solvent system which allows for the solvation of the CH$_3$NH$_3$PbI$_3$ perovskite precursor salts has been developed. By exploiting the swift evaporation of this solvent, a simple one-step spin-coating process allows the induction of the rapid crystallization of the perovskite material at room temperature. This method allows for the formation of ultra-smooth, pinhole-free CH$_3$NH$_3$PbI$_3$ films with significantly enhanced PL lifetimes as compared to films processed from DMF. Additionally, through the use of this new solvent mixture, it has been possible to fabricate uniform perovskite films on substrates with areas of up to ~125 cm$^2$, where the standard deviation in film thickness is ±6.25 nm for a 300 nm thick film. By exploiting this new method of rapid crystallization, photovoltaic devices that operate with stabilized efficiencies of over 18% for films that were annealed at 100° C., and over 17% for films which underwent no thermal processing have been obtained. The use of this solvent not only increases the ease with which traditional, lab scale perovskite devices can be fabricated, but also delivers a solvent system which, with small modifications, will be compatible with larger scale solution processing methods such as spray and slot-die coating as well as inkjet printing.

Example 4—ACN/Methylamine/Butylamine

Materials and Methods:
ACN/MA Solutions:

To prepare the ACN/MA solutions, a solution of MA in ethanol (Sigma Aldrich, 33 wt %) was placed into an aerator which was kept in an ice bath. A carrier gas, N$_2$, was then bubbled into the solution, thus degassing the solution of MA. The MA gas which was produced was then passed through a drying tube filled with a dessicant (Drietire and CaO), before it was bubbled directly into the ACN (Sigma Aldrich) which contained the perovskite precursors (1 MAI: 1.06 M PbI$_2$) at a concentration of 0.5 M. The gas was bubbled into the black dispersion until the perovskite particles were completely dissolved resulting in a clear, light yellow solution. After all particulates in the solution were dissolved, the vial was sealed with a septum cap and stored at 5° C. until needed.

ACN/BA Solutions:

A 1:1.06 molar ratio of BAI:PbI$_2$ was added to a 50:50 mixture of BA:ACN, such that the molarity of the final solution was 0.5M. When the solution was fully dissolved it was kept at room temperature until needed.

ACN/MA/BA Solutions:

The ACN/MA solution was made as described above. Small amounts of the ACN/BA solution (5-200 μL/mL) were added to the solution as required to obtain an appropriate band gap shift.

Film Formation:

A 0.5 M solution of 1:1.06 MAI/BAI (Dyesol) to PbI$_2$ (99% purity) in the ACN/MA solvent was spincoated onto the substrate at 2000 rpm for 45 s, in dry air, resulting in the formation of a smooth, dense, perovskite layer. The substrate was then heated at 100° C. for 60 mins to drive off any excess organic.

Results:

It has been shown that a typical non-solvent for perovskite materials, such as acetonitrile, can be combined with an alkylamine to form a strong solvent for the perovskite materials. In this Example, it is also shown that a combination of alkylamines may be used as a means of tuning the band gap of the perovskite materials. Starting with a 0.5 M solution of CH$_3$NH$_3$PbI$_3$ in the ACN/MA compound solvent, increasing amounts of butylamine (5 μL/mL of solution—200 μL/ml) was added in order to tune the band gap of the CH$_3$NH$_3$PbI$_3$ perovskite.

Figure 15:
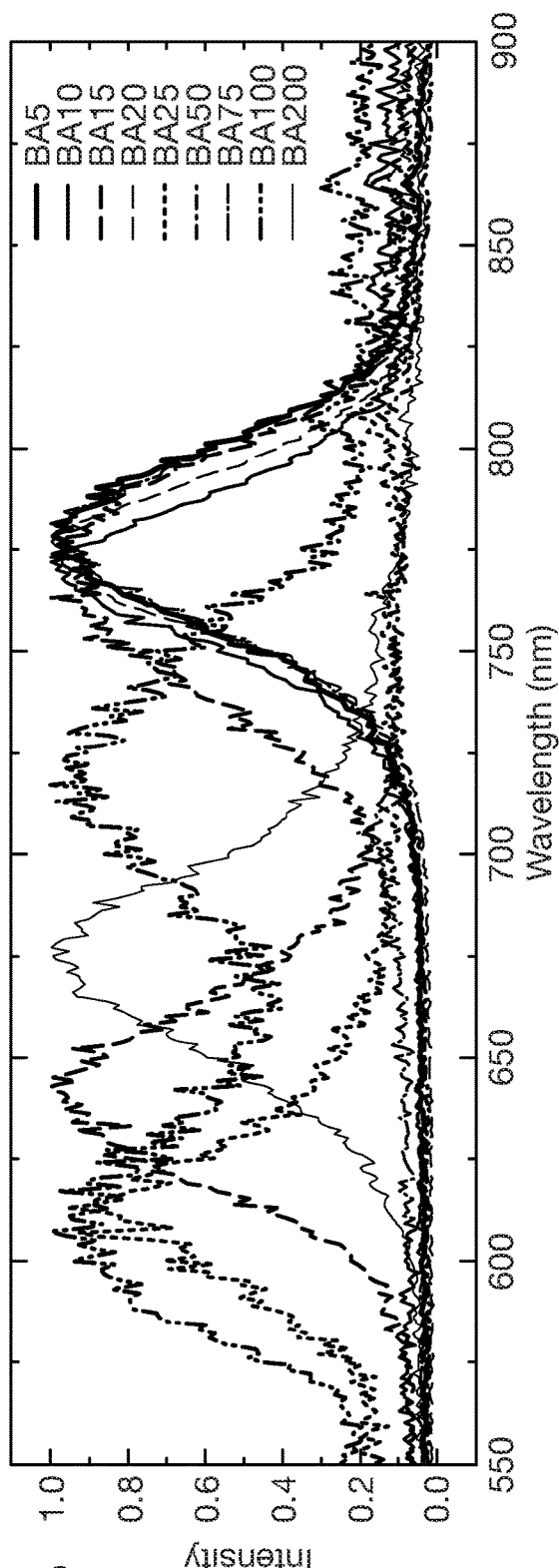
FIG. 15 shows the shift in the steady-state photoluminescence peak of films made from an acetonitrile/methylamine/butylamine solvent.
Figure 15:
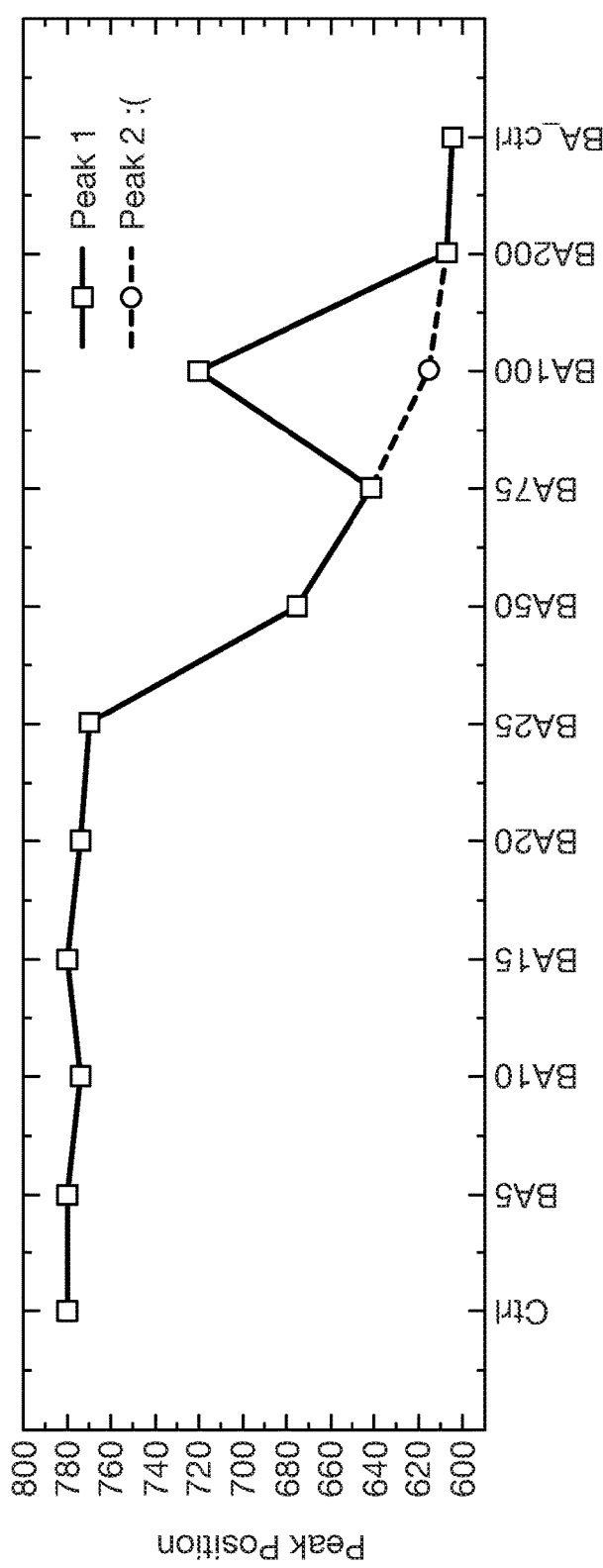

FIG. 15 shows the shift in the steady-state photoluminescence peak of films made from a CH$_3$NH$_3$PbI$_3$ with increasing amounts of butylamine added to the solvent.

Figure 16:
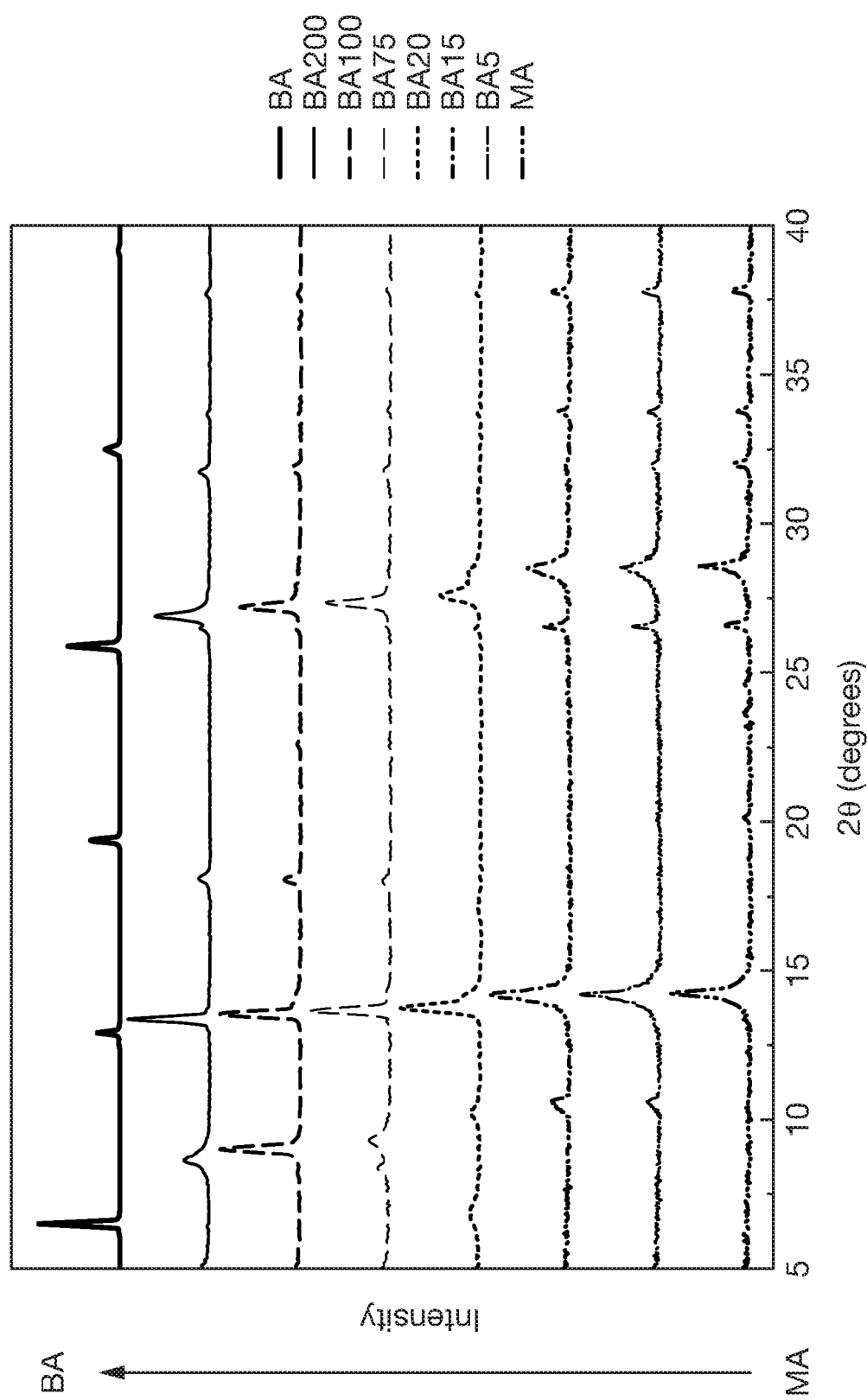
FIG. 16 shows shifts in the XRD peaks of $CH_3NH_3PbI_3$ with the incorporation of the solvent (butylamine) into the film. The diffractograms labelled BA is obtained from a 0.5 M solution of butylammonium lead iodide. This film was made from a precursor solution of a 1:1.06 M ratio of butylammonium iodide (BAI) to $PbI_2$ which was dissolved in a compound solvent of ACN/butylamine.

The observable shift in the photoluminescence peak suggests that at a critical value, the butylamine is incorporated into the perovskite in the form of the butylammonium cation. In order to determine the effect on the structure and morphology of these perovskite films X-ray diffraction measurements were performed and the results are shown in FIG. 16.

Figure 17:
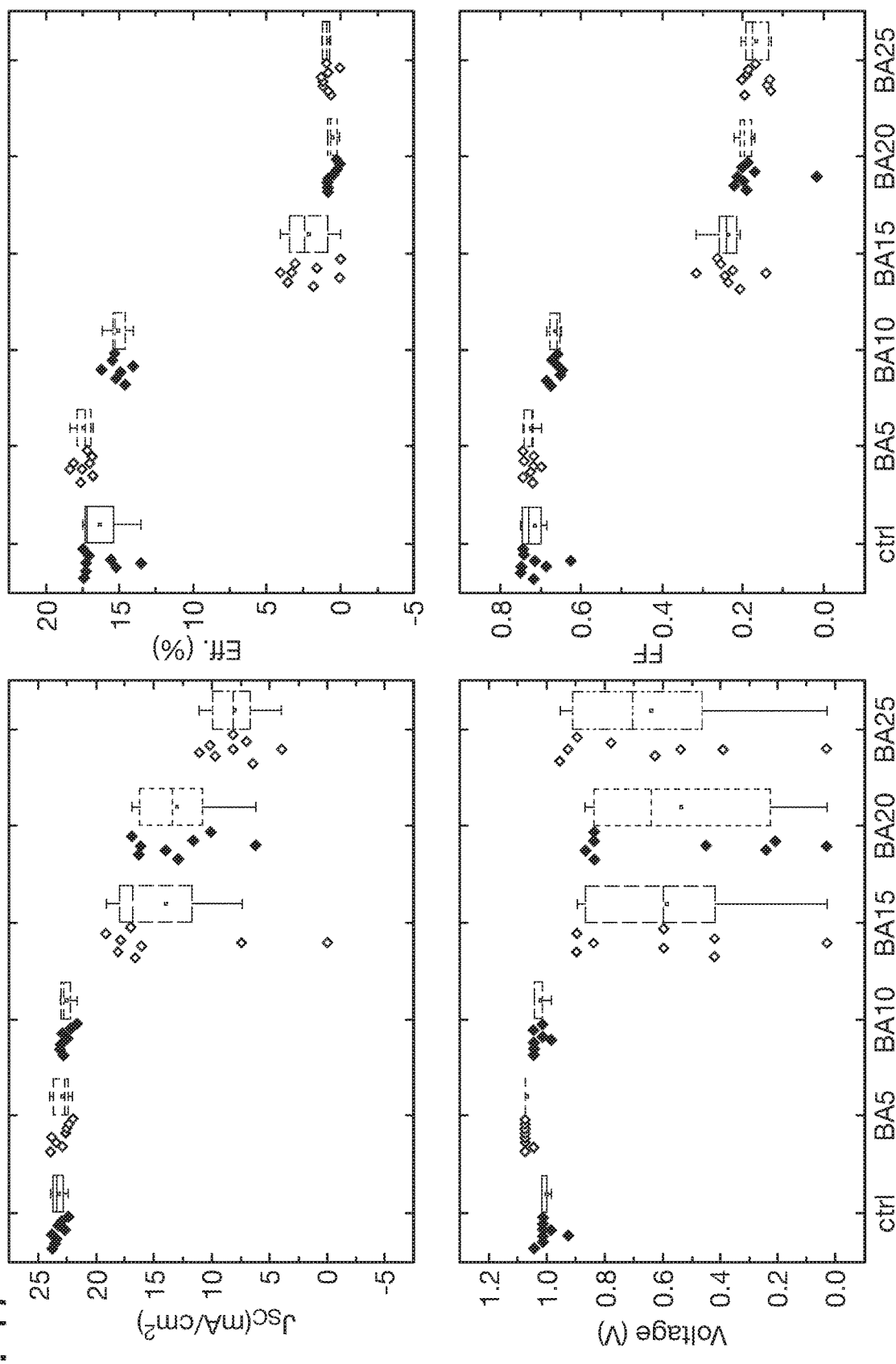
FIG. 17 shows solar cell performance parameters of devices where butylamine was incorporated into the acetonitrile/methylamine solvent.

This provides evidence that by tuning the solvent composition, i.e. introducing various long chain alkylamines into the solvent, the band gap and the structure of perovskite materials may be tuned. The materials produced from the ANC/MA/BA mixture were used as active layers in solar cells. It was found that with the incorporation of a small amount of butylamine into the solvent system an increase in performance was observed. These results are shown in FIG. 17.

The invention claimed is:

1. A process for producing a layer of crystalline A/M/X material, which crystalline A/M/X material comprises a compound of formula $[A]_a[M]_b[X]_c$, wherein:

[M] comprises one or more first cations, which one or more first cations are one or more metal or metalloid cations selected from $Ca^{2+}$, $Sr^{2+}$, $Cd^{2+}$, $Cu^{2+}$, $Ni^{2+}$, $Mn^{2+}$, $Fe^{2+}$, $Co^{2+}$, $Pd^{2+}$, $Ge^{2+}$, $Sn^{2+}$, $Pb^{2+}$, $Yb^{2+}$, $Eu^{2+}$, $Bi^{3+}$, $Sb^{3+}$, $Pd^{4+}$, $W^{4+}$, $Re^{4+}$, $Os^{4+}$, $Ir^{4+}$, $Pt^{4+}$, $Sn^{4+}$, $Pb^{4+}$, $Ge^{4+}$ and $Te^{4+}$;

[A] comprises one or more second cations;

[X] comprises one or more halide anions;

a is an integer from 1 to 6;

b is an integer from 1 to 6; and c is an integer from 1 to 18, and wherein the process comprises disposing on a substrate a precursor composition comprising:

(a) a first precursor compound comprising a first cation (M), which first cation is a metal or metalloid cation; and (b) a solvent, wherein the solvent comprises:

(i) acetonitrile, propionitrile, acetone or a mixture thereof; and (ii) an alkylamine.

2. A process according to claim 1, wherein the alkylamine is a compound of formula $R^A NH_2$, wherein $R^A$ is a $C_{1-8}$ alkyl group.

3. A process according to claim 2, wherein the alkylamine is methylamine, ethylamine, propylamine, butylamine or pentylamine.

4. A process according to claim 1, wherein the molar ratio of (the alkylamine):(the first precursor compound) is from $1×10^{-7}:1$ to $0.5:1$.

5. A process according to claim 1, wherein the solvent comprises acetonitrile.

6. A process according to claim 1, wherein:

the one or more second cations are selected from cations of formula $Cs^+$, $(NR^1R^2R^3R^4)^+$, $(R^1R^2N=CR^3R^4)^+$, $(R^1R^2N-C(R^5)=NR^3R^4)^+$ and $(R^1R^2N-C(NR^5R^6)=NR^3R^4)^+$, wherein each of $R^1$, $R^2$, $R^3$, $R^4$, $R^5$ and $R^6$ is independently H, a substituted or unsubstituted $C_{1-20}$ alkyl group or a substituted or unsubstituted aryl group.

7. A process according to claim 1, wherein the first precursor compound is a compound of formula $MX_2$.

8. A process according to claim 1, wherein the process further comprises disposing on the substrate a second precursor compound, which second precursor compound comprises a second cation (A) and a first anion (X).

9. A process according to claim 8, wherein the second precursor compound is a compound of formula AX.

10. A process according to claim 8, wherein the molar ratio (first precursor compound):(second precursor compound) is from 1:2 to 2:1.

11. A process according to claim 1, wherein the precursor composition further comprises:

(c) a second precursor compound, which second precursor compound comprises a second cation (A) and a first anion (X).

12. A process according to claim 1, wherein [A] comprises a second cation which is a cation of formula $(R^A NH_3)^+$ and the alkylamine is a compound of formula $R^A NH_2$, wherein each $R^A$ is the same group, which is a $C_{1-8}$ alkyl group.

13. A process according to claim 1, wherein the crystalline A/M/X material comprises a perovskite compound of formula $[A][M][X]_3$, wherein: [A] comprises the one or more second cations; [M] comprises the one or more first cations; and [X] comprises the one or more halide anion.

14. A process according to claim 1, wherein the crystalline A/M/X material comprises a perovskite compound of formula $CH_3NH_3PbI_3$, $CH_3NH_3PbBr_3$, $CH_3NH_3PbCl_3$, $CH_3NH_3PbF_3$, $CH_3NH_3PbBr_xI_{3-x}$, $CH_3NH_3PbBr_xCl_{3-x}$, $CH_3NH_3PbIxBr_{3-x}$, $CH_3NH_3PbI_xCl_{3-x}$, $CH_3NH_3PbCl_xBr_{3-x}$, $CH_3NH_3PbI_{3-x}Cl_x$, $CH_3NH_3SnI_3$, $CH_3NH_3SnBr_3$, $CH_3NH_3SnCl_3$, $CH_3NH_3SnF_3$, $CH_3NH_3SnBrI_2$, $CH_3NH_3SnBr_xI_{3-x}$, $CH_3NH_3SnBr_xCl_{3-x}$, $CH_3NH_3SnF_{3-x}Br_x$, $CH_3NH_3SnI_xBr_{3-x}$, $CH_3NH_3SnI_xCl_{3-x}$, $CH_3NH_3SnF_{3-x}I_x$, $CH_3NH_3SnCl_xBr_{3-x}$, $CH_3NH_3SnI_{3-x}Cl_x$ and $CH_3NH_3SnF_{3-x}Cl_x$, $CH_3NH_3CuI_3$, $CH_3NH_3CuBr_3$, $CH_3NH_3CuCl_3$, $CH_3NH_3CuF_3$, $CH_3NH_3CuBrI_2$, $CH_3NH_3CuBr_xI_{3-x}$, $CH_3NH_3CuBr_xCl_{3-x}$, $CH_3NH_3CuF_{3-x}Br_x$, $CH_3NH_3CuI_xBr_{3-x}$, $CH_3NH_3CuI_xCl_{3-x}$, $CH_3NH_3CuF_{3-x}I_x$, $CH_3NH_3CuCl_xBr_{3-x}$, $CH_3NH_3CuI_{3-x}Cl_x$, or $CH_3NH_3CuF_{3-x}Cl_x$ where x is from 0 to 3.

15. A process according to claim 1, wherein the process further comprises removing the solvent to form the layer comprising the perovskite compound.

16. A process according to claim 1, wherein the process further comprises heating the substrate with the precursor composition disposed thereon.

17. A process according to claim 1, wherein disposing the precursor composition on the substrate comprises spin-coating the precursor composition on the substrate.

18. A process according to claim 1, wherein the layer comprising the perovskite compound has a thickness of from 5 to 3000 nm.

19. A process according to claim 1, which process comprises disposing on a substrate a precursor composition comprising:

(a) $PbI_2$;

(b) a solvent which comprises acetonitrile and methylamine; and (c) $(CH_3NH_3)I$.

20. A process according to claim 1, wherein the substrate comprises a layer of a first electrode material and optionally one or more additional layers that are each selected from: a layer of an n-type semiconductor, a layer of a p-type semiconductor, and a layer of insulating material.

21. A process according to claim 1, wherein a surface of the substrate on which the precursor composition is disposed comprises one or more of a first electrode material, a layer of an n-type semiconductor, a layer of a p-type semiconductor, and a layer of insulating material.

22. A process according to claim 1, wherein a surface of the substrate on which the precursor composition is disposed comprises a layer of material that is soluble in dimethylformamide.

23. A process according to claim 1, wherein the solvent further comprises dimethylsulfoxide (DMSO).

24. A process according to claim 23, wherein the solvent comprises DMSO in an amount of from 1.0 to 2.0 equivalents of the amount of the first cation M in the first precursor compound.

25. A process for producing a semiconductor device, which process comprises a process as defined in claim 1.

26. A process according to claim 1, wherein the alkylamine is methylamine.

27. A process according to claim 1, wherein the molar ratio of (the alkylamine):(the first precursor compound) is from $1\times10-6:1$ to $0.1:1$.

28. A process according to claim 1, wherein the one or more first cations are selected from Cu2+, Pb2+, Ge2+ and Sn2+.

29. A process according to claim 1, wherein the one or more second cations are selected from (CH3NH3)+ and (H2N—C(H)=NH2)+.

30. A process according to claim 1, wherein the first precursor compound is a compound of formula SnI2, SnBr2, SnCl2, PbI2, PbBr2 or PbCl2.

31. A process according to claim 1, wherein the second precursor compound is a compound of formula [A][X] wherein: [A] comprises the one or more second cations; and [X] comprises the one or more halide anion.

32. A process according to claim 1, wherein the second precursor compound is (CH3NH3)I, (CH3NH3)Br or (CH3NH3)Cl.

33. A process according to claim 1, wherein the second cation is methylammonium and the alkylamine is methylamine.

34. A process according to claim 1, wherein the perovskite compound is CH3NH3PbI3.

35. A process according to claim 1, wherein the substrate is heated to a temperature of from 50° C. to 200° C.

36. A process according to claim 1, wherein the substrate is heated to a temperature of from 50° C. to 200° C. for a time of from 10 to 100 minutes.

37. A composition comprising:
a compound of formula $MX_n$, wherein: M is $Ca^{2+}$, $Sr^{2+}$, $Cd^{2+}$, $Cu^{2+}$, $Ni^{2+}$, $Mn^{2+}$, $Fe^{2+}$, $Co^{2+}$, $Pd^{2+}$, $Ge^{2+}$, $Sn^{2+}$, $Pb^{2+}$, $Yb^{2+}$, $Eu^{2+}$, $Bi^{3+}$, $Sb^{3+}$, $Pd^{4+}$, $W^{4+}$, $Re^{4+}$, $Os^{4+}$, $Ir^{4+}$, $Pt^{4+}$, $Sn^{4+}$, $Pb^{4+}$, $Ge^{4+}$ or $Te^{4+}$; X is $I^-$, $Br^-$, $Cl^-$ or $F^-$; and n is 2, 3 or 4;

(ii) a compound of formula AX, wherein A is $(R^1NH_3)^+$, $(NR^2{}_4)^+$ and $(H_2N-C(R^1)=NH_2)^+$, wherein $R^1$ is H or an unsubstituted $C_{1-6}$ alkyl group and each $R^2$ is an unsubstituted $C_{1-6}$ alkyl group, and X is $I^-$, $Br^-$, $Cl^-$ or $F^-$;

(iii) acetonitrile, propionitrile, acetone or a mixture thereof; and (iv) an alkylamine of formula $R^ANH_2$, wherein $R^A$ is a $C_{1-8}$ alkyl group.

38. A composition according to claim 37, which composition comprises:
(i) $PbI_2$, $PbBr_2$ or $PbCl_2$;
(ii) $(CH_3NH_3)I$, $(CH_3NH_3)Br$ or $(CH_3NH_3)Cl$; and
(iii) acetonitrile; and
(iv) methylamine.

39. A composition according to claim 38, wherein the composition comprises PbI2.

40. A composition according to claim 38, wherein the composition comprises (CH3NH3)I.

41. A composition according to claim 37, wherein the molar ratio $(MX_n):(AX)$ is from 1:2 to 2:1 and the molar ratio of (alkylamine):$(MX_n)$ is from $1\times10^{-7}:1$ to $0.5:1$.

42. A composition according to claim 37, wherein M is Cu2+, Pb2+, Ge2+ or Sn2+.

43. A composition according to claim 37, wherein the molar ratio of (alkylamine):$(MX_n)$ is from $1\times10-7:1$ to $0.1:1$.

* * * * *

UNITED STATES PATENT AND TRADEMARK OFFICE
CERTIFICATE OF CORRECTION

PATENT NO. : 10,797,255 B2
APPLICATION NO. : 16/082415
DATED : October 6, 2020
INVENTOR(S) : Henry James Snaith et al.

It is certified that error appears in the above-identified patent and that said Letters Patent is hereby corrected as shown below:

On the Title Page

Item (54) "MATERIAL PRODUCTION PROCESS WITH ALKYLAMINE" should be --A/M/X MATERIAL PRODUCTION PROCESS WITH ALKYLAMINE--.

In the Specification

Column 1, Line 1, "MATERIAL PRODUCTION PROCESS WITH" should be --A/M/X MATERIAL PRODUCTION PROCESS WITH--.

Column 11, Line 19, "$Pd^{2-}$" should be --$Pd^{2+}$--.

Column 11, Line 23, "$Sn^{2-}$" should be --$Sn^{2+}$--.

Column 11, Line 32, "$Ca^{2-}$" should be --$Ca^{2+}$--.

Column 12, Line 9, "$Li^-$, $Na^-$, $K^+$, $Rb^-$, $Cs^+$" should be --$Li^+$, $Na^+$, $K^+$, $Rb^+$, $Cs^+$--.

Column 17, Line 41, "$Na^-$" should be --$Na^+$--.

Column 17, Line 58, "$(H_2N-C(H)=NH_2)$" should be --$(H_2N-C(H)=NH_2)^+$--.

Column 17, Line 64, "$V^{4-}$" should be --$V^{4+}$--.

Column 18, Line 6, "$Re^{4-}$" should be --$Re^{4+}$--.

Column 19, Line 6, $(H_2N-C(H)=NH_2)$" should be --$(H_2N-C(H)=NH_2)^+$--.

Signed and Sealed this
Eighth Day of December, 2020

Andrei Iancu
*Director of the United States Patent and Trademark Office*

Column 19, Line 11, "$(NR^2_4)$-" should be --$(NR^2_4)^+$--.

Column 19, Line 52, "$(NR^2_4)$-" should be --$(NR^2_4)^+$--.